(12) United States Patent
Volkerink et al.

(10) Patent No.: US 11,869,994 B2
(45) Date of Patent: Jan. 9, 2024

(54) FLEXIBLE SOLAR-POWERED WIRELESS COMMUNICATION DEVICE

(71) Applicant: TRACKONOMY SYSTEMS, INC., San Jose, CA (US)

(72) Inventors: Hendrik J. Volkerink, Palo Alto, CA (US); Ajay Khoche, West San Jose, CA (US)

( * ) Notice: Subject to any disclaimer, the term of this patent is extended or adjusted under 35 U.S.C. 154(b) by 0 days.

(21) Appl. No.: 17/643,920

(22) Filed: Dec. 13, 2021

(65) Prior Publication Data

US 2022/0190177 A1 Jun. 16, 2022

Related U.S. Application Data

(60) Provisional application No. 63/130,331, filed on Dec. 23, 2020, provisional application No. 63/124,791, filed on Dec. 12, 2020.

(51) Int. Cl.
*H01L 31/0475* (2014.01)
*H01L 31/0392* (2006.01)
*H01L 31/048* (2014.01)

(52) U.S. Cl.
CPC .... *H01L 31/0475* (2014.12); *H01L 31/03926* (2013.01); *H01L 31/048* (2013.01)

(58) Field of Classification Search
CPC ........... H01L 31/0475; H01L 31/03926; H01L 31/048
See application file for complete search history.

(56) References Cited

U.S. PATENT DOCUMENTS 4,064,552 A * 12/1977 Angelucci .............. H05K 1/189
    968/878
4,974,129 A    11/1990 Grieb et al.
(Continued)

FOREIGN PATENT DOCUMENTS

AU    2018204317 A1    1/2019
AU    2018250358 A1    5/2019
(Continued)

OTHER PUBLICATIONS

U.S. Appl. No. 17/385,884, Non-Final Office Actin dated Apr. 14, 2022, 7 pages.
(Continued)

*Primary Examiner* — Sadie White

(57) ABSTRACT

A solar-powered wireless communication device a flexible circuit, a device layer positioned adjacent to the flexible circuit and having a plurality of electronic components coupled to the flexible circuit, a flexible cover positioned over the device layer, a flexible substrate coupled with a second side of the flexible circuit, opposite the first side, by a first adhesive layer, and a solar panel positioned at a surface of the solar-powered tape node and coupling with the flexible circuit. The solar panel has a light-receiving surface facing away from the flexible circuit and is operable to generate electrical power when light is incident on the light-receiving surface. The solar-powered wireless communication device being operable to determine that power available to the solar-powered wireless communication device is below a first threshold and delegate at least one task of the solar-powered wireless communication device to another node of a network communications environment.

20 Claims, 29 Drawing Sheets

(56) References Cited

U.S. PATENT DOCUMENTS

| | | | |
|---|---|---|---|
| 5,133,810 A * | 7/1992 | Morizane | H01L 31/0516 257/E27.125 |
| 5,478,991 A | 12/1995 | Watanabe et al. | |
| 5,495,250 A | 2/1996 | Ghaem et al. | |
| 5,499,717 A | 3/1996 | Hayashi | |
| 5,838,253 A | 11/1998 | Wurz et al. | |
| 6,372,342 B1 | 4/2002 | Karaoglu | |
| 6,375,780 B1 | 4/2002 | Tuttle et al. | |
| 6,380,477 B1 * | 4/2002 | Curtin | H01L 31/03926 257/431 |
| 6,404,341 B1 | 6/2002 | Reid | |
| 6,614,392 B2 | 9/2003 | Howard | |
| 7,020,701 B1 | 3/2006 | Gelvin et al. | |
| 7,048,194 B2 | 5/2006 | Minami et al. | |
| 7,177,054 B2 | 2/2007 | Silverbrook et al. | |
| 7,259,030 B2 | 8/2007 | Daniels et al. | |
| 7,299,990 B2 | 11/2007 | Hoshina | |
| 7,321,167 B2 | 1/2008 | Zhong et al. | |
| 7,405,656 B2 | 7/2008 | Olsen | |
| 7,511,616 B2 | 3/2009 | Lake | |
| 7,540,603 B2 | 6/2009 | Otsuki | |
| 7,722,249 B2 | 5/2010 | Kim et al. | |
| 7,723,733 B2 | 5/2010 | Daniels et al. | |
| 7,838,844 B2 | 11/2010 | Wagner et al. | |
| 7,884,727 B2 | 2/2011 | Tran | |
| 8,062,735 B2 | 11/2011 | Bi et al. | |
| 8,072,620 B2 | 12/2011 | Yamamoto et al. | |
| 8,110,254 B1 | 2/2012 | Sharma et al. | |
| 8,114,248 B2 | 2/2012 | Lee et al. | |
| 8,269,633 B2 | 9/2012 | Hollander et al. | |
| 8,292,173 B2 | 10/2012 | Yturralde et al. | |
| 8,401,238 B2 | 3/2013 | Stahlin et al. | |
| 8,448,530 B2 | 5/2013 | Leuenberger et al. | |
| 8,658,455 B2 | 2/2014 | Shin et al. | |
| 8,716,629 B2 | 5/2014 | Klewer et al. | |
| 8,786,510 B2 | 7/2014 | Coleman et al. | |
| 8,833,664 B2 | 9/2014 | Choi | |
| 8,879,276 B2 | 11/2014 | Wang | |
| 8,971,673 B2 | 3/2015 | Beinhocker | |
| 9,070,286 B2 | 6/2015 | Moore | |
| 9,137,637 B2 | 9/2015 | Bilal et al. | |
| 9,159,635 B2 | 10/2015 | Elolampi et al. | |
| 9,182,231 B2 | 11/2015 | Skaaksrud | |
| 9,183,738 B1 | 11/2015 | Allen, Sr. et al. | |
| 9,250,104 B2 | 2/2016 | Greiner et al. | |
| 9,307,648 B2 | 4/2016 | Slafer | |
| 9,372,123 B2 | 6/2016 | Li et al. | |
| 9,419,502 B2 | 8/2016 | Veronesi et al. | |
| 9,473,902 B2 | 10/2016 | Bilal et al. | |
| 9,496,582 B1 | 11/2016 | Lim et al. | |
| 9,543,495 B2 | 1/2017 | Paschkewitz et al. | |
| 9,543,549 B2 | 1/2017 | Bai et al. | |
| 9,583,428 B2 | 2/2017 | Rafferty et al. | |
| 9,632,050 B2 | 4/2017 | Zhong et al. | |
| 9,643,460 B2 | 5/2017 | Peine et al. | |
| 9,693,689 B2 | 7/2017 | Gannon et al. | |
| 9,753,568 B2 | 9/2017 | McMillen | |
| 9,781,825 B2 | 10/2017 | Farkas et al. | |
| 9,860,688 B2 | 1/2018 | Kulkarni et al. | |
| 9,886,015 B2 | 2/2018 | Wilson et al. | |
| 10,262,255 B2 | 4/2019 | Khoche | |
| 10,357,924 B2 | 7/2019 | Waldrop, III et al. | |
| 10,445,634 B2 | 10/2019 | Khoche | |
| 10,872,286 B2 | 12/2020 | Khoche | |
| 10,885,420 B2 | 1/2021 | Khoche | |
| 11,115,732 B2 | 9/2021 | Lucrecio et al. | |
| 2001/0054262 A1 * | 12/2001 | Nath | H01L 31/0504 52/173.3 |
| 2003/0000128 A1 | 1/2003 | Wood et al. | |
| 2004/0044493 A1 | 3/2004 | Coulthard | |
| 2004/0131761 A1 | 7/2004 | Shakespeare | |
| 2005/0211998 A1 | 9/2005 | Daniels et al. | |
| 2006/0100299 A1 | 5/2006 | Malik et al. | |
| 2006/0248713 A1 | 11/2006 | Vatanparast et al. | |
| 2007/0049291 A1 | 3/2007 | Kim et al. | |
| 2007/0287473 A1 | 8/2007 | Dupray | |
| 2008/0198002 A1 | 8/2008 | Bartholf et al. | |
| 2009/0051530 A1 | 2/2009 | Brooks et al. | |
| 2009/0072974 A1 | 3/2009 | Miyashita et al. | |
| 2009/0174600 A1 | 7/2009 | Mazlum et al. | |
| 2009/0192709 A1 | 7/2009 | Yonker et al. | |
| 2009/0196267 A1 | 8/2009 | Walker, Sr. | |
| 2010/0045971 A1 * | 2/2010 | Brokopp | G01J 1/0271 356/213 |
| 2010/0096181 A1 | 4/2010 | Nakamura et al. | |
| 2010/0180701 A1 | 7/2010 | Daniel et al. | |
| 2010/0210322 A1 | 8/2010 | Kim et al. | |
| 2010/0230498 A1 | 9/2010 | Atherton | |
| 2010/0231386 A1 * | 9/2010 | Barnes | H01L 31/04 340/541 |
| 2011/0202159 A1 | 8/2011 | Wang et al. | |
| 2011/0218756 A1 | 9/2011 | Callsen et al. | |
| 2011/0251469 A1 | 10/2011 | Varadan | |
| 2012/0075343 A1 | 3/2012 | Chen et al. | |
| 2012/0225519 A1 * | 9/2012 | Ehbing | H01L 31/049 438/73 |
| 2012/0234586 A1 | 9/2012 | Telle et al. | |
| 2012/0271540 A1 | 10/2012 | Miksa et al. | |
| 2012/0278676 A1 | 11/2012 | Teraura | |
| 2013/0002443 A1 | 1/2013 | Breed et al. | |
| 2013/0131980 A1 | 5/2013 | Ginsberg | |
| 2013/0146122 A1 | 6/2013 | Chung | |
| 2013/0250357 A1 | 9/2013 | Yu | |
| 2014/0014403 A1 | 1/2014 | Miller et al. | |
| 2014/0240088 A1 | 8/2014 | Robinette et al. | |
| 2014/0250745 A1 | 9/2014 | Foltz | |
| 2014/0265915 A1 | 9/2014 | Huang et al. | |
| 2014/0268780 A1 | 9/2014 | Wang et al. | |
| 2014/0274139 A1 | 9/2014 | Bilal et al. | |
| 2014/0317406 A1 | 10/2014 | Lewis et al. | |
| 2014/0362890 A1 | 12/2014 | Qian | |
| 2015/0126178 A1 * | 5/2015 | Bauer | H02J 7/35 455/420 |
| 2015/0264139 A1 * | 9/2015 | Son | H04L 67/1001 709/208 |
| 2015/0310773 A1 | 10/2015 | Cho et al. | |
| 2015/0324745 A1 | 11/2015 | Goodall et al. | |
| 2015/0349667 A1 | 12/2015 | Andosca et al. | |
| 2015/0354973 A1 | 12/2015 | Wang et al. | |
| 2015/0364709 A1 * | 12/2015 | Winkel | H01L 51/448 136/251 |
| 2015/0382154 A1 | 12/2015 | Bilal et al. | |
| 2016/0011074 A1 | 1/2016 | Mian et al. | |
| 2016/0026213 A1 | 1/2016 | Li et al. | |
| 2016/0048709 A1 | 2/2016 | Butler et al. | |
| 2016/0112004 A1 * | 4/2016 | Thiel | B32B 7/022 136/246 |
| 2016/0147353 A1 | 5/2016 | Filiz et al. | |
| 2016/0205509 A1 | 7/2016 | Hopcraft et al. | |
| 2016/0270215 A1 | 9/2016 | Goto | |
| 2016/0322283 A1 | 11/2016 | Mcmahon et al. | |
| 2016/0370210 A1 | 12/2016 | Kapusta et al. | |
| 2016/0377440 A1 | 12/2016 | Dorum | |
| 2017/0017872 A1 | 1/2017 | Kato et al. | |
| 2017/0025547 A1 | 1/2017 | Cho et al. | |
| 2017/0078950 A1 | 3/2017 | Hillary et al. | |
| 2017/0079144 A1 | 3/2017 | Coleman et al. | |
| 2017/0161679 A1 | 6/2017 | Stingel et al. | |
| 2017/0163212 A1 * | 6/2017 | France | H02S 40/38 |
| 2017/0309843 A1 * | 10/2017 | Kim | B32B 3/266 |
| 2017/0337405 A1 | 11/2017 | Schütz | |
| 2018/0003507 A1 | 1/2018 | Arslan et al. | |
| 2018/0083569 A1 * | 3/2018 | Heppner | H01L 31/0504 |
| 2018/0104609 A1 | 4/2018 | Musliner | |
| 2018/0110450 A1 | 4/2018 | Lamego et al. | |
| 2018/0323325 A1 * | 11/2018 | Nelson | H01L 31/048 |
| 2018/0326487 A1 | 11/2018 | Casper et al. | |
| 2018/0374039 A1 | 12/2018 | Walden et al. | |
| 2019/0037362 A1 | 4/2019 | Lucrecio et al. | |

(56) References Cited

U.S. PATENT DOCUMENTS

| | | |
|---|---|---|
| 2019/0113632 A1 | 4/2019 | Lucrecio et al. |
| 2019/0272458 A1 | 9/2019 | Khoche |

FOREIGN PATENT DOCUMENTS

| | | |
|---|---|---|
| CA | 3061878 A1 | 11/2018 |
| CA | 3008512 A1 | 12/2018 |
| EP | 1786143 | 5/2007 |
| JP | 2008239282 | 10/2008 |
| JP | 2009230500 | 10/2009 |
| WO | WO 2014195756 | 12/2014 |
| WO | WO 2016120628 | 8/2016 |
| WO | WO 2017046699 | 3/2017 |
| WO | WO 2017100707 | 6/2017 |

OTHER PUBLICATIONS

PCT Application No. PCT/US2021/053028, International Search Report and Written Opinion dated Jan. 12, 2022, 11 pages.

A Dementyev, H.-L. C. Kao, J. Paradiso, "SensorTape: Modular and Programmable 3D-Aware Dense Sensor Network on a Tape", In Proc. of UIST 2015.

Daniel K. Griffin et al., Adhesive RFID Sensor Patch for Monitoring of Sweat Electrolytes, in IEEE transactions on bio-medical engineering—Nov. 2014.

Jong-Sun Pyo et al., "Development of a map matching method using the multiple hypothesis technique," 2001 IEEE Intelligent Transportation Systems Conference Proceedings—Oakland (CA), USA—Aug. 25-29, 2001.

Junjie Liu, Survey of Wireless Based Indoor Localization Technologies, arXiv:1709.01015v2 [cs.NI] Mar. 14, 2018.

K. W. Cheung et al., "Least Squares Algorithms for Time-of-Arrival-Based Mobile Location," IEEE Transactions on Signal Processing, vol. 52, No. 4, Apr. 2004, pp. 1121-1128.

Kelvin M. Frazier et al., Fully-Drawn Carbon-Based Chemical Sensors on Organic and Inorganic Surfaces, Lab Chip. Oct. 21, 2014; 14(20): 4059-4066. doi:10.1039/c4lc00864b.

Mohammad Abu Alsheikh et al., "Machine Learning in Wireless Sensor Networks: Algorithms, Strategies, and Applications," arXiv:1405. 4463v2 [cs.NI] Mar. 19, 2015.

Muhammad F. Farooqui et al., "A paper based ink jet printed real time location tracking TAG," 2013 IEEE MTT-S International Microwave Symposium Digest (MTT).

Olyazadeh, Roya. (2012). Least Square Approach on Indoor Positioning Measurement Techniques.

Raphael Wimmer et al., Modular and deformable touch-sensitive surfaces based on time domain reflectometry, UIST 11 Proceedings of the 24th annual ACM symposium on User interface software and technology, pp. 517-526, Santa Barbara, California, USA—Oct. 16-19, 2011.

Simon Olberding et al., A cuttable multi-touch sensor, Proceeding UIST '13 Proceedings of the 26th annual ACM symposium on User interface software and technology. 245-254, St. Andrews, Scotland, United Kingdom—Oct. 8-11, 2013.

Wei Zhang et al., Deep Neural Networks for wireless localization in indoor and outdoor environments, Neurocomputing 194 (2016 )279-287.

Nan-Wei Gong, C.-Y. Wang and J. A. Paradiso, "Low-cost Sensor Tape for Environmental Sensing Based on Roll-to-roll Manufacturing Process," In Proc. of IEEE Sensors 2012.

Notification of Transmittal of the International Search Report and the Written Opinion dated Mar. 29, 2019, in International Application No. PCT/US2018/064855, filed Dec. 11, 2018.

International Application No. PCT/US2018/064919, Written Opinion of the International Searching Authority, dated Apr. 5, 2019, 7 pages.

PCT International Search Report, International Application No. PCT/US20/50739_ International search completed Nov. 18, 2020. International Search Report dated Dec. 18, 2020. pp. 1-2.

MVA Raju Bahubalendruni, HCL Technologies, Opticom, Optimization of Composite Laminate Stack-Up Sequence Using Differential Evolution Algorithm, Conference Paper, Oct. 2010, 35 pages.

Palavesam et al, Roll-to-Roll Processing of Film Substrates for Hybrid Integrated Flexible Electronics, 2018 IOP Publishing Ltd., Flexible and Printed Electronics, 2018, 19 pages.

Park et al., Improvement of Cross-Machine Directional Thickness Deviation for Uniform Pressure-Sensitive Adhesive Layer in Roll-to-Roll Slot-Die Coating Process, International Journal of Precision Engineering and Manufacturing, vol. 16, No. 5, pp. 937-943, May 2015.

International Patent Application No. PCT/US2021/063120 International Search Report and Written Opinion dated Mar. 2, 2022, 13 pages.

* cited by examiner

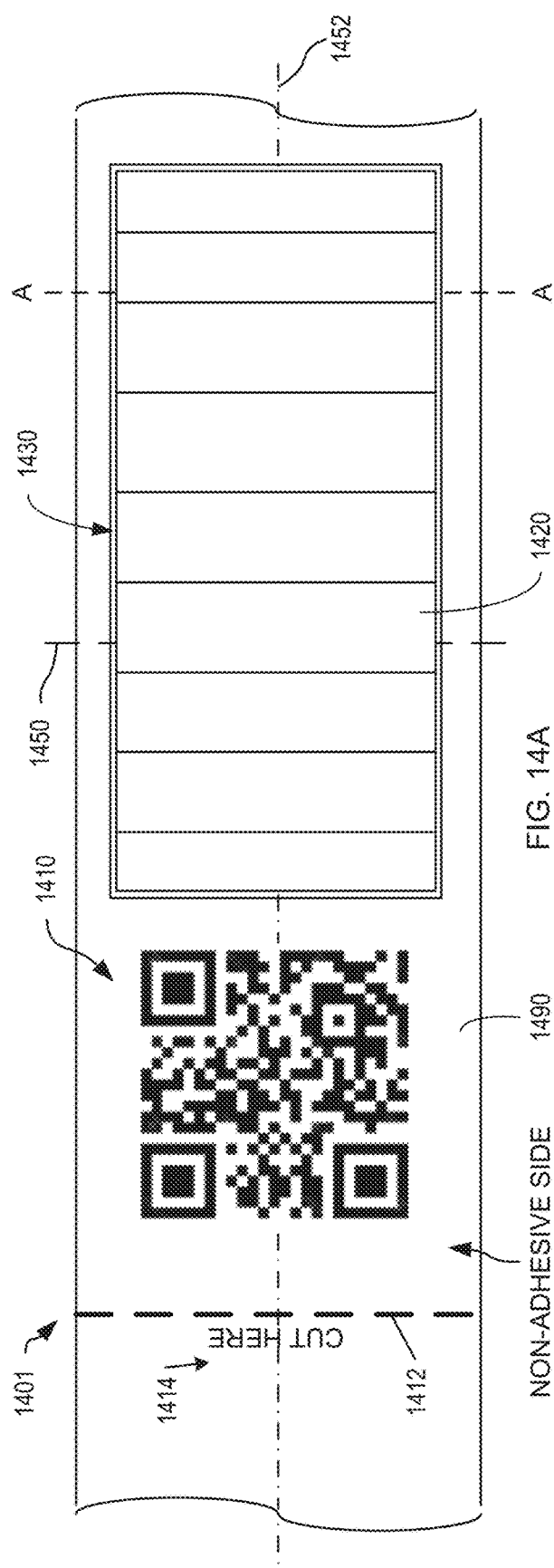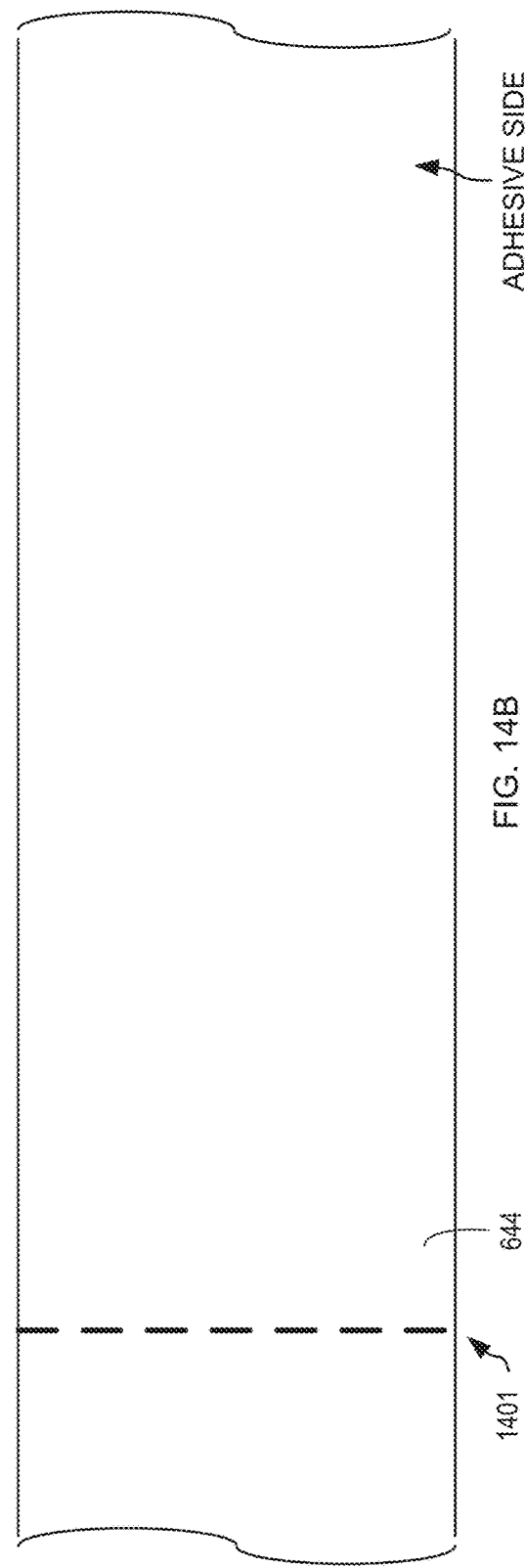

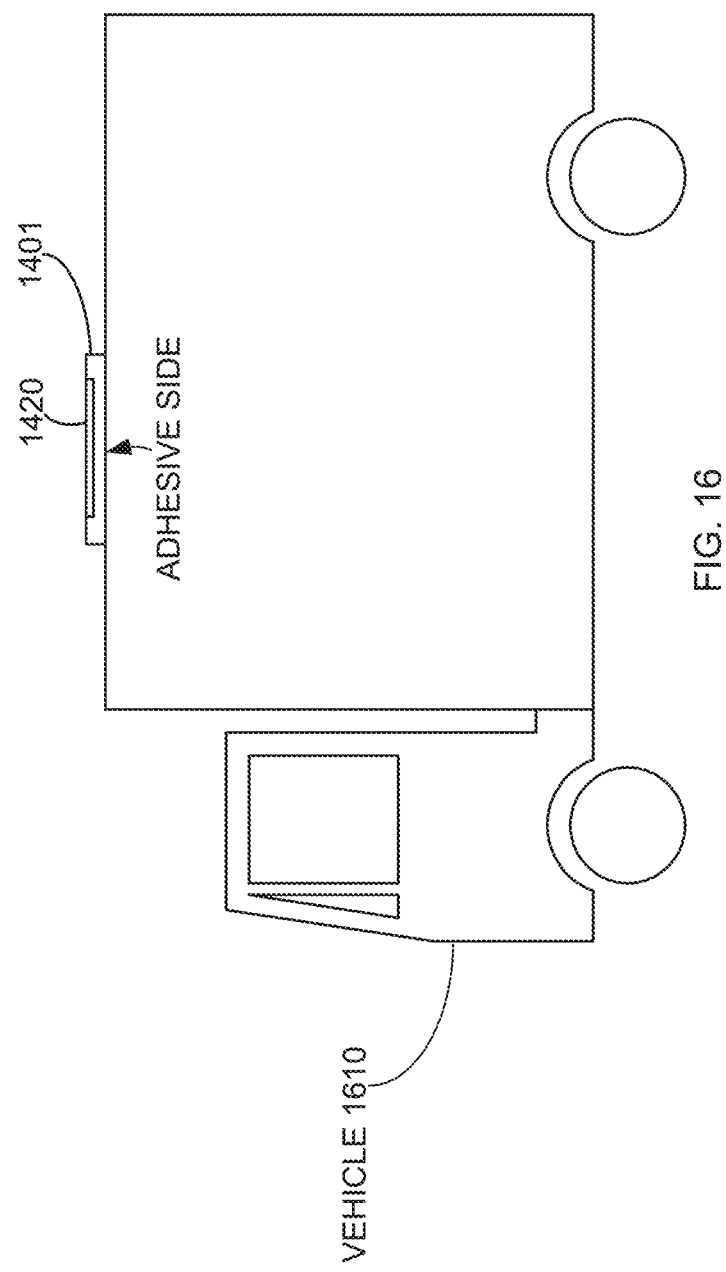

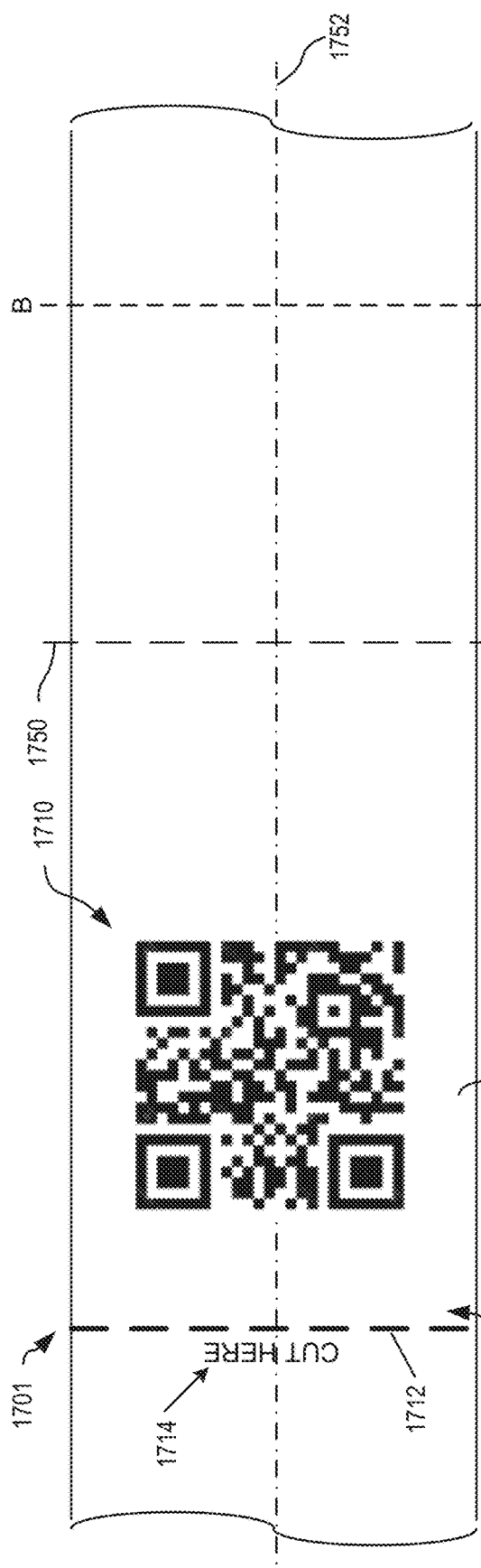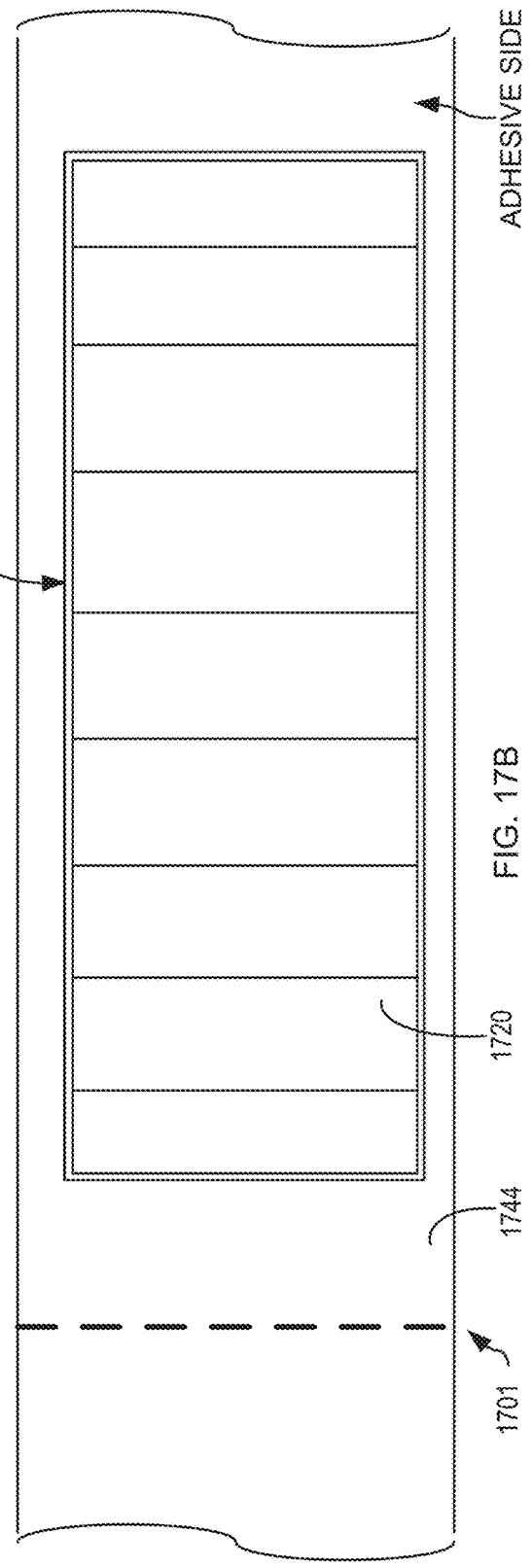

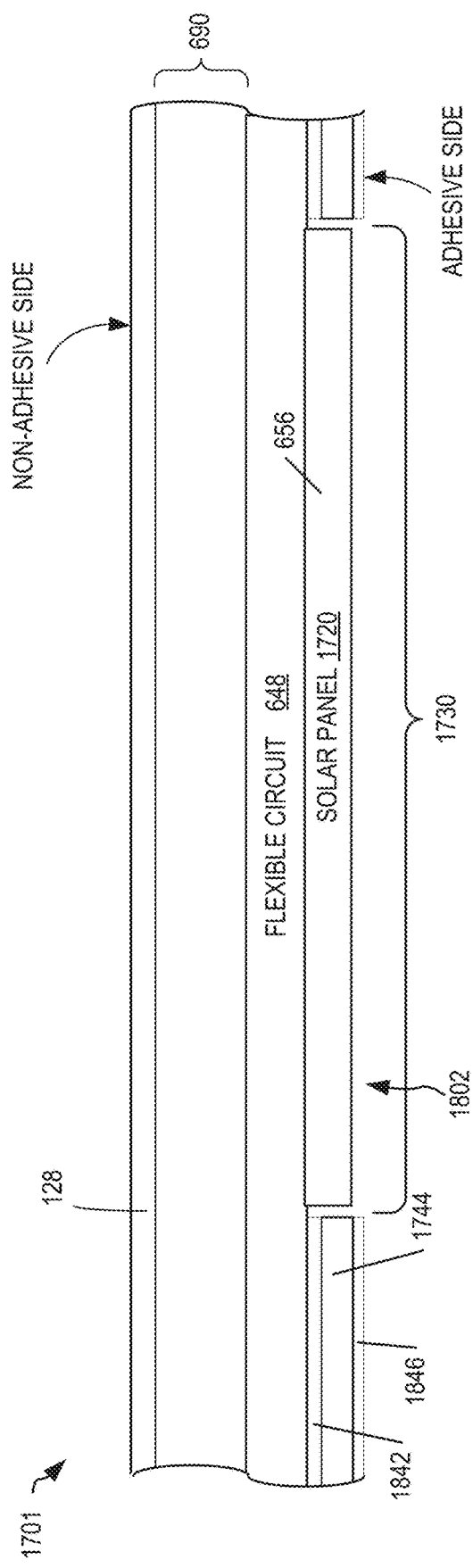
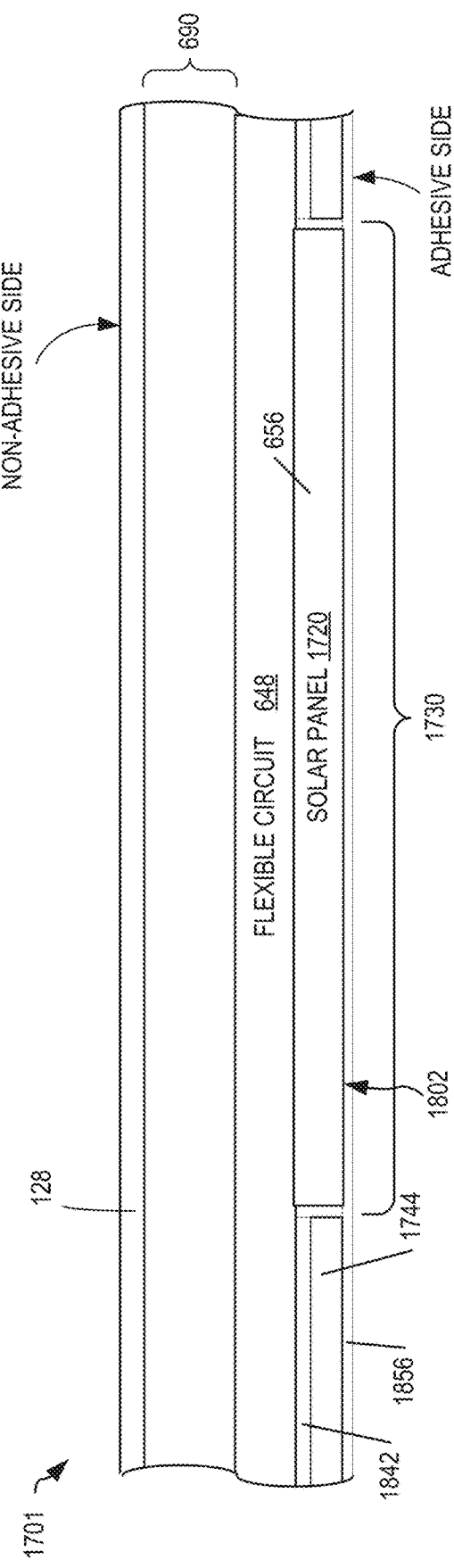
FIG. 18A
FIG. 18B

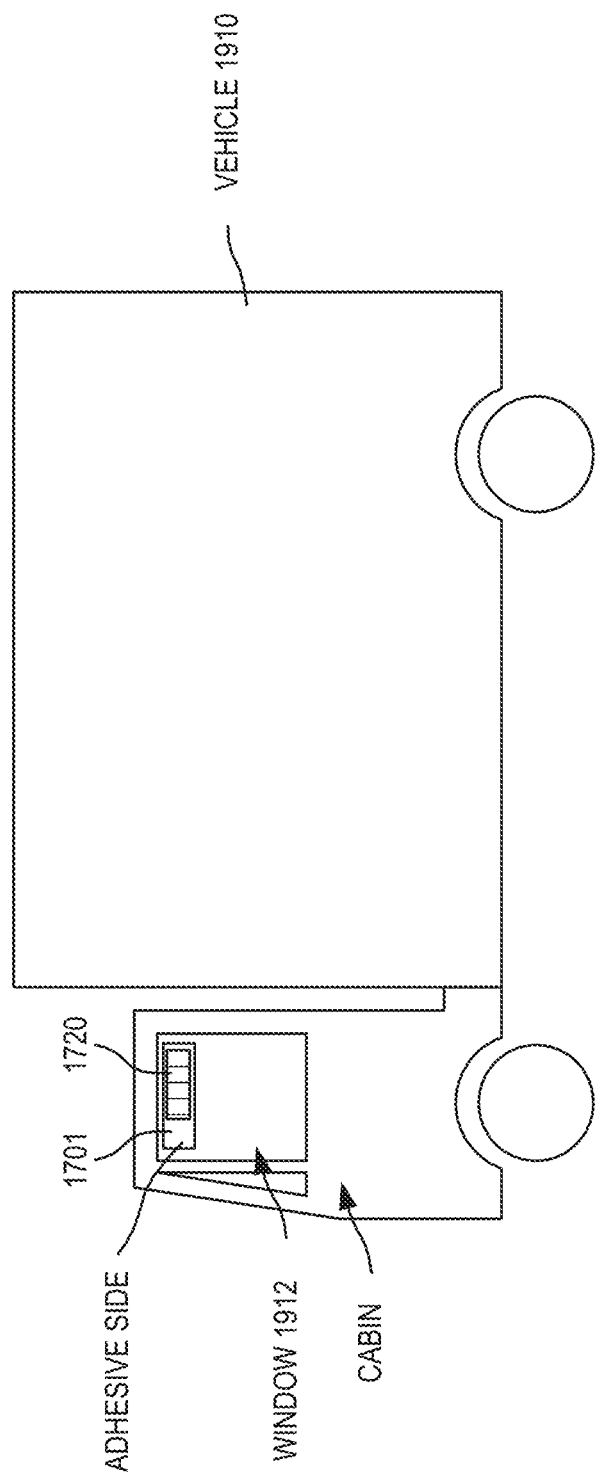

FLEXIBLE SOLAR-POWERED WIRELESS COMMUNICATION DEVICE

RELATED APPLICATIONS

This application claims priority to U.S. Patent Application Ser. No. 63/124,791, titled "Flexible Solar Powered Wireless Communication Device", filed Dec. 12, 2020, and to U.S. Patent Application Ser. No. 63/130,331, titled "Method and System for Stacking Materials to Maximize Flexibility in Electronic Devices", filed Dec. 23, 2020, both of which are incorporated herein by reference.

FIELD OF THE INVENTION

The embodiments herein generally relate to wireless internet of things (IOT) devices.

BACKGROUND

Wireless internet of things (IOT) devices that include a limited power source, such as a battery, have an operational life limited by the battery. IOT devices required to perform tasks with a long operational runtime and corresponding power requirements require large batteries which add bulk and other complications to the design and structure of the IOT devices.

Conventionally, solar cells are placed such that they face outward from an object and are therefore positioned opposite from an adhesive or mounting side. Often, the solar cells are positioned to face upwards and are mounted via feet to a roof or other surface. However, in many applications it is undesirable to have solar cells outwardly mounted. For example, mounting an object including a solar cell to the outside of a moving vehicle presents complications to the aerodynamics, structure, and legality of the moving vehicle. In another example, mounting an object to the outside of a window may cause difficulties in enabling the object to communicate, e.g., via wired communications, with objects within a building.

SUMMARY

Disclosed herein is a wireless internet of things (IOT) device that includes a built-in solar panel. The solar panel generates energy when exposed to light (e.g., sunlight) which powers one or more components of the IOT device. In some embodiments, the IOT device is an embodiment of an adhesive tape platform (i.e., a tape node).

In one embodiment, a solar-powered tape node includes a flexible circuit, a device layer positioned adjacent to the flexible circuit and having a plurality of electronic components, each component coupled to a first side of the flexible circuit. The solar-powered tape node also includes a flexible cover positioned over the device layer to form a non-adhesive side of the wireless tape node. The solar-powered tape node also includes a flexible substrate coupled with a second side of the flexible circuit, opposite the first side, by a first adhesive layer and forming a first aperture, and a solar panel positioned within the first aperture and coupling with the second side of the flexible circuit. The solar panel has a light-receiving surface facing away from the flexible circuit and is operable to generate electrical power when light is incident on the light-receiving surface.

In another embodiment, a solar-powered tape node includes a flexible circuit, a device layer positioned adjacent to the flexible circuit and having a plurality of electronic components, each component coupled to a first side of the flexible circuit, a flexible cover positioned over the device layer and forming an aperture, a flexible substrate attached to a second side of the flexible circuit, opposite the first side, by a first adhesive layer, and a solar panel positioned within the aperture and coupled with the first side of the flexible circuit. The solar panel has a light-receiving surface facing away from the flexible circuit and is operable to generate electrical power when light is incident on the light-receiving surface.

In another embodiment, a method controls operation of a solar-powered tape node within a network communications environment. The method includes determining power available to the solar-powered tape node is below a first threshold and delegating at least one task of the solar-powered tape node to another node of the network communications environment.

In another embodiment, a solar-powered wireless communication device includes a flexible circuit, a device layer positioned adjacent to the flexible circuit and having a plurality of electronic components coupled to the flexible circuit, a flexible cover positioned over the device layer, a flexible substrate coupled with a second side of the flexible circuit, opposite the first side, by a first adhesive layer, and a solar panel positioned at a surface of the solar-powered wireless communication device and coupling with the flexible circuit, the solar panel having a light-receiving surface facing away from the flexible circuit and being operable to generate electrical power when light is incident on the light-receiving surface.

BRIEF DESCRIPTION OF THE FIGURES

FIGS. 14A and 14B show a tape node with a solar panel integrated into the tape node, in embodiments.

FIG. 16 shows the tape node of FIGS. 14A and 14B adhered to an exterior surface of a vehicle, in embodiments.

FIGS. 17A and 17B show another example tape node with an integrated a solar panel, in embodiments.

FIG. 18A shows a first example cross-section B-B of the tape node of FIGS. 17A and 17B showing further example detail, in embodiments.

FIG. 18B shows the cross-section B-B of the tape node of FIGS. 17A and 17B showing further example detail, in embodiments.

FIG. 19 shows one example of the tape node of FIGS. 17A, 17B, 18A, and 18B, adhered to an interior surface of a window of a cabin of a vehicle, in embodiments.

DETAILED DESCRIPTION OF THE EMBODIMENTS

Figure 1:
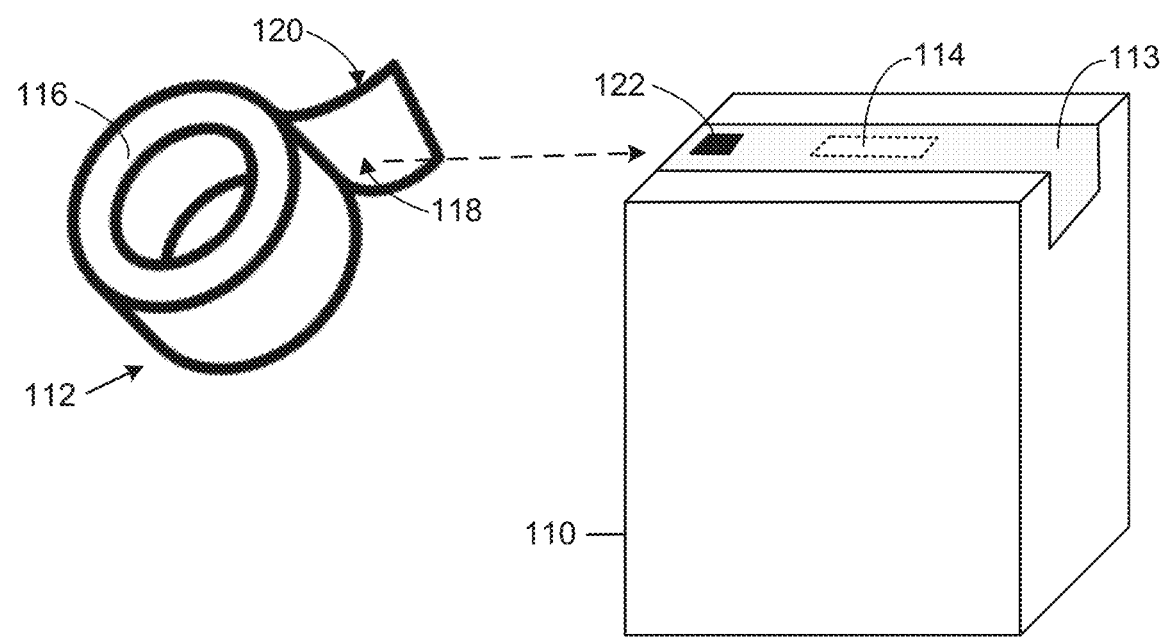
FIG. 1 is a schematic showing one example adhesive tape-agent platform 112, including wireless transducing circuit 114, used to seal a package 110 for shipment, in embodiments.

The present invention is not limited in any way to the illustrated embodiments. Instead, the illustrated embodiments described below are merely examples of the invention. Therefore, the structural and functional details disclosed herein are not to be construed as limiting the claims. The disclosure merely provides bases for the claims and representative examples that enable one skilled in the art to make and use the claimed inventions. Furthermore, the terms and phrases used herein are intended to provide a comprehensible description of the invention without being limiting.

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements and are not drawn to scale.

In some contexts, the term "agent" may refer to a "node", and an "agent" or "node" may be adhesively applied to a surface and denoted as a "tape node" or "tape agent". These terms may be used interchangeably, depending on the context. Further, the "agent" or "node" may have two forms of hierarchy: one depending on the functionality of the "agent" or "node", such as the range of a wireless communication interface, and another depending on which "agent" or "node" may control another "agent" or "node". For example, an agent with a low-power wireless-communication interface may be referred to a "master agent".

In some embodiments, a low-power wireless communication interface may have a first wireless range and be operable to implement one or more protocols including Zigbee, near-field communication (NFC), Bluetooth Low Energy, Bluetooth Classic, Wi-Fi, and ultra-wideband. For example, the low-power wireless-communication interface may have a range of between 0 and 300 meters or farther, depending on the implemented protocol. The communication interface implementation, e.g., Zigbee or Bluetooth Low Energy, may be selected based upon the distance of communication between the low-power wireless-communication interface and the recipient, and/or a remaining battery level of the low-power wireless-communication interface.

An agent with a medium-power wireless communication-interface may be referred to as a "secondary agent". The medium-power wireless communication interface may have a second wireless range and be operable to implement one or more protocols including Zigbee, Bluetooth Low Energy interface, LoRa. For example, the medium-power wireless-communication interface may have a range of between 0 and 20 kilometers. The communication interface implementation, e.g., Zigbee, Bluetooth Low Energy, or LoRa, may be selected based upon the distance of communication between the medium-power wireless-communication interface and the recipient, and/or a remaining battery level of the medium-power wireless-communication interface.

An agent with a high-power wireless communication-interface may be referred to as a "tertiary agent". The high-power wireless communication interface may have a third wireless range and be operable to implement one or more protocols including Zigbee, Bluetooth Low Energy, LoRa, Global System for Mobile Communication, General Packet Radio Service, cellular, near-field communication, and radio-frequency identification. For example, the high-power wireless-communication interface may have a global range, where the high-power wireless-communication interface may communicate with any electronic device implementing a similar communication protocol. The communication interface protocol selected may depend on the distance of communication between the high-power wireless-communication interface and a recipient, and/or a remaining battery level of the high-power wireless-communication interface.

In some examples, a secondary agent may also include a low-power wireless-communication interface and a tertiary agent may also include low and medium-power wireless-communication interfaces, as discussed below with reference to FIGS. 6A-C and/or 11A-C. Further continuing the example, a "master agent", a "secondary agent", or a "tertiary agent" may refer to a "master tape node", a "secondary tape node", or a "tertiary tape node".

With regard to the second form of hierarchy, the "agent", "node", "tape agent", and "tape node", may be qualified as a parent, child, or master, depending on whether a specific "agent" or "node" controls another "agent" or "node". For example, a master-parent agent controls the master-child agent and a secondary or tertiary-parent agent controls a master-child agent. The default, without the qualifier of "parent" or "child" is that the master agent controls the secondary or tertiary agent Further, the "master tape node" may control a "secondary tape node" and a "tertiary tape node", regardless of whether the master tape node is a parent node.

Further, each of the "agents", "nodes", "tape nodes", and "tape agents" may be referred to as "intelligent nodes", "intelligent tape nodes", "intelligent tape agents", and/or "intelligent tape agents" or any variant thereof, depending on the context and, for ease, may be used interchangeably.

Further, each of the "agents", "nodes", "tape nodes", and "tape agents" may include flexible or non-flexible form factors unless otherwise specified. Thus, each of the "agents", "nodes", "tape nodes", and "tape agents" include flexible and non-flexible (rigid) form factors, or a combination thereof including flexible components and non-flexible components.

An adhesive tape platform includes a plurality of segments that may be separated from the adhesive product (e.g., by cutting, tearing, peeling, or the like) and adhesively attached to a variety of different surfaces to inconspicuously implement any of a wide variety of different wireless communications-based network communications and transducing (e.g., sensing, actuating, etc.) applications. In certain embodiments, each segment of an adhesive tape platform has an energy source, wireless communication functionality, transducing functionality (e.g., sensor and energy harvesting functionality), and processing functionality that enable the segment to perform one or more transducing functions and report the results to a remote server or other computer system directly or through a network (e.g., formed by tape nodes and/or other network components). The components of the adhesive tape platform are encapsulated within a flexible adhesive structure that protects the components from damage while maintaining the flexibility needed to function as an adhesive tape (e.g., duct tape or a label) for use in various applications and workflows. In addition to single function applications, example embodiments also include multiple transducers (e.g., sensing and/or actuating transducers) that extend the utility of the platform by, for example, providing supplemental information and functionality relating characteristics of the state and/or environment of, for example, an article, object, vehicle, or person, over time.

Systems and processes for fabricating flexible multifunction adhesive tape platforms in efficient and low-cost ways also are described in US Patent Application Publication No. US-2018-0165568-A1. For example, in addition to using roll-to-roll and/or sheet-to-sheet manufacturing techniques, the fabrication systems and processes are configured to optimize the placement and integration of components within the flexible adhesive structure to achieve high flexibility and ruggedness. These fabrication systems and processes are able to create useful and reliable adhesive tape platforms that may provide local sensing, wireless transmitting, and positioning functionalities. Such functionality together with the low cost of production is expected to encourage the ubiquitous deployment of adhesive tape platform segments and thereby alleviate at least some of the problems arising from gaps in conventional infrastructure coverage that prevent continuous monitoring, event detection, security, tracking, and other logistics applications across heterogeneous environments.

As used herein, the term "or" refers an inclusive "or" rather than an exclusive "or." In addition, the articles "a" and "an" as used in the specification and claims mean "one or more" unless specified otherwise or clear from the context to refer the singular form.

The terms "module," "manager," "component", and "unit" refer to hardware, software, or firmware, or a combination thereof. The term "processor" or "computer" or the like includes one or more of: a microprocessor with one or more central processing unit (CPU) cores, a graphics processing unit (GPU), a digital signal processor (DSP), a field-programmable gate array (FPGA), a system-on-chip (SoC), a microcontroller unit (MCU), and an application-specific integrated circuit (ASIC), a memory controller, bus controller, and other components that manage data flow between said processor associated memory, and other components communicably coupled to the system bus. Thus the terms "module," "manager," "component", and "unit" may include computer readable instructions that, when executed by a processor, implement the functionality discussed herein with respect to said "module," "manager," "component", and "unit".

Adhesive Tape Agent Platform

FIG. 1 is a schematic showing one example adhesive tape-agent platform 112, including wireless transducing circuit 114, used to seal a package 110 for shipment. In this example, a segment 113 of the adhesive tape-agent platform 112 is dispensed from a roll 116 and affixed to the package 110. The adhesive tape-agent platform 112 includes an adhesive side 118 and a non-adhesive surface 120. The adhesive tape-agent platform 112 may be dispensed from the roll 116 in the same way as any conventional packing tape, shipping tape, or duct tape. For example, the adhesive tape-agent platform 112 may be dispensed from the roll 116 by hand, laid across the seam where the two top flaps of the package 110 meet, and cut to a suitable length either by hand or using a cutting instrument (e.g., scissors or an automated or manual tape dispenser). Examples of such tape agents include tape agents having non-adhesive surface 120 that carry one or more coatings or layers (e.g., colored, light reflective, light absorbing, and/or light emitting coatings or layers). Further, the segment 113 may include an identifier 122 (e.g., a QR code, RFID chip, etc.) that may be used to associate the segment 113 with the package 110, as discussed below.

Figure 2:
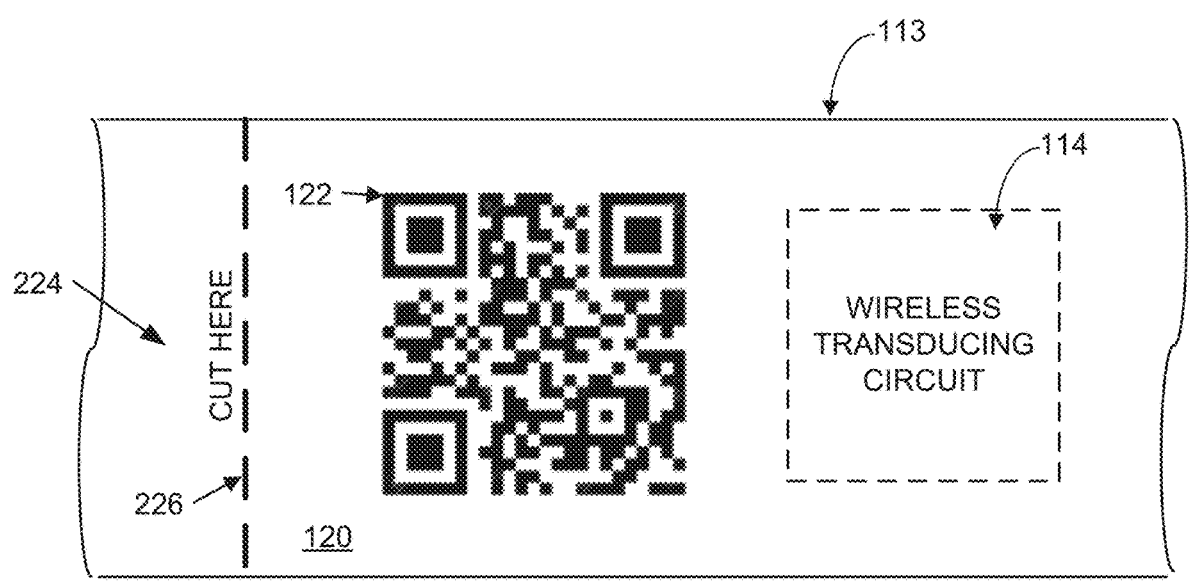
FIG. 2 shows the non-adhesive surface of one segment of the adhesive tape agent platform of FIG. 1, in embodiments.

FIG. 2 shows the non-adhesive surface 120 of the segment 113 of the adhesive tape agent platform 112 of FIG. 1 including writing or other markings that convey instructions, warnings, or other information to a person or machine (e.g., a bar code reader), or may simply be decorative and/or entertaining. For example, different types of adhesive tape-agent platforms may be marked with distinctive colorations to distinguish one type of adhesive tape agent platform from another. In the illustrated example of FIG. 2, the segment 113 of the adhesive tape agent platform 112 includes an identifier 122 (e.g., a two-dimensional bar code, such as a QR Code), written instructions 224 (e.g., "Cut Here"), and an associated cut line 226 that indicates where the user should cut the adhesive tape agent platform 112. The written instructions 224 and the cut line 226 typically are printed or otherwise marked on the top non-adhesive surface 120 of the adhesive tape agent platform 112 during manufacture. The identifier 122 (e.g., a two-dimensional bar code), on the other hand, may be marked on the non-adhesive surface 120 of the adhesive tape agent platform 112 during the manufacture of the adhesive tape agent platform 112 or, alternatively, may be marked on the non-adhesive surface 120 of the adhesive tape agent platform 112 as needed using, for example, a printer or other marking device.

To avoid damaging the functionality of the segments of the adhesive tape agent platform 112, the cut lines 226 may demarcate the boundaries between adjacent segments at locations that are free of any active components of the wireless transducing circuit 114. The spacing between the wireless transducing circuit 114 and the cut lines 226 may vary depending on the intended communication, transducing and/or adhesive taping application. In the example illustrated in FIG. 1, the length of the adhesive tape-agent platform 112 that is dispensed to seal the package 110 corresponds to a single segment of the adhesive tape-agent platform 112. In other examples, the length of the adhesive tape-agent platform 112 needed to seal a package or otherwise serve the adhesive function for which the adhesive tape-agent platform 112 is being applied may include multiple segments 113 of the adhesive tape-agent platform 112, one or more of which segments 113 may be activated upon cutting the length of the adhesive tape-agent platform 112 from the roll 116 and/or applying the segment 113 of the adhesive tape agent platform to the package 110.

In some examples, the wireless transducing circuits 114 embedded in one or more segments 113 of the adhesive tape-agent platform 112 are activated when the adhesive tape agent platform 112 is cut along the cut line 226. In these examples, the adhesive tape-agent platform 112 includes one or more embedded energy sources (e.g., thin film batteries, which may be printed, or conventional cell batteries, such as conventional watch style batteries, rechargeable batteries, or other energy storage device, such as a super capacitor or charge pump) that supply power to the wireless transducing circuit 114 in one or more segments of the adhesive tape-agent platform 112 in response to being separated from the adhesive tape-agent platform 112 (e.g., along the cut line 226).

In some examples, each segment 113 of the adhesive tape agent platform 112 includes its own respective energy source. In some embodiments, the energy source is a battery of a type described above, an energy harvesting component or system that harvests energy from the environment, or both. In some of these examples, each energy source is configured to only supply power to the components in its respective adhesive tape platform segment regardless of the number of contiguous segments that are in a given length of the adhesive tape-agent platform 112. In other examples, when a given length of the adhesive tape agent platform 112 includes multiple segments 113, the energy sources in the respective segments 113 are configured to supply power to the wireless transducing circuit 114 in all of the segments 113 in the given length of the adhesive tape agent platform 112. In some of these examples, the energy sources are connected in parallel and concurrently activated to power the wireless transducing circuit 114 in all of the segments 113 at the same time. In other examples, the energy sources are connected in parallel and alternately activated to power the wireless transducing circuit 114 in respective ones of the segments 113 at different time periods, which may or may not overlap.

Figure 3:
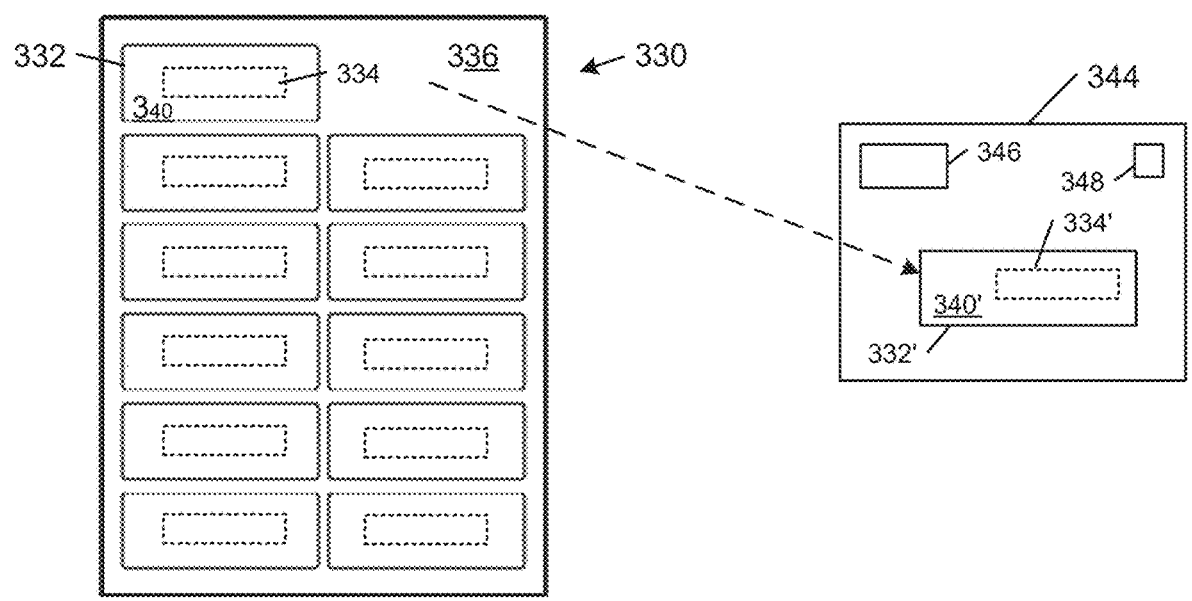
FIG. 3 shows one example adhesive tape platform that includes a set of adhesive tape platform segments, in embodiments.

FIG. 3 shows one example adhesive tape platform 330 that includes a set of adhesive tape platform segments 332 each of which includes a respective set of embedded wireless transducing circuit components 334, and a backing sheet 336 with a release coating that prevents the adhesive segments 332 from adhering strongly to the backing sheet 336. Adhesive tape platform 330 may represent adhesive tape platform 112 if FIG. 1. Each adhesive tape platform segment 332 includes an adhesive side facing the backing sheet 336, and an opposing non-adhesive side 340. In this example, a particular segment 332 of the adhesive tape platform 330 has been removed from the backing sheet 336 and affixed to an envelope 344. Each segment 332 of the adhesive tape platform 330 can be removed from the backing sheet 336 in the same way that adhesive labels can be removed from a conventional sheet of adhesive labels (e.g., by manually peeling a segment 332 from the backing sheet 336). In general, the non-adhesive side 340 of the segment 332 may include any type of writing, markings, decorative designs, or other ornamentation. In the illustrated example, the non-adhesive side 340 of the segment 332 includes writing or other markings that correspond to a destination address for the envelope 344. The envelope 44 also includes a return address 346 and, optionally, a postage stamp or mark 348.

In some examples, segments of the adhesive tape platform 330 are deployed by a human operator. The human operator may be equipped with a mobile phone or other device that allows the operator to authenticate and initialize the adhesive tape platform 330. In addition, the operator can take a picture of a parcel including the adhesive tape platform and any barcodes associated with the parcel and, thereby, create a persistent record that links the adhesive tape platform 330 to the parcel. In addition, the human operator typically will send the picture to a network service and/or transmit the picture to the adhesive tape platform 330 for storage in a memory component of the adhesive tape platform 330.

In some examples, the wireless transducing circuit components 334 that are embedded in a segment 332 of the adhesive tape platform 330 are activated when the segment 332 is removed from the backing sheet 336. In some of these examples, each segment 332 includes an embedded capacitive sensing system that can sense a change in capacitance when the segment 332 is removed from the backing sheet 336. As explained in detail below, a segment 332 of the adhesive tape platform 330 includes one or more embedded energy sources (e.g., thin film batteries, common disk-shaped cell batteries, or rechargeable batteries or other energy storage devices, such as a super capacitor or charge pump) that can be configured to supply power to the wireless transducing circuit components 334 in the segment 332 in response to the detection of a change in capacitance between the segment 332 and the backing sheet 336 as a result of removing the segment 332 from the backing sheet 336.

Figure 4:
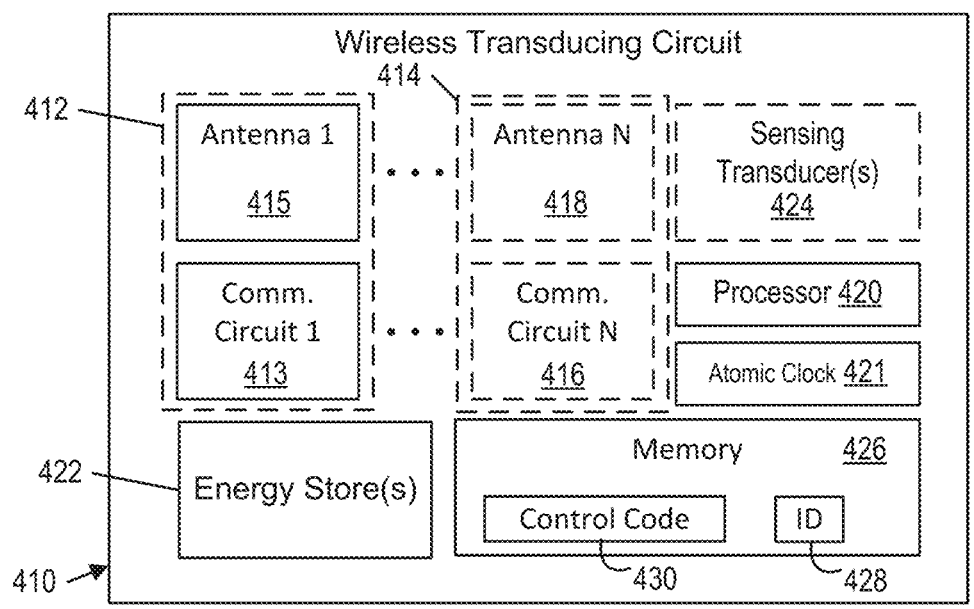
FIG. 4 is a block diagram illustrating components of an example wireless transducing circuit that includes one or more wireless communication modules, in embodiments.

FIG. 4 is a block diagram illustrating components of an example wireless transducing circuit 410 (e.g., an agent) that includes one or more wireless communication modules 412, 414. Each wireless communication module 412, 414 includes a wireless communication circuit 413, 416, and an antenna 415, 418, respectively. Each wireless communication circuit 413, 416 may represent a receiver or transceiver integrated circuit that implements one or more of GSM/ GPRS, Wi-Fi, LoRa, Bluetooth, Bluetooth Low Energy, Z-wave, and ZigBee. The wireless transducing circuit 410 also includes a processor 420 (e.g., a microcontroller or microprocessor), a solid-state atomic clock 421, at least one energy store 422 (e.g., non-rechargeable or rechargeable printed flexible battery, conventional single or multiple cell battery, and/or a super capacitor or charge pump), one or more sensing transducers 424 (e.g., sensors and/or actuators, and, optionally, one or more energy harvesting transducers). In some examples, the conventional single or multiple cell battery may be a watch style disk or button cell battery that is in an associated electrical connection apparatus (e.g., a metal clip) that electrically connects the electrodes of the battery to contact pads on the wireless transducing circuit 410.

Sensing transducers 424 may represent one or more of a capacitive sensor, an altimeter, a gyroscope, an accelerometer, a temperature sensor, a strain sensor, a pressure sensor, a piezoelectric sensor, a weight sensor, an optical or light sensor (e.g., a photodiode or a camera), an acoustic or sound sensor (e.g., a microphone), a smoke detector, a radioactivity sensor, a chemical sensor (e.g., an explosives detector), a biosensor (e.g., a blood glucose biosensor, odor detectors, antibody based pathogen, food, and water contaminant and toxin detectors, DNA detectors, microbial detectors, pregnancy detectors, and ozone detectors), a magnetic sensor, an electromagnetic field sensor, a humidity sensor, a light emitting units (e.g., light emitting diodes and displays), electro-acoustic transducers (e.g., audio speakers), electric motors, and thermal radiators (e.g., an electrical resistor or a thermoelectric cooler).

Wireless transducing circuit 410 includes a memory 426 for storing data, such as profile data, state data, event data, sensor data, localization data, security data, and/or at least one unique identifier (ID) 428 associated with the wireless transducing circuit 410, such as one or more of a product ID, a type ID, and a media access control (MAC) ID. Memory 426 may also store control code 430 that includes machine-readable instructions that, when executed by the processor 420, cause processor 420 to perform one or more autonomous agent tasks. In certain embodiments, the memory 426 is incorporated into one or more of the processor 420 or sensing transducers 424. In other embodiments, memory 426 is integrated in the wireless transducing circuit 410 as shown in FIG. 4. The control code 430 may implement programmatic functions or program modules that control operation of the wireless transducing circuit 410, including implementation of an agent communication manager that manages the manner and timing of tape agent communications, a node-power manager that manages power consumption, and a tape agent connection manager that controls whether connections with other nodes are secure connections (e.g., connections secured by public key cryptography) or unsecure connections, and an agent storage manager that securely manages the local data storage on the wireless transducing circuit 410. In certain embodiments, a node connection manager ensures the level of security required by the end application and supports various encryption mechanisms. In some examples, a tape agent power manager and communication manager work together to optimize the battery consumption for data communication. In some examples, execution of the control code by the different types of nodes described herein may result in the performance of similar or different functions.

Figure 5:
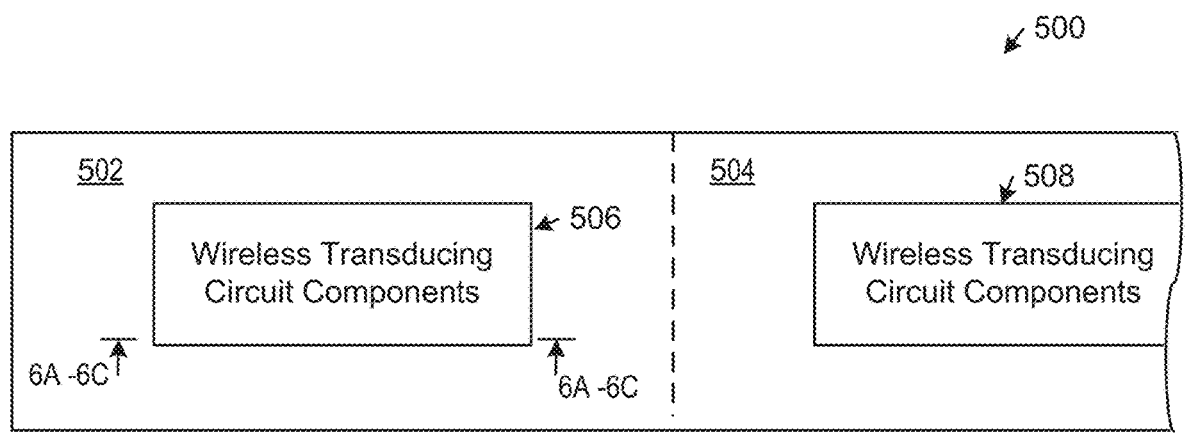
FIG. 5 is a top view of a portion of an example flexible adhesive tape platform that shows a first segment and a portion of a second segment, in embodiments.

FIG. 5 is a top view of a portion of an example flexible adhesive tape platform 500 that shows a first segment 502 and a portion of a second segment 504. Each segment 502, 504 of the flexible adhesive tape platform 500 includes a respective set 506, 508 of the components of the wireless transducing circuit 470 of FIG. 4. The segments 502, 504 and their respective sets of components 506, 508 typically are identical and configured in the same way. In some other embodiments, however, the segments 502, 504 and/or their respective sets of components 506, 508 are different and/or configured in different ways. For example, in some examples, different sets of the segments of the flexible adhesive tape platform 500 have different sets or configurations of tracking and/or transducing components that are designed and/or optimized for different applications, or different sets of segments of the flexible adhesive tape platform may have different ornamentations (e.g., markings on the exterior surface of the platform) and/or different (e.g., alternating) lengths.

Figure 6A:
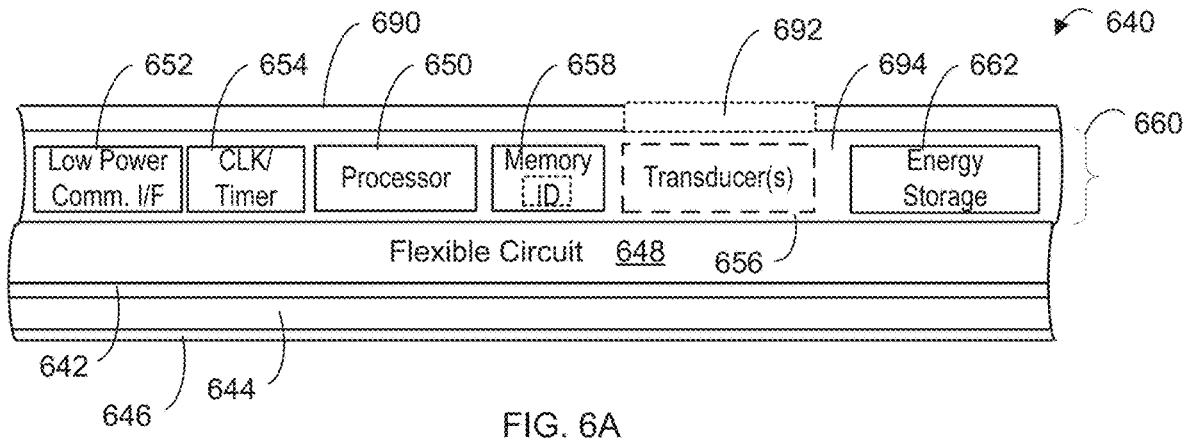
FIGS. 6A-C show cross sectional side views of three flexible adhesive tape agent platforms that each include a respective set of the components of the wireless transducing circuit of FIG. 5, in embodiments.
Figure 6B:
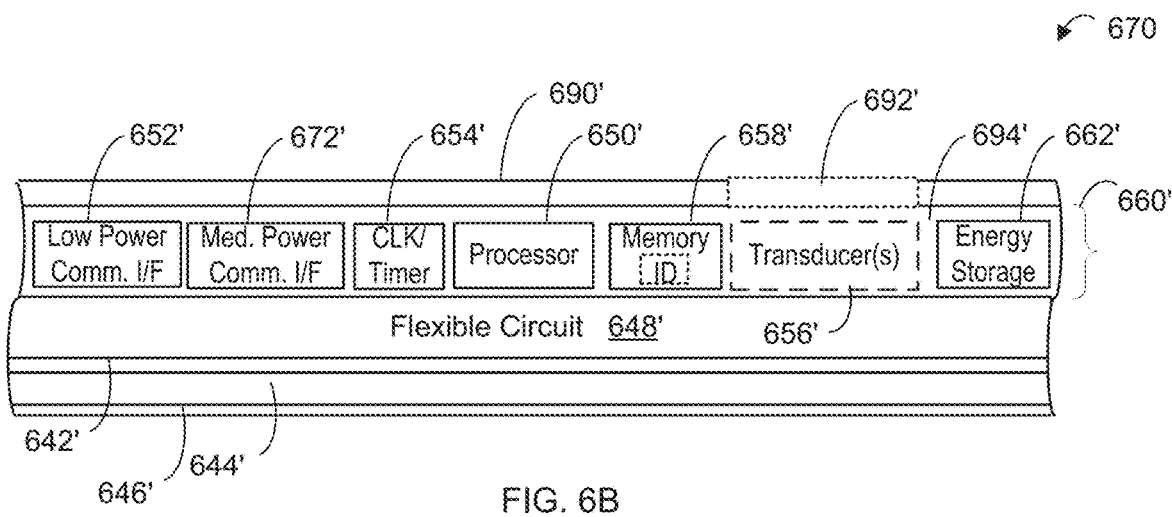
Figure 6C:
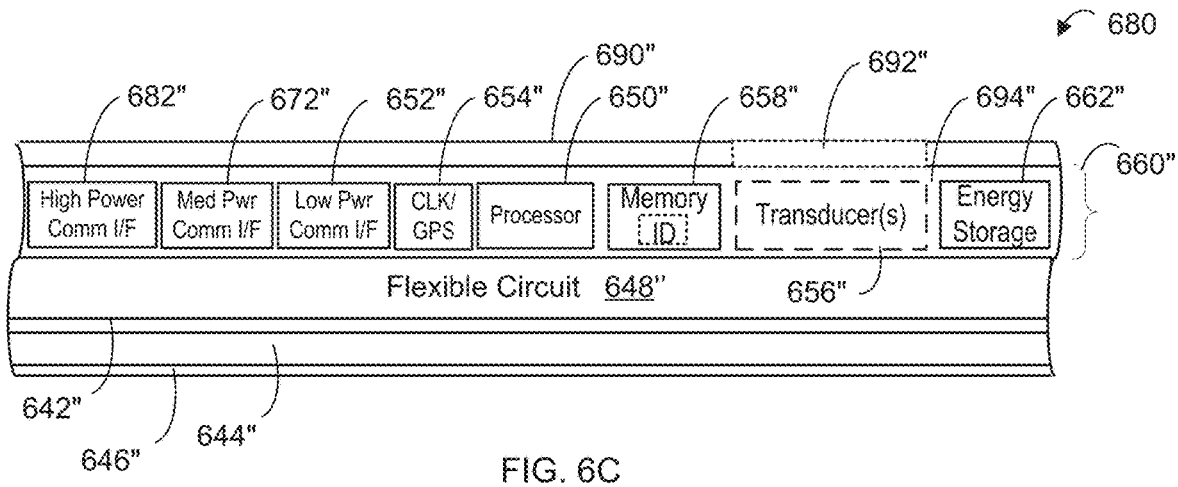
Figure 7A:
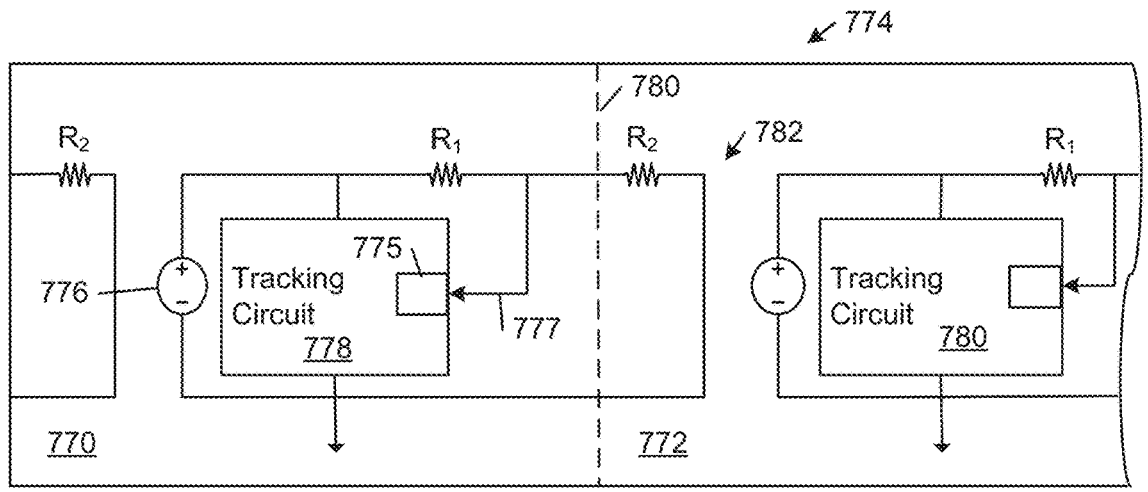
FIGS. 7A and 7B show example circuits of the tracking adhesive product for delivering power from an energy source to a tracking circuit, in embodiments.
Figure 7B:
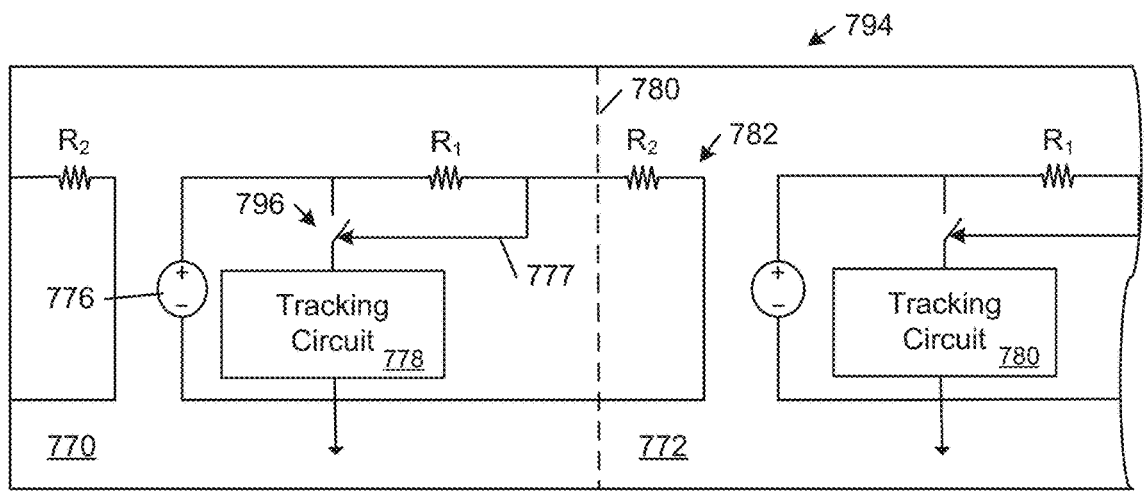
Figure 7C:
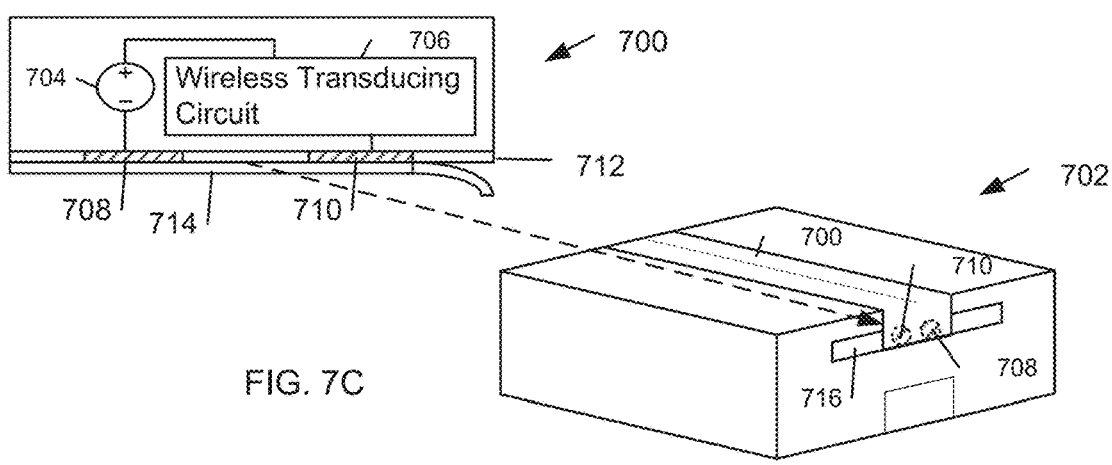
FIG. 7C shows a diagrammatic cross-sectional front view of an example adhesive tape platform and a perspective view of an example asset sealed by the adhesive tape platform, in embodiments.

An example method of fabricating the adhesive tape platform 500 according to a roll-to-roll fabrication process is described in connection with FIGS. 6A-6C and as shown in FIGS. 7A and 7C of U.S. patent application Ser. No. 15/842,861, filed Dec. 14, 2017, the entirety of which is incorporated herein by reference.

The instant specification describes an example system of adhesive tape platforms (also referred to herein as "tape nodes") that can be used to implement a low-cost wireless network infrastructure for performing monitoring, tracking, and other asset management functions relating to, for example, parcels, persons, tools, equipment and other physical assets and objects. The example system includes a set of three different types of tape nodes that have different respective functionalities and different respective cover markings that visually distinguish the different tape node types from one another. In one non-limiting example, the covers of the different tape node types are marked with different colors (e.g., white, green, and black). In the illustrated examples, the different tape node types are distinguishable from one another by their respective wireless communications capabilities and their respective sensing capabilities.

FIG. 6A shows a cross-sectional side view of a portion of an example segment 640 of a flexible adhesive tape agent platform (e.g., platform 532 of FIG. 5) that includes a respective set of the components of the wireless transducing circuit 510 corresponding to the first tape-agent type (e.g., white). The segment 640 includes an adhesive layer 642, an optional flexible substrate 644, and an optional adhesive layer 646 on the bottom surface of the flexible substrate 644. When the bottom adhesive layer 646 is present, a release liner (not shown) may be (weakly) adhered to the bottom surface of the adhesive layer 646. In certain embodiments where adhesive layer 646 is included, the adhesive layer 646 is an adhesive (e.g., an acrylic foam adhesive) with a high-bond strength that is sufficient to prevent removal of the segment 640 from a surface on which the adhesive layer 646 is adhered to without destroying the physical or mechanical integrity of the segment 640 and/or one or more of its constituent components.

In certain embodiments including the optional flexible substrate 644, the optional flexible substrate 644 is a pre-fabricated adhesive tape that includes the adhesive layers 642 and 646 and the optional release liner. In other embodiments including the optional flexible substrate 644, the adhesive layers 642, 646 are applied to the top and bottom surfaces of the flexible substrate 644 during the fabrication of the adhesive tape platform. The adhesive layer 642 may bond the flexible substrate 644 to a bottom surface of a flexible circuit 648, that includes one or more wiring layers (not shown) that connect the processor 650, a low-power wireless-communication interface 652 (e.g., a Zigbee, Bluetooth® Low Energy (BLE) interface, or other low power communication interface), a clock and/or a timer circuit 654, transducing and/or transducer(s) 656 (if present), the memory 658, and other components in a device layer 660 to each other and to the energy storage device 662 and, thereby, enable the transducing, tracking and other functionalities of the segment 640. The low-power wireless-communication interface 652 typically includes one or more of the antennas 415, 418 and one or more of the wireless communication circuits 413, 416 of FIG. 4. The segment 640 may further include a flexible cover 690, an interfacial region 692, and a flexible polymer layer 694.

FIG. 6B shows a cross-sectional side-view of a portion of an example segment 670 of a flexible adhesive tape agent platform (e.g., platform 532 of FIG. 5) that includes a respective set of the components of the wireless transducing circuit 410 corresponding to a second tape-agent type (e.g., green). The segment 670 is similar to the segment 640 shown in FIG. 6A but further includes a medium-power communication-interface 672' (e.g., a LoRa interface) in addition to the low-power communications-interface 652. The medium-power communication-interface 672' has a longer communication range than the low-power communication-interface 652'. In certain embodiments, one or more other components of the segment 670 differ from the segment 640 in functionality or capacity (e.g., larger energy source). The segment 670 may include further components, as discussed above and below with reference to FIGS. 6A, and 6C.

FIG. 6C shows a cross-sectional side view of a portion of an example segment 680 of the flexible adhesive tape-agent platform that includes a respective set of the components of the wireless transducing circuit 410 corresponding to the third tape-node type (e.g., black). The segment 680 is similar to the segment 670 of FIG. 6B, but further includes a high-power communications-interface 682" (e.g., a cellular interface; e.g., GSM/GPRS) in addition to a low-power communications-interface 652", and may include a medium-power communications-interface 672". The high-power communications-interface 682" has a range that provides global coverage to available infrastructure (e.g. the cellular network). In certain embodiments, one or more other components of the segment 680 differ from the segment 670 in functionality or capacity (e.g., larger energy source).

FIGS. 6A-6C show embodiments in which the flexible covers 690, 690', 690" of the respective segments 640, 670, and 680 include one or more interfacial regions 692, 692', 692" positioned over one or more of the transducers 656, 656', 656". In certain embodiments, one or more of the interfacial regions 692, 692', 692" have features, properties, compositions, dimensions, and/or characteristics that are designed to improve the operating performance of the platform for specific applications. In certain embodiments, the flexible adhesive tape platform includes multiple interfacial regions 692, 692', 692" over respective transducers 656, 656', 656", which may be the same or different depending on the target applications. Interfacial regions may represent one or more of an opening, an optically transparent window, and/or a membrane located in the interfacial regions 692, 692', 692" of the flexible covers 690, 690', 690" that is positioned over the one or more transducers and/or transducers 656, 656', 656". Additional details regarding the structure and operation of example interfacial regions 692, 692', 692" are described in U.S. Provisional Patent Application No. 62/680,716, filed Jun. 5, 2018, and US Provisional Patent Application No. 62/670,712, filed May 11, 2018.

In certain embodiments, a planarizing polymer 694, 694', 694" encapsulates the respective device layers 660, 660', 660" and thereby reduces the risk of damage that may result from the intrusion of contaminants and/or liquids (e.g., water) into the device layer 660, 660', 660". The flexible polymer layers 694, 694', 694" may also planarize the device layers 660, 660', 660". This facilitates optional stacking of additional layers on the device layers 660, 660', 660" and also distributes forces generated in, on, or across the segments 640, 670, 680 so as to reduce potentially damaging asymmetric stresses that might be caused by the application of bending, torquing, pressing, or other forces that may be applied to the segments 640, 670, 680 during use. In the illustrated example, a flexible cover 690, 690', 690" is bonded to the planarizing polymer 694, 694', 694" by an adhesive layer (not shown).

The flexible cover 690, 690', 690" and the flexible substrate 644, 644', 644" may have the same or different compositions depending on the intended application. In some examples, one or both of the flexible cover 690, 690', 690" and the flexible substrate 644, 644', 644" include flexible film layers and/or paper substrates, where the film layers may have reflective surfaces or reflective surface coatings. Compositions for the flexible film layers may represent one or more of polymer films, such as polyester, polyimide, polyethylene terephthalate (PET), and other plastics. The optional adhesive layer on the bottom surface of the flexible cover 690, 690', 690" and the adhesive layers 642, 642', 642", 646, 646', 646" on the top and bottom surfaces of the flexible substrate 644, 644', 644" typically include a pressure-sensitive adhesive (e.g., a silicon-based adhesive). In some examples, the adhesive layers are applied to the flexible cover 690, 690', 690" and the flexible substrate 644, 644', 644" during manufacture of the adhesive tape-agent platform (e.g., during a roll-to-roll or sheet-to-sheet fabrication process). In other examples, the flexible cover 690, 690', 690" may be implemented by a prefabricated single-sided pressure-sensitive adhesive tape and the flexible substrate 644, 644', 644" may be implemented by a prefabricated double-sided pressure-sensitive adhesive tape; both kinds of tape may be readily incorporated into a roll-to-roll or sheet-to-sheet fabrication process. In some examples, the flexible substrate 644, 644', 644" is composed of a flexible epoxy (e.g., silicone).

In certain embodiments, the energy storage device 662, 662', 662" is a flexible battery that includes a printed electrochemical cell, which includes a planar arrangement of an anode and a cathode and battery contact pads. In some examples, the flexible battery may include lithium-ion cells or nickel-cadmium electro-chemical cells. The flexible battery typically is formed by a process that includes printing or laminating the electro-chemical cells on a flexible substrate (e.g., a polymer film layer). In some examples, other components may be integrated on the same substrate as the flexible battery. For example, the low-power wireless-communication interface 652, 652', 652" and/or the processor(s) 650, 650', 650" may be integrated on the flexible battery substrate. In some examples, one or more of such components also (e.g., the flexible antennas and the flexible interconnect circuits) may be printed on the flexible battery substrate.

In examples of manufacture, the flexible circuit 648, 648', 648" is formed on a flexible substrate by one or more of printing, etching, or laminating circuit patterns on the flexible substrate. In certain embodiments, the flexible circuit 648, 648', 648" is implemented by one or more of a single-sided flex circuit, a double access or back-bared flex circuit, a sculpted flex circuit, a double-sided flex circuit, a multi-layer flex circuit, a rigid flex circuit, and a polymer-thick film flex circuit. A single-sided flexible circuit has a single conductor layer made of, for example, a metal or conductive (e.g., metal filled) polymer on a flexible dielectric film. A double access or back bared flexible circuit has a single conductor layer but is processed so as to allow access to selected features of the conductor pattern from both sides. A sculpted flex circuit is formed using a multi-step etching process that produces a flex circuit that has finished copper conductors that vary in thickness along their respective lengths. A multilayer flex circuit has three of more layers of conductors, where the layers typically are interconnected using plated through holes. Rigid flex circuits are a hybrid construction of flex circuit consisting of rigid and flexible substrates that are laminated together into a single structure, where the layers typically are electrically interconnected via plated through holes. In polymer thick film (PTF) flex circuits, the circuit conductors are printed onto a polymer base film, where there may be a single conductor layer or multiple conductor layers that are insulated from one another by respective printed insulating layers.

In the example segments 640, 670, 680 shown in FIGS. 6A-6C, the flexible circuit 648, 648', 648" represents a single-access flex-circuit that interconnects the components of the adhesive tape platform on a single side of the flexible circuit 648, 648', 648". However, in other embodiments, the flexible circuit 648, 648', 648" represents a double access flex circuit that includes a front-side conductive pattern that interconnects the low-power communications interface 652, 652', 652", the timer circuit 654, 654', 654", the processor 650, 650', 650", the one or more sensor transducers 656, 656', 656" (if present), and the memory 658, 658', 658", and allows through-hole access (not shown) to a back-side conductive pattern that is connected to the flexible battery (not shown). In these embodiments, the front-side conductive pattern of the flexible circuit 648, 648', 648" connects the communications circuits 652, 652', 652", 672', 672", 682" (e.g., receivers, transmitters, and transceivers) to their respective antennas and to the processor 650, 650', 650" and also connects the processor 650, 650', 650" to the one or more sensors and the memory 658, 658', and 658". The backside conductive pattern connects the active electronics (e.g., the processor 650, 650', 650", the communications circuits 652, 652', 652", 672', 672", 682" and the transducers) on the front-side of the flexible circuit 648, 648', 648" to the electrodes of the energy storage device 662, 662', 662" via one or more through holes in the substrate of the flexible circuit 648, 648', 648".

The various units of the segments 640, 670, 680 shown in FIGS. 6A-6C may be arranged to accommodate different objects or structures (e.g., trash bins, fire extinguishers, etc.) and sensors may be added to, or subtracted from, the segments 640, 670, and 680, according to a particular task.

Referring to FIG. 7A, in some examples, each of one or more of the segments 770, 772 of a tracking adhesive product 774 includes a respective circuit 775 that delivers power from the respective energy source 776 to the respective tracking circuit 778 (e.g., a processor and one or more wireless communications circuits) in response to an event. In some of these examples, the wake circuit 775 is configured to transition from an off-state to an on-state when the voltage on the wake node 777 exceeds a threshold level, at which point the wake circuit transitions to an on-state to power-on the segment 770. In the illustrated example, this occurs when the user separates the segment from the tracking adhesive product 774, for example, by cutting across the tracking adhesive product 774 at a designated location (e.g., along a designated cut-line 780). In particular, in its initial, un-cut state, a minimal amount of current flows through the resistors R1 and R2. As a result, the voltage on the wake node 777 remains below the threshold turn-on level. After the user cuts across the tracking adhesive product 774 along the designated cut-line 780, the user creates an open circuit in the loop 782, which pulls the voltage of the wake node above the threshold level and turns on the wake circuit 775. As a result, the voltage across the energy source 776 will appear across the tracking circuit 778 and, thereby, turn on the segment 770. In particular embodiments, the resistance value of resistor R1 is greater than the resistance value of R2. In some examples, the resistance values of resistors R1 and R2 are selected based on the overall design of the adhesive product system (e.g., the target wake voltage level and a target leakage current).

In some examples, each of one or more of the segments of a tracking adhesive product includes a respective sensor and a respective wake circuit that delivers power from the respective energy source to the respective one or more components of the respective tracking circuit 778 in response to an output of the sensor. In some examples, the respective sensor is a strain sensor that produces a wake signal based on a change in strain in the respective segment. In some of these examples, the strain sensor is affixed to a tracking adhesive product and configured to detect the stretching of the tracking adhesive product segment as the segment is being peeled off a roll or a sheet of the tracking adhesive product. In some examples, the respective sensor is a capacitive sensor that produces a wake signal based on a change in capacitance in the respective segment. In some of these examples, the capacitive sensor is affixed to a tracking adhesive product and configured to detect the separation of the tracking adhesive product segment from a roll or a sheet of the tracking adhesive product. In some examples, the respective sensor is a flex sensor that produces a wake signal based on a change in curvature in the respective segment. In some of these examples, the flex sensor is affixed to a tracking adhesive product and configured to detect bending of the tracking adhesive product segment as the segment is being peeled off a roll or a sheet of the tracking adhesive product. In some examples, the respective sensor is a near field communications sensor that produces a wake signal based on a change in inductance in the respective segment.

FIG. 7B shows another example of a tracking adhesive product 794 that delivers power from the respective energy source 776 to the respective tracking circuit 778 (e.g., a processor and one or more wireless communications circuits) in response to an event. This example is similar in structure and operation as the tracking adhesive product 794 shown in FIG. 7A, except that the wake circuit 775 is replaced by a switch 796 that is configured to transition from an open state to a closed state when the voltage on the switch node 777 exceeds a threshold level. In the initial state of the tracking adhesive product 794, the voltage on the switch node is below the threshold level as a result of the low current level flowing through the resistors R1 and R2. After the user cuts across the tracking adhesive product 794 along the designated cut-line 780, the user creates an open circuit in the loop 782, which pulls up the voltage on the switch node above the threshold level to close the switch 796 and turn on the tracking circuit 778.

A wireless sensing system includes a plurality of wireless nodes configured to detect tampering in assets. Tampering may include, but is not limited to, opening assets such as boxes, containers, storage, or doors, moving the asset without authorization, moving the asset to an unintended location, moving the asset in an unintended way, damaging the asset, shaking the asset in an unintended way, orienting an asset in a way that it is not meant to be oriented. In many cases, these actions may compromise the integrity or safety of assets. Wireless nodes associated with the asset are configured to detect a tampering event. In an embodiment, a tampering event is associated with an action, a time, and a location. In an embodiment, the wireless nodes communicate the tampering event to the wireless sensing system. The wireless sensing system is configured to provide a notification or alert to a user of the wireless sensing system. In some embodiments, a wireless node may directly transmit the notification or alert to the user. In other embodiments, a wireless node may include a display that indicates whether or not a tampering event has occurred (e.g., the display may be an indicator light or LED).

Alerts may be transmitted to server/cloud, other wireless nodes, a client device, or some combination thereof. For example, in an embodiment, a wireless node of the wireless sensing system captures sensor data, detects a tampering event, and transmits an alarm to a user of the wireless sensing system (e.g., without communicating with a server or cloud of the wireless sensing system). In another embodiment, a wireless node of the wireless sensing system captures sensor data and transmits the sensor data to a gateway, parent node (e.g., black tape), or client device. The gateway, parent node, or client device detects a tampering event based on the received sensor data and transmits an alarm to a user of the wireless sensing system. In another embodiment, the wireless node of the wireless sensing system captures sensor data, detects a tampering event, and transmits information describing the tampering event to a server or cloud of the wireless sensing system. The server or cloud of the wireless sensing system transmits an alarm to a user of the wireless sensing system.

FIG. 7C shows a diagrammatic cross-sectional front view of an example adhesive tape platform 700 and a perspective view of an example asset 702. Instead of activating the adhesive tape platform in response to separating a segment of the adhesive tape platform from a roll or a sheet of the adhesive tape platform, this example is configured to supply power from the energy source 702 to turn on the wireless transducing circuit 706 in response to establishing an electrical connection between two power terminals 708, 710 that are integrated into the adhesive tape platform. In particular, each segment of the adhesive tape platform 700 includes a respective set of embedded tracking components, an adhesive layer 712, and an optional backing sheet 714 with a release coating that prevents the segments from adhering strongly to the backing sheet 714. In some examples, the power terminals 708, 710 are composed of an electrically conductive material (e.g., a metal, such as copper) that may be printed or otherwise patterned and/or deposited on the backside of the adhesive tape platform 700. In operation, the adhesive tape platform can be activated by removing the backing sheet 714 and applying the exposed adhesive layer 712 to a surface that includes an electrically conductive region 716. In the illustrated embodiment, the electrically conductive region 716 is disposed on a portion of the asset 702. When the adhesive backside of the adhesive tape platform 700 is adhered to the asset with the exposed terminals 708, 710 aligned and in contact with the electrically conductive region 716 on the asset 702, an electrical connection is created through the electrically conductive region 716 between the exposed terminals 708, 710 that completes the circuit and turns on the wireless transducing circuit 706. In particular embodiments, the power terminals 708, 710 are electrically connected to any respective nodes of the wireless transducing circuit 706 that would result in the activation of the tracking circuit 706 in response to the creation of an electrical connection between the power terminals 708, 710.

In some examples, after a tape node is turned on, it will communicate with the network service to confirm that the user/operator who is associated with the tape node is an authorized user who has authenticated himself or herself to the network service. In these examples, if the tape node cannot confirm that the user/operator is an authorized user, the tape node will turn itself off.

Figure 8:
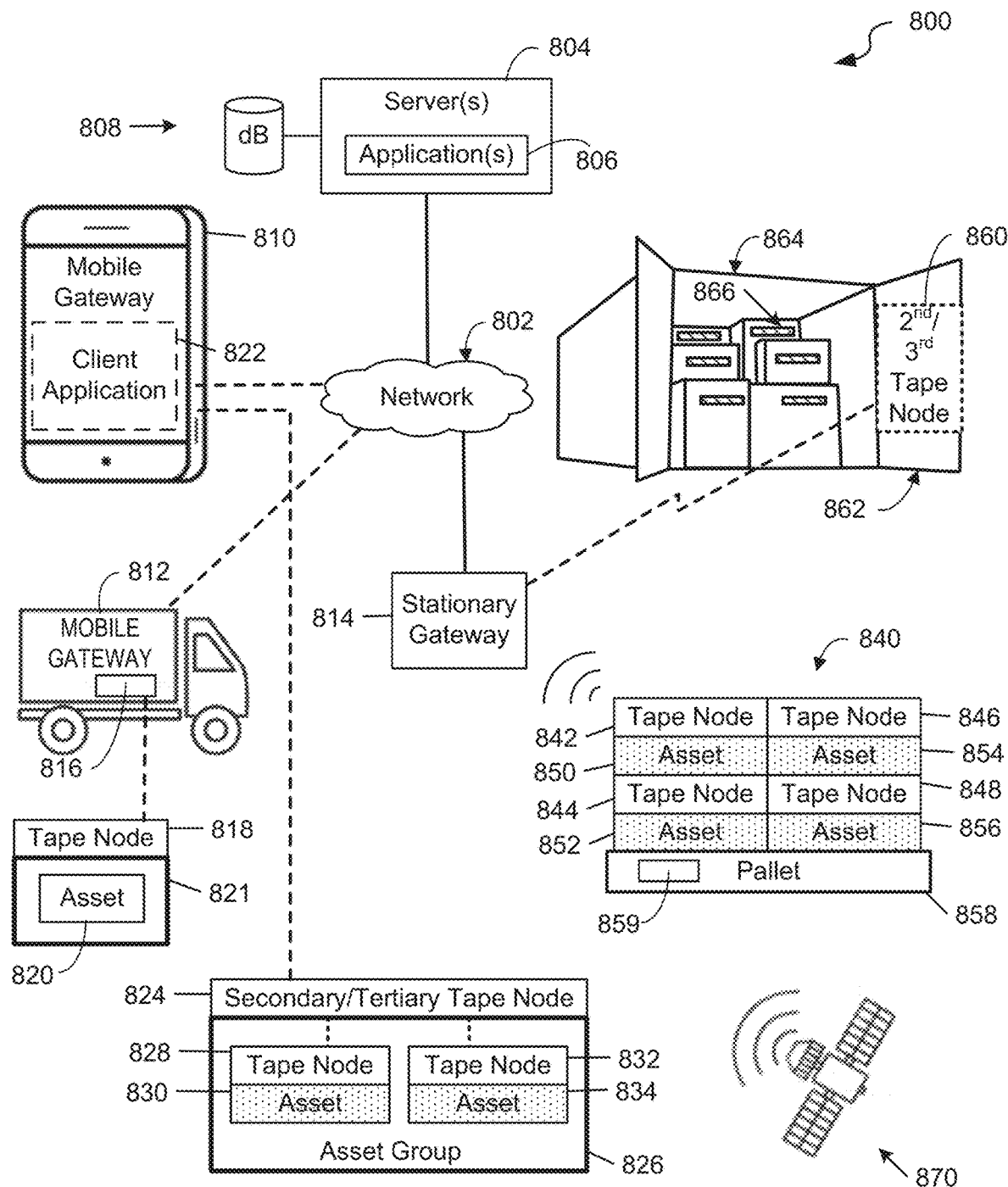
FIG. 8 shows an example network communications environment that includes a network supporting communications between servers, mobile gateways, a stationary gateway, and various types of tape nodes associated with various assets, in embodiments.

FIG. 8 shows an example network communications environment 800 that includes a network 802 that supports communications between one or more servers 804 executing one or more applications of a network service 808, mobile gateways 810 (a smart device mobile gateway), 812 (a vehicle mobile gateway), a stationary gateway 814, and various types of tape nodes that are associated with various assets (e.g., parcels, equipment, tools, persons, and other things). Hereinafter "tape nodes" may be used interchangeably with the "agents", as described above, with reference to FIGS. 1-8; the "agents" are in the form of a "tape node" attached to different objects, e.g., an asset, storage container, vehicle, equipment, etc.; the master agent may be referred to as a master tape node, a secondary agent may be referred to as a secondary tape node; and a tertiary agent may be referred to as a tertiary tape node.

In some examples, the network 802 (e.g., a wireless network) includes one or more network communication systems and technologies, including any one or more of wide area networks, local area networks, public networks (e.g., the internet), private networks (e.g., intranets and extranets), wired networks, and wireless networks. For example, the network 802 includes communications infrastructure equipment, such as a geolocation satellite system 870 (e.g., GPS, GLONASS, and NAVSTAR), cellular communication systems (e.g., GSM/GPRS), Wi-Fi communication systems, RF communication systems (e.g., LoRa), Bluetooth communication systems (e.g., a Bluetooth Low Energy system), Z-wave communication systems, and Zig-Bee communication systems.

In some examples, the one or more network service applications leverage the above-mentioned communications technologies to create a hierarchical wireless network of tape nodes improves asset management operations by reducing costs and improving efficiency in a wide range of processes, from asset packaging, asset transporting, asset tracking, asset condition monitoring, asset inventorying, and asset security verification. Communication across the network is secured by a variety of different security mechanisms. In the case of existing infrastructure, a communication link uses the infrastructure security mechanisms. In the case of communications among tapes nodes, the communication is secured through a custom security mechanism. In certain cases, tape nodes may also be configured to support block chain to protect the transmitted and stored data.

A network of tape nodes may be configured by the network service to create hierarchical communications network. The hierarchy may be defined in terms of one or more factors, including functionality (e.g., wireless transmission range or power), role (e.g., master-tape node vs. peripheral-tape node), or cost (e.g., a tape node equipped with a cellular transceiver vs. a peripheral tape node equipped with a Bluetooth LE transceiver). As described above with reference to the agents, tape nodes may be assigned to different levels of a hierarchical network according to one or more of the above-mentioned factors. For example, the hierarchy may be defined in terms of communication range or power, where tape nodes with higher-power or longer-communication range transceivers are arranged at a higher level of the hierarchy than tape nodes with lower-power or lower-range power or lower range transceivers. In another example, the hierarchy is defined in terms of role, where, e.g., a master tape node is programmed to bridge communications between a designated group of peripheral tape nodes and a gateway node or server node. The problem of finding an optimal hierarchical structure may be formulated as an optimization problem with battery capacity of nodes, power consumption in various modes of operation, desired latency, external environment, etc. and may be solved using modern optimization methods e.g. neural networks, artificial intelligence, and other machine learning computing systems that take expected and historical data to create an optimal solution and may create algorithms for modifying the system's behavior adaptively in the field.

The tape nodes may be deployed by automated equipment or manually. In this process, a tape node typically is separated from a roll or sheet and adhered to a parcel (e.g., asset 820) or other stationary (e.g., stationary gateway 814) or mobile object (e.g., a, such as a delivery truck, such as mobile gateway 812) or stationary object (e.g., a structural element of a building). This process activates the tape node (e.g., the tape node 818) and causes the tape node 818 to communicate with the one or more servers 804 of the network service 808. In this process, the tape node 418 may communicate through one or more other tape nodes (e.g., the tape nodes 842, 844, 846, 848) in the communication hierarchy. In this process, the one or more servers 804 executes the network service application 806 to programmatically configure tape nodes 818, 824, 828, 832, 842, 844, 846, 848, that are deployed in the network communications environment 800. In some examples, there are multiple classes or types of tape nodes (e.g., a master agent, a secondary agent, and a tertiary agent), where each tape node class has a different respective set of functionalities and/or capacities, as described above with respect to the "agents" in FIGS. 1-7. For example, the master agents have a lower-power wireless communication interface (e.g., the low-power wireless-communication interface 652, with reference to FIG. 6), in comparison to the secondary and tertiary agents).

In some examples, the one or more servers 804 communicate over the network 802 with one or more gateways 810, 812, 814 that are configured to send, transmit, forward, or relay messages to the network 802 in response to transmissions from the tape nodes 818, 824, 828, 832, 842, 844, 846, 848 that are associated with respective assets and within communication range. Example gateways include mobile gateways 810, 812 and a stationary gateway 814. In some examples, the mobile gateways 810, 812, and the stationary gateway 814 are able to communicate with the network 802 and with designated sets or groups of tape nodes.

In some examples, the mobile gateway 812 is a vehicle (e.g., a delivery truck or other mobile hub) that includes a wireless communications unit 816 that is configured by the network service 808 to communicate with a designated network of tape nodes, including tape node 818 (e.g., a master tape node) in the form of a label that is adhered to a parcel 821 (e.g., an envelope) that contains an asset 820, and is further configured to communicate with the network service 808 over the network 802. In some examples, the tape node 818 includes a lower-power wireless-communications interface of the type used in, e.g., segment 640 (shown in FIG. 6A), and the wireless communications unit 816 may implemented by a secondary or tertiary tape node (e.g., one of segment 670 or segment 680, respectively shown in FIGS. 6B and 6C) that includes a lower-power communications interfaces for communicating with tape nodes within range of the mobile gateway 812 and a higher-power communications-interface for communicating with the network 802. In this way, the tape node 818 and wireless communications unit 816 create a hierarchical wireless network of tape nodes for transmitting, forwarding, bridging, relaying, or otherwise communicating wireless messages to, between, or on behalf of the tape node 818 in a power-efficient and cost-effective way.

In some examples, a mobile gateway 810 is a mobile phone that is operated by a human operator and executes a client application 822 that is configured by a network service to communicate with a designated set of tape nodes, including a secondary or tertiary tape node 824 that is adhered to a parcel 826 (e.g., a box), and is further configured to communicate with a server 804 over the network 802. In the illustrated example, the parcel 826 contains a first parcel labeled or sealed by a master tape node 828 and containing a first asset 830, and a second parcel labeled or sealed by a master tape node 832 and containing a second asset 834. The secondary or tertiary tape node 824 communicates with each of the master tape nodes 828, 832 and also communicates with the mobile gateway 810. In some examples, each of the master tape nodes 828, 832 includes a lower-power wireless-communications interface of the type used in, e.g., segment 640 (shown in FIG. 6A), and the secondary/tertiary tape node 824 is implemented by a tape node (e.g., segment 670 or segment 680, shown in FIGS. 6B and 6C) that includes a low-power communications interface for communicating with the master tape nodes 828, 832 contained within the parcel 826, and a higher-power communications interface for communicating with the mobile gateway 810. The secondary or tertiary tape node 824 is operable to relay wireless communications between the master tape nodes 828, 832 contained within the parcel 826 and the mobile gateway 810, and the mobile gateway 810 is operable to relay wireless communications between the secondary or tertiary tape node 824 and the server 804 over the network 802. In this way, the master tape nodes 828 and 832 and the secondary or tertiary tape node 824 create a wireless network of nodes for transmitting, forwarding, relaying, or otherwise communicating wireless messages to, between, or on behalf of the master tape nodes 828, 832, the secondary or tertiary tape node 824, and the network service (not shown) in a power-efficient and cost-effective way.

In some embodiments, the client application 822 is installed on a mobile device (e.g., smartphone) that may also operate as mobile gateway 810. The client application 822 may cause the mobile device to function as a mobile gateway 810. For example, the client application 822 runs in the background to allow the mobile device to bridge communications between tape nodes that are communicating on one protocol to other tape nodes that are communicating on another protocol. For example, a tape node transmits data to the mobile device through Bluetooth, and the mobile device (running the client application 822) relays that data to the server 804 via cellular (2G, 3G, 4G, 5G) or Wi-Fi. Further, the client application 822 may cause the mobile device to establish a connection with, and receive pings (e.g., alerts to nearby assets that an environmental profile threshold has been exceeded), from the tape nodes or from the server 804. The tape nodes or server may request services (e.g., to display alert messages within a graphical user interface of the mobile device, relay messages to nearby tape nodes or mobile or stationary gateways, delegate tasks to the mobile device, such as determining the location of the tape node, etc.) from the mobile device. For example, the mobile device running the client application 822 may share location data with the tape node, allowing the tape node to pinpoint its location.

In some examples, the stationary gateway 814 is implemented by a server 804 executing a network service application 806 that is configured by the network service 808 to communicate with a designated set 840 of master tape nodes 842, 844, 846, 848 that are adhered to respective parcels containing respective assets 850, 852, 854, 856 on a pallet 858. In other examples, the stationary gateway 814 is implemented by a secondary or tertiary tape node 860 (e.g., segments 670 or 680, respectively shown in FIGS. 6B and 6C) that is adhered to, for example, a wall, column or other infrastructure component of the physical premise's environment 800, and includes a low-power communications interface for communicating with nodes within range of the stationary gateway 814 and a higher-power communications interface for communicating with the network 802.

In one embodiment, each of the master tape nodes 842-848 is a master tape node and is configured by the network service 808 to communicate individually with the stationary gateway 814, which relays communications from the master tape nodes 842-848 to the network service 808 through the stationary gateway 814 and over the network 802. In another embodiment, one of the master tape nodes 842-848 at a time is configured to transmit, forward, relay, or otherwise communicate wireless messages to, between, or on behalf of the other master nodes on the pallet 858. In this embodiment, the master tape node may be determined by the master tape nodes 842-848 or designated by the network service 808. In some examples, the master tape nodes 842-848 with the longest range or highest remaining power level is determined to be the master tape node. In some examples, when the power level of the current master tape node drops below a certain level (e.g., a fixed power threshold level or a threshold level relative to the power levels of one or more of the other master tape nodes), another one of the master tape nodes assumes the role of the master tape node. In some examples, a master tape node 859 is adhered to the pallet 858 and is configured to perform the role of a master node for the other master tape nodes 842-848. In these ways, the master tape nodes 842-848, 859 are configurable to create different wireless networks of nodes for transmitting, forwarding, relaying, bridging, or otherwise communicating wireless messages with the network service 408 through the stationary gateway 814 and over the network 802 in a power-efficient and cost-effective way.

In the illustrated example, the stationary gateway 814 also is configured by the network service 808 to communicate with a designated network of tape nodes, including the secondary or tertiary tape node 860 that is adhered to the inside of a door 862 of a shipping container 864, and is further configured to communicate with the network service 808 over the network 802. In the illustrated example, the shipping container 864 contains a number of parcels labeled or sealed by respective master tape nodes 866 and containing respective assets. The secondary or tertiary tape node 860 communicates with each of the master tape nodes 866 within the shipping container 864 and communicates with the stationary gateway 814. In some examples, each of the master tape nodes 866 includes a low-power wireless communications-interface (e.g., the low-power wireless-communication interface 652, with reference to FIG. 6A), and the secondary or tertiary tape node 860 includes a low-power wireless-communications interface (low-power wireless-communication interfaces 652', 652", with reference to FIGS. 6B-6C) for communicating with the master tape nodes 866 contained within the shipping container 864, and a higher-power wireless-communications interface (e.g., medium-power wireless-communication interface 672', medium-power wireless-communication interface 672", high-power wireless-communication interface 682", with reference to FIGS. 6B-6C) for communicating with the stationary gateway 814. In some examples, either a secondary or tertiary tape node, or both, may be used, depending on whether a high-power wireless-communication interface is necessary for sufficient communication.

In some examples, when the doors of the shipping container 864 are closed, the secondary or tertiary tape node 860 is operable to communicate wirelessly with the master tape nodes 866 contained within the shipping container 864. In some embodiments, both a secondary and a tertiary node are attached to the shipping container 864. Whether a secondary and a tertiary node are used may depend on the range requirements of the wireless-communications interface. For example, if out at sea a node will be required to transmit and receive signals from a server located outside the range of a medium-power wireless-communications interface, a tertiary node will be used because the tertiary node includes a high-power wireless-communications interface.

In an example, the secondary or tertiary tape node 860 is configured to collect sensor data from master tape nodes 866 and, in some embodiments, process the collected data to generate, for example, statistics from the collected data. When the doors of the shipping container 864 are open, the secondary or tertiary tape node 860 is programmed to detect the door opening (e.g., using a photodetector or an accelerometer component of the secondary or tertiary tape node 860) and, in addition to reporting the door opening event to the network service 808, the secondary or tertiary tape node 860 is further programmed to transmit the collected data and/or the processed data in one or more wireless messages to the stationary gateway 814. The stationary gateway 814, in turn, is operable to transmit the wireless messages received from the secondary or tertiary tape node 860 to the network service 808 over the network 802. Alternatively, in some examples, the stationary gateway 814 also is operable to perform operations on the data received from the secondary or tertiary tape node 860 with the same type of data produced by the secondary or tertiary tape node 860 based on sensor data collected from the master tape nodes 842-848. In this way, the secondary or tertiary tape node 860 and master tape node 866 create a wireless network of nodes for transmitting, forwarding, relaying, or otherwise communicating wireless messages to, between, or on behalf of the master tape node 866, the secondary or tertiary tape nodes 860, and the network service 808 in a power-efficient and cost-effective way.

In an example of the embodiment shown in FIG. 8, there are three types of backward compatible tape nodes: a short-range master tape node (e.g., segment 640), a medium-range secondary tape node (e.g., segment 670), and a long-range tertiary tape node (e.g. segment 680), as respectively shown in FIGS. 6A-6C (here, "tape node" is used interchangeably with "agent", as described with reference to FIGS. 1-7). The short-range master tape nodes typically are adhered directly to parcels containing assets. In the illustrated example, the master tape nodes 818, 828, 832, 842-848, 866 are short-range tape nodes. The short-range tape nodes typically communicate with a low-power wireless-communication protocol (e.g., Bluetooth LE, Zigbee, or Z-wave). The segment 670 are typically adhered to objects (e.g., a parcel 826 and a shipping container 864) that are associated with multiple parcels that are separated from the medium-range tape nodes by a barrier or a long distance. In the illustrated example, the secondary and/or tertiary tape nodes 824 and 860 are medium-range tape nodes. The medium-range tape nodes typically communicate with low and medium-power wireless-communication protocols (e.g., Bluetooth, LoRa, or Wi-Fi). The segments 680 typically are adhered to mobile or stationary infrastructure of the network communications environment 800.

In the illustrated example, the mobile gateway 812 and the stationary gateway 814 are implemented by, e.g., segment 680. The segments 680 typically communicate with other nodes using a high-power wireless-communication protocol (e.g., a cellular data communication protocol). In some examples, the wireless communications unit 416 (a secondary or tertiary tape node) is adhered to a mobile gateway 812 (e.g., a truck). In these examples, the wireless communications unit 816 may be moved to different locations in the network communications environment 800 to assist in connecting other tape nodes to the wireless communications unit 816. In some examples, the stationary gateway 814 is a tape node that may be attached to a stationary structure (e.g., a wall) in the network communications environment 800 with a known geographic location (e.g., GPS coordinates). In these examples, other tape nodes in the environment may determine their geographic location by querying the stationary gateway 814.

In some examples, in order to conserve power, the tape nodes typically communicate according to a schedule promulgated by the network service 808. The schedule usually dictates all aspects of the communication, including the times when particular tape nodes should communicate, the mode of communication, and the contents of the communication. In one example, the server (not shown) transmits programmatic Global Scheduling Description Language (GSDL) code to the master tape node and each of the secondary and tertiary tape nodes in the designated set. In this example, execution of the GSDL code causes each of the tape nodes in the designated set to connect to the master tape node at a different respective time that is specified in the GSDL code, and to communicate a respective set of one or more data packets of one or more specified types of information over the respective connection. In some examples, the master tape node simply forwards the data packets to the server 804, either directly or indirectly through a gateway tape node (e.g., the long-range tape node, such as wireless communication unit 816, adhered to the mobile gateway 812, or a long-range tape node, such as stationary gateway 814, that is adhered to an infrastructure component of the network communications environment 800). In other examples, the master tape node processes the information contained in the received data packets and transmits the processed information to the server 804.

Figure 9:
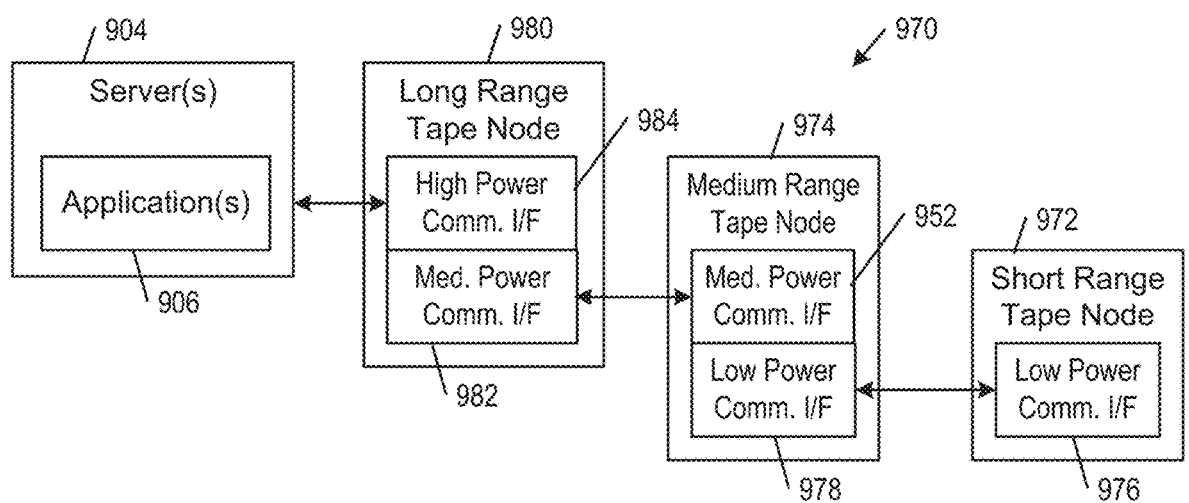
FIG. 9 shows one example hierarchical wireless communications network of tape nodes, in embodiments.

FIG. 9 shows an example hierarchical wireless communications network of tape nodes 970. In this example, the short-range tape node 972 and the medium range tape node 974 communicate with one another over their respective low power wireless communication interfaces 976, 978. The medium range tape node 974 and the long-range tape node 980 communicate with one another over their respective medium power wireless communication interfaces 978, 982. The long-range tape node 980 and the one or more network service servers 904 communicate with one another over the high-power communication interface 984. In some examples, the low power communication interfaces 976, 978 establish wireless communications with one another in accordance with the Bluetooth LE protocol, the medium power communication interfaces 986, 982 establish wireless communications with one another in accordance with the LoRa communications protocol, and the high-power communication interface 984 establishes wireless communications with the one or more network service servers 904 in accordance with a cellular communications protocol.

In some examples, the different types of tape nodes are deployed at different levels in the communications hierarchy according to their respective communications ranges, with the long-range tape nodes generally at the top of the hierarchy, the medium range tape nodes generally in the middle of the hierarchy, and the short-range tape nodes generally at the bottom of the hierarchy. In some examples, the different types of tape nodes are implemented with different feature sets that are associated with component costs and operational costs that vary according to their respective levels in the hierarchy. This allows system administrators flexibility to optimize the deployment of the tape nodes to achieve various objectives, including cost minimization, asset tracking, asset localization, and power conservation.

In some examples, one or more network service servers 904 of the network service 908 designates a tape node at a higher level in a hierarchical communications network as a master node of a designated set of tape nodes at a lower level in the hierarchical communications network. For example, the designated master tape node may be adhered to a parcel (e.g., a box, pallet, or shipping container) that contains one or more tape nodes that are adhered to one or more packages containing respective assets. In order to conserve power, the tape nodes typically communicate according to a schedule promulgated by the one or more network service servers 904 of the network service 908. The schedule usually dictates all aspects of the communication, including the times when particular tape nodes should communicate, the mode of communication, and the contents of the communication. In one example, the one or more network service servers 904 transmits programmatic Global Scheduling Description Language (GSDL) code to the master tape node and each of the lower-level tape nodes in the designated set. In this example, execution of the GSDL code causes each of the tape nodes in the designated set to connect to the master tape node at a different respective time that is specified in the GSDL code, and to communicate a respective set of one or more data packets of one or more specified types of information over the respective connection. In some examples, the master tape node simply forwards the data packets to the one or more network service servers 904, either directly or indirectly through a gateway tape node (e.g., the long-range wireless communication unit 916 adhered to the mobile gateway 912 (which could be a vehicle, ship, plane, etc.) or the stationary gateway 914 is a long-range tape node adhered to an infrastructure component of the environment 900). In other examples, the master tape node processes the information contained in the received data packets and transmits the processed information to the one or more network service servers 904.

Figure 10:
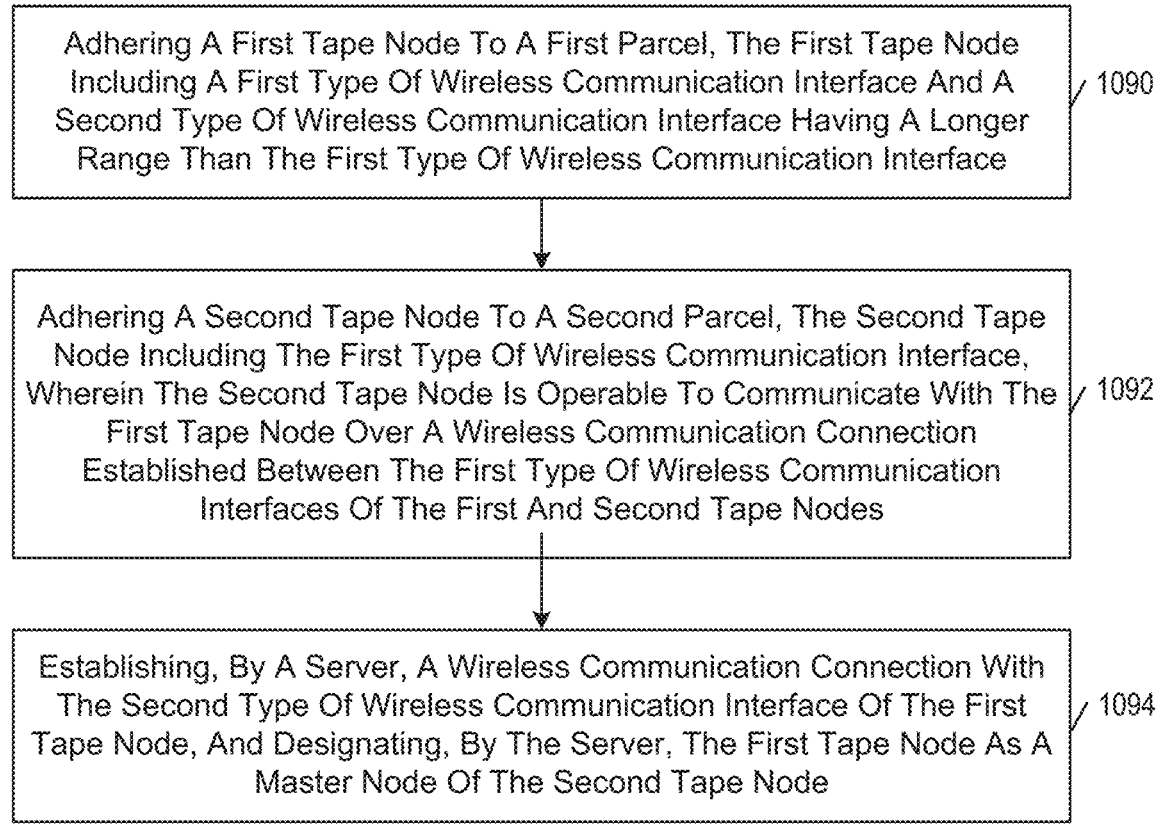
FIG. 10 shows one example method of creating a hierarchical communications network, in embodiments.

FIG. 10 shows an example method of creating a hierarchical communications network. In accordance with this method, a first tape node is adhered to a first parcel in a set of associated parcels, the first tape node including a first type of wireless communication interface and a second type of wireless communication interface having a longer range than the first type of wireless communication interface (FIG. 10, block 1090). A second tape node is adhered to a second parcel in the set, the second tape node including the first type of wireless communication interface, wherein the second tape node is operable to communicate with the first tape node over a wireless communication connection established between the first type of wireless communication interfaces of the first and second tape nodes (FIG. 10, block 1092). An application executing on a computer system (e.g., the one or more network service servers 904 of a network service 908) establishes a wireless communication connection with the second type of wireless communication interface of the first tape node, and the application transmits programmatic code executable by the first tape node to function as a master tape node with respect to the second tape node (FIG. 10, block 1094).

As used herein, the term "node" refers to both a tape node and a non-tape node unless the node is explicitly designated as a "tape node" or a "non-tape node." In some embodiments, a non-tape node may have the same or similar communication, sensing, processing and other functionalities and capabilities as the tape nodes described herein, except without being integrated into a tape platform. In some embodiments, non-tape nodes can interact seamlessly with tape nodes. Each node is assigned a respective unique identifier.

Embodiments of the present disclosure further describe a distributed software operating system that is implemented by distributed hardware nodes executing intelligent agent software to perform various tasks or algorithms. In some embodiments, the operating system distributes functionalities (e.g., performing analytics on data or statistics collected or generated by nodes) geographically across multiple intelligent agents that are bound to logistic items (e.g., parcels, containers, packages, boxes, pallets, a loading dock, a door, a light switch, a vehicle such as a delivery truck, a shipping facility, a port, a hub, etc.). In addition, the operating system dynamically allocates the hierarchical roles (e.g., master and slave roles) that nodes perform over time in order to improve system performance, such as optimizing battery life across nodes, improving responsiveness, and achieving overall objectives. In some embodiments, optimization is achieved using a simulation environment for optimizing key performance indicators (PKIs). In some embodiments, the nodes are programmed to operate individually or collectively as autonomous intelligent agents. In some embodiments, nodes are configured to communicate and coordinate actions and respond to events. In some embodiments, a node is characterized by its identity, its mission, and the services that it can provide to other nodes. A node's identity is defined by its capabilities (e.g., battery life, sensing capabilities, and communications interfaces). A node may be defined by the respective program code, instructions, or directives it receives from another node (e.g., a server or a master node) and the actions or tasks that it performs in accordance with that program code, instructions, or directives (e.g., sense temperature every hour and send temperature data to a master node to upload to a server). A node's services may be defined by the functions or tasks that it is permitted to perform for other nodes (e.g., retrieve temperature data from a peripheral node and send the received temperature data to the server). At least for certain tasks, once programmed and configured with their identities, missions, and services, nodes can communicate with one another and request services from and provide services to one another independently of the server. Thus, in accordance with the runtime operating system every agent knows its objectives (programmed). Every agent knows which capabilities/resources it needs to fulfill objective. Every agent communicates with every other node in proximity to see if it can offer the capability. Examples include communicate data to the server, authorize going to lower-power level, temperature reading, send an alert to local hub, send location data, triangulate location, any boxes in same group that already completed group objectives.

Nodes can be associated with logistic items. Examples of a logistic item includes, for example, a package, a box, pallet, a container, a truck or other conveyance, infrastructure such as a door, a conveyor belt, a light switch, a road, or any other thing that can be tracked, monitored, sensed, etc. or that can transmit data concerning its state or environment. In some examples, a server or a master node may associate the unique node identifiers with the logistic items.

Communication paths between tape and/or non-tape nodes may be represented by a graph of edges between the corresponding logistic items (e.g., a storage unit, truck, or hub). In some embodiments, each node in the graph has a unique identifier. A set of connected edges between nodes is represented by a sequence of the node identifiers that defines a communication path between a set of nodes.

Figure 11A:
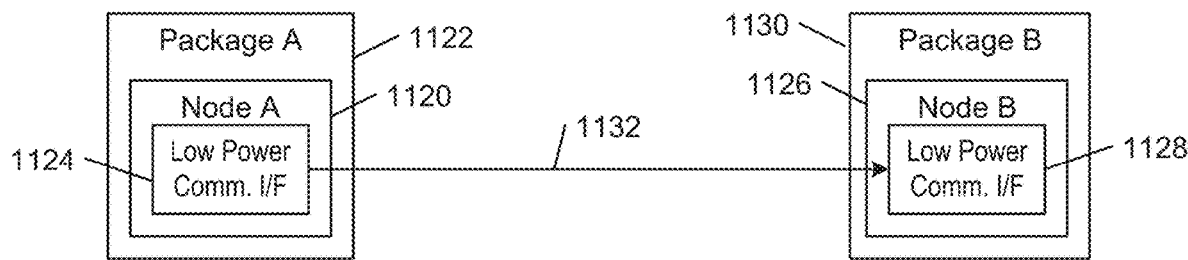
FIGS. 11A and 11B show example communication between tape nodes attached to packages, in embodiments.

Referring to FIG. 11A, a node 1120 (Node A) is associated with a package 1122 (Package A). In some embodiments, the node 1120 may be implemented as a tape node that is used to seal the package 1122 or it may be implemented as a label node that is used to label the package 1122; alternatively, the node 1120 may be implemented as a non-tape node that is inserted within the package 1122 or embedded in or otherwise attached to the interior or exterior of the package 1122. In the illustrated embodiment, the node 1120 includes a low power communications interface 1124 (e.g., a Bluetooth Low Energy communications interface). Another node 1126 (Node B), which is associated with another package 1130 (Package B), is similarly equipped with a compatible low power communications interface 1128 (e.g., a Bluetooth Low Energy communications interface).

In an example scenario, in accordance with the programmatic code stored in its memory, node 1126 (Node B) requires a connection to node 1120 (Node A) to perform a task that involves checking the battery life of Node A. Initially, Node B is unconnected to any other nodes. In accordance with the programmatic code stored in its memory, Node B periodically broadcasts advertising packets into the surrounding area. When the other node 1120 (Node A) is within range of Node B and is operating in a listening mode, Node A will extract the address of Node B and potentially other information (e.g., security information) from an advertising packet. If, according to its programmatic code, Node A determines that it is authorized to connect to Node B, Node A will attempt to pair with Node B. In this process, Node A and Node B determine each other's identities, capabilities, and services. For example, after successfully establishing a communication path 1132 with Node A (e.g., a Bluetooth Low Energy formatted communication path), Node B determines Node A's identity information (e.g., master node), Node A's capabilities include reporting its current battery life, and Node A's services include transmitting its current battery life to other nodes. In response to a request from Node B, Node A transmits an indication of its current battery life to Node B.

Figure 11B:
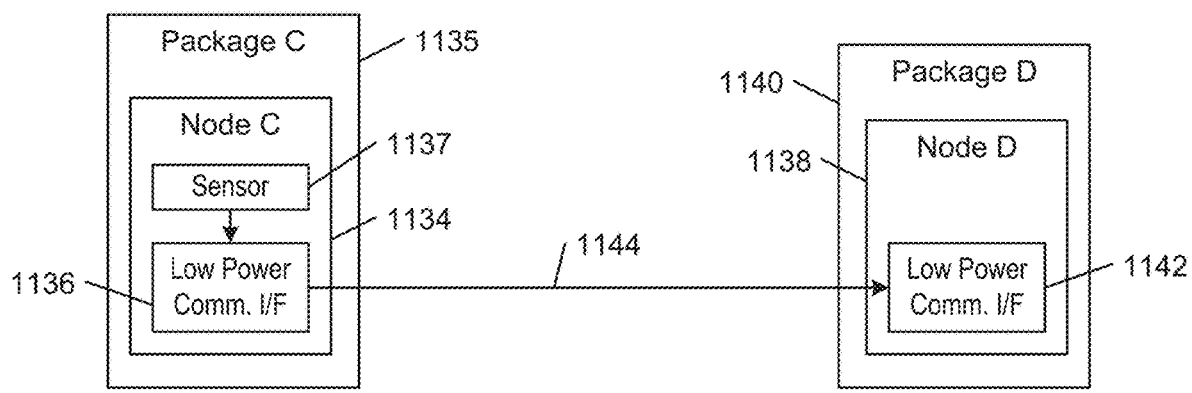

Referring to FIG. 11B, a node 1134 (Node C) is associated with a package 1135 (Package C). In the illustrated embodiment, the Node C includes a low power communications interface 1136 (e.g., a Bluetooth Low Energy communications interface), and a sensor 1137 (e.g., a temperature sensor). Another node 1138 (Node D), which is associated with another package 1140 (Package D), is similarly equipped with a compatible low power communications interface 1142 (e.g., a Bluetooth Low-Energy communications interface).

In an example scenario, in accordance with the programmatic code stored in its memory, Node D requires a connection to Node C to perform a task that involves checking the temperature in the vicinity of Node C. Initially, Node D is unconnected to any other nodes. In accordance with the programmatic code stored in its memory, Node D periodically broadcasts advertising packets in the surrounding area. When Node C is within range of Node D and is operating in a listening mode, Node C will extract the address of Node D and potentially other information (e.g., security information) from the advertising packet. If, according to its programmatic code, Node C determines that it is authorized to connect to Node D, Node C will attempt to pair with Node D. In this process, Node C and Node D determine each other's identities, capabilities, and services. For example, after successfully establishing a communication path 1144 with Node C (e.g., a Bluetooth Low Energy formatted communication path), Node D determines Node C's identity information (e.g., a peripheral node), Node C's capabilities include retrieving temperature data, and Node C's services include transmitting temperature data to other nodes. In response to a request from Node D, Node C transmits its measured and/or locally processed temperature data to Node D.

Figure 11C:
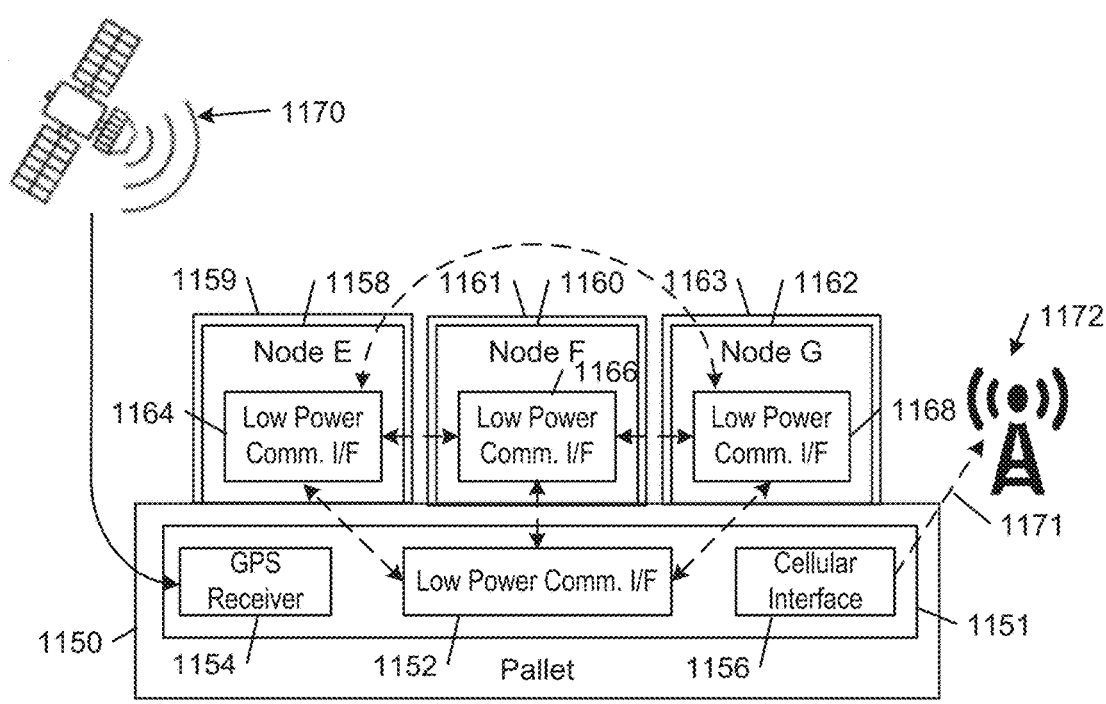
FIG. 11C shows example communication between a tape node attached to a pallet and tape nodes attached to packages on the pallet, in embodiments.

Referring to FIG. 11C, a pallet 1150 is associated with a master node 1151 that includes a low-power communications interface 1152, a GPS receiver 1154, and a cellular communications interface 1156. In some embodiments, the master node 1151 may be implemented as a tape node or a label node that is adhered to the pallet 1150. In other embodiments, the master node 1151 may be implemented as a non-tape node that is inserted within the body of the pallet 1150 or embedded in or otherwise attached to the interior or exterior of the pallet 1150.

The pallet 1150 provides a structure for grouping and containing packages 1159, 1161, 1163 each of which is associated with a respective peripheral node 1158, 1160, 1162 (Node E, Node F, and Node G). Each of the peripheral nodes 1158, 1160, 1162 includes a respective low power communications interface 1164, 1166, 1168 (e.g., Bluetooth Low Energy communications interface). In the illustrated embodiment, each of the nodes E, F, G, and the master node 1151 are connected to each of the other nodes over a respective low power communications path (shown by dashed lines).

In some embodiments, the packages 1159, 1161, 1163 are grouped together because they are related. For example, the packages 1159, 1161, 1163 may share the same shipping itinerary or a portion thereof. In an example scenario, the master pallet node 1151 scans for advertising packets that are broadcasted from the peripheral nodes 1158, 1160, 1162. In some examples, the peripheral nodes broadcast advertising packets during respective scheduled broadcast intervals. The master node 1151 can determine the presence of the packages 1159, 1161, 1163 in the vicinity of the pallet 1150 based on receipt of one or more advertising packets from each of the nodes E, F, and G. In some embodiments, in response to receipt of advertising packets broadcasted by the peripheral nodes 1158, 1160, 1162, the master node 1151 transmits respective requests to the server to associate the master node 1151 and the respective peripheral nodes 1158, 1160, 1162. In some examples, the master tape node requests authorization from the server to associate the master tape node and the peripheral tape nodes. If the corresponding packages 1159, 1161, 1163 are intended to be grouped together (e.g., they share the same itinerary or certain segments of the same itinerary), the server authorizes the master node 1151 to associate the peripheral nodes 1158, 1160, 1162 with one another as a grouped set of packages. In some embodiments, the server registers the master node and peripheral tape node identifiers with a group identifier. The server also may associate each node ID with a respective physical label ID that is affixed to the respective package.

In some embodiments, after an initial set of packages is assigned to a multi package group, the master node 1151 may identify another package arrives in the vicinity of the multi-package group. The master node may request authorization from the server to associate the other package with the existing multi-package group. If the server determines that the other package is intended to ship with the multi-package group, the server instructs the master node to merge one or more other packages with currently grouped set of packages. After all packages are grouped together, the server authorizes the multi-package group to ship. In some embodiments, this process may involve releasing the multi-package group from a containment area (e.g., customs holding area) in a shipment facility.

In some embodiments, the peripheral nodes 1158, 1160, 1162 include environmental sensors for obtaining information regarding environmental conditions in the vicinity of the associated packages 1159, 1161, 1163. Examples of such environmental sensors include temperature sensors, humidity sensors, acceleration sensors, vibration sensors, shock sensors, pressure sensors, altitude sensors, light sensors, and orientation sensors.

In the illustrated embodiment, the master node 1151 can determine its own location based on geolocation data transmitted by a satellite-based radio navigation system 1170 (e.g., GPS, GLONASS, and NAVSTAR) and received by the GPS receiver 1154 component of the master node 1151. In an alternative embodiment, the location of the master pallet node 1151 can be determined using cellular based navigation techniques that use mobile communication technologies (e.g., GSM, GPRS, CDMA, etc.) to implement one or more cell-based localization techniques. After the master node 1151 has ascertained its location, the distance of each of the packages 1159, 1161, 1163 from the master node 1151 can be estimated based on the average signal strength of the advertising packets that the master node 1151 receives from the respective peripheral node. The master node 1151 can then transmit its own location and the locations of the package nodes E, F, and G to a server over a cellular interface connection with a cellular network 1172. Other methods of determining the distance of each of the packages 1159, 1161, 1163 from the master node 1151, such as Received Signal-Strength Index (RSSI) based indoor localization techniques, also may be used.

In some embodiments, after determining its own location and the locations of the peripheral nodes, the master node 1151 reports the location data and the collected and optionally processed (e.g., either by the peripheral nodes peripheral nodes 1158, 1160, 1162 or the master node 1151) sensor data to a server over a cellular communication path 1171 on a cellular network 1172.

In some examples, nodes are able to autonomously detect logistics execution errors if packages that are supposed to travel together no longer travel together and raise an alert. For example, a node (e.g., the master node 1151 or one of the peripheral nodes 1158, 1160, 1162) alerts the server when the node determines that a particular package 1159 is being or has already been improperly separated from the group of packages. The node may determine that there has been an improper separation of the particular package 1159 in a variety of ways. For example, the associated peripheral node 1158 that is bound to the particular package 1159 may include an accelerometer that generates a signal in response to movement of the package from the pallet. In accordance with its intelligent agent program code, the associated peripheral node 1158 determines that the master node 1151 has not disassociated the particular package 1159 from the group and therefore broadcasts advertising packets to the master node, which causes the master node 1151 to monitor the average signal strength of the advertising packets and, if the master node 1151 determines that the signal strength is decreasing over time, the master node 1151 will issue an alert either locally (e.g., through a speaker component of the master node 1151) or to the server.

Figure 12:
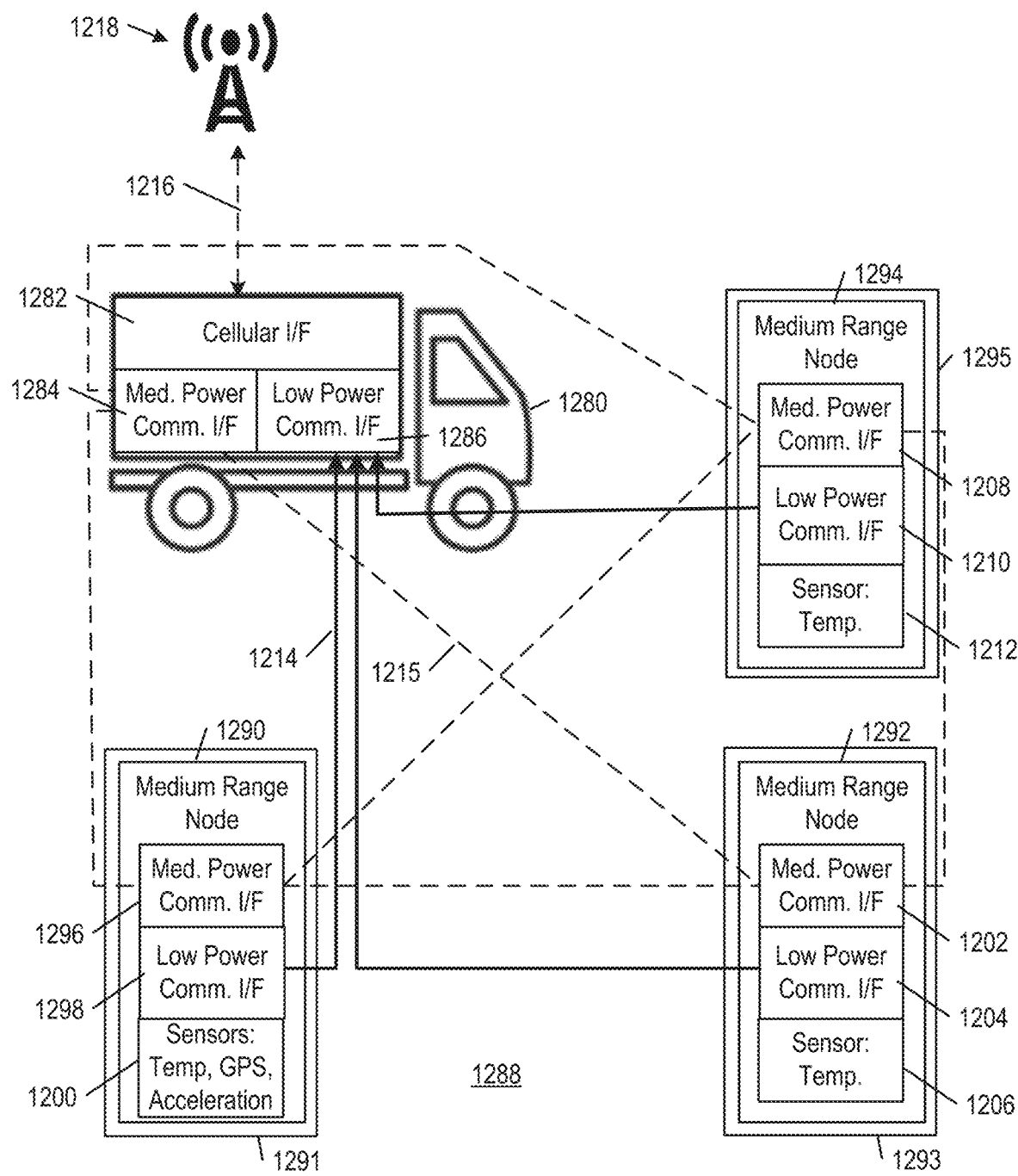
FIG. 12 shows a truck configured as a mobile node, or mobile hub, with a cellular communications interface, a medium-power communications interface, and a low power communications interface, in embodiments.

Referring to FIG. 12, a truck 1280 is configured as a mobile node or mobile hub that includes a cellular communications interface 1282, a medium-power communications interface 1284, and a low power communications interface 1286. The communications interfaces 1280-1286 may be implemented on one or more tape and non-tape nodes. In an illustrative scenario, the truck 1280 visits a logistic storage facility, such as a warehouse 1288, to wirelessly obtain temperature data generated by temperature sensors in the medium range nodes 1290, 1292, 1294. The warehouse 1288 contains nodes 1290, 1292, and 1294 that are associated with respective logistic containers 1291, 1293, 1295. In the illustrated embodiment, each node 1290-1294 is a medium range node that includes a respective medium power communications interface 1296, 1202, 1208, a respective low power communications interface 1298, 1204, 1210 and one or more respective sensors 1200, 1206, 1212. In the illustrated embodiment, each of the package nodes 1290, 1292, 1294 and the truck 1280 is connected to each of the other ones of the package nodes through a respective medium power communications path (shown by dashed lines). In some embodiments, the medium power communications paths are LoRa formatted communication paths.

In some embodiments, the communications interfaces 1284 and 1286 (e.g., a LoRa communications interface and a Bluetooth Low Energy communications interface) on the node on the truck 1280 is programmed to broadcast advertisement packets to establish connections with other network nodes within range of the truck node. A warehouse 1288 includes medium range nodes 1290, 1292, 1294 that are associated with respective logistic containers 1291, 1293, 1295 (e.g., packages, boxes, pallets, and the like). When the truck node's low power interface 1286 is within range of any of the medium range nodes 1290, 1292, 1294 and one or more of the medium range nodes is operating in a listening mode, the medium range node will extract the address of truck node and potentially other information (e.g., security information) from the advertising packet. If, according to its programmatic code, the truck node determines that it is authorized to connect to one of the medium range nodes 1290, 1292, 1294, the truck node will attempt to pair with the medium range node. In this process, the truck node and the medium range node determine each other's identities, capabilities, and services. For example, after successfully establishing a communication path with the truck node (e.g., a Bluetooth Low Energy formatted communication path 1214 or a LoRa formatted communication path 1217), the truck node determines the identity information for the medium range node 1290 (e.g., a peripheral node), the medium range node's capabilities include retrieving temperature data, and the medium range node's services include transmitting temperature data to other nodes. Depending of the size of the warehouse 1288, the truck 1280 initially may communicate with the nodes 1290, 1292, 1294 using a low power communications interface (e.g., Bluetooth Low Energy interface). If any of the anticipated nodes fails to respond to repeated broadcasts of advertising packets by the truck 1280, the truck 1280 will try to communicate with the non-responsive nodes using a medium power communications interface (e.g., LoRa interface). In response to a request from the medium-power communication interface 1284, the medium range node 1290 transmits an indication of its measured temperature data to the truck node. The truck node repeats the process for each of the other medium range nodes 1292, 1294 that generate temperature measurement data in the warehouse 1288. The truck node reports the collected (and optionally processed, either by the medium range nodes 1290, 1292, 1294 or the truck node) temperature data to a server over a cellular communication path 1216 with a cellular network 1218.

Figure 13:
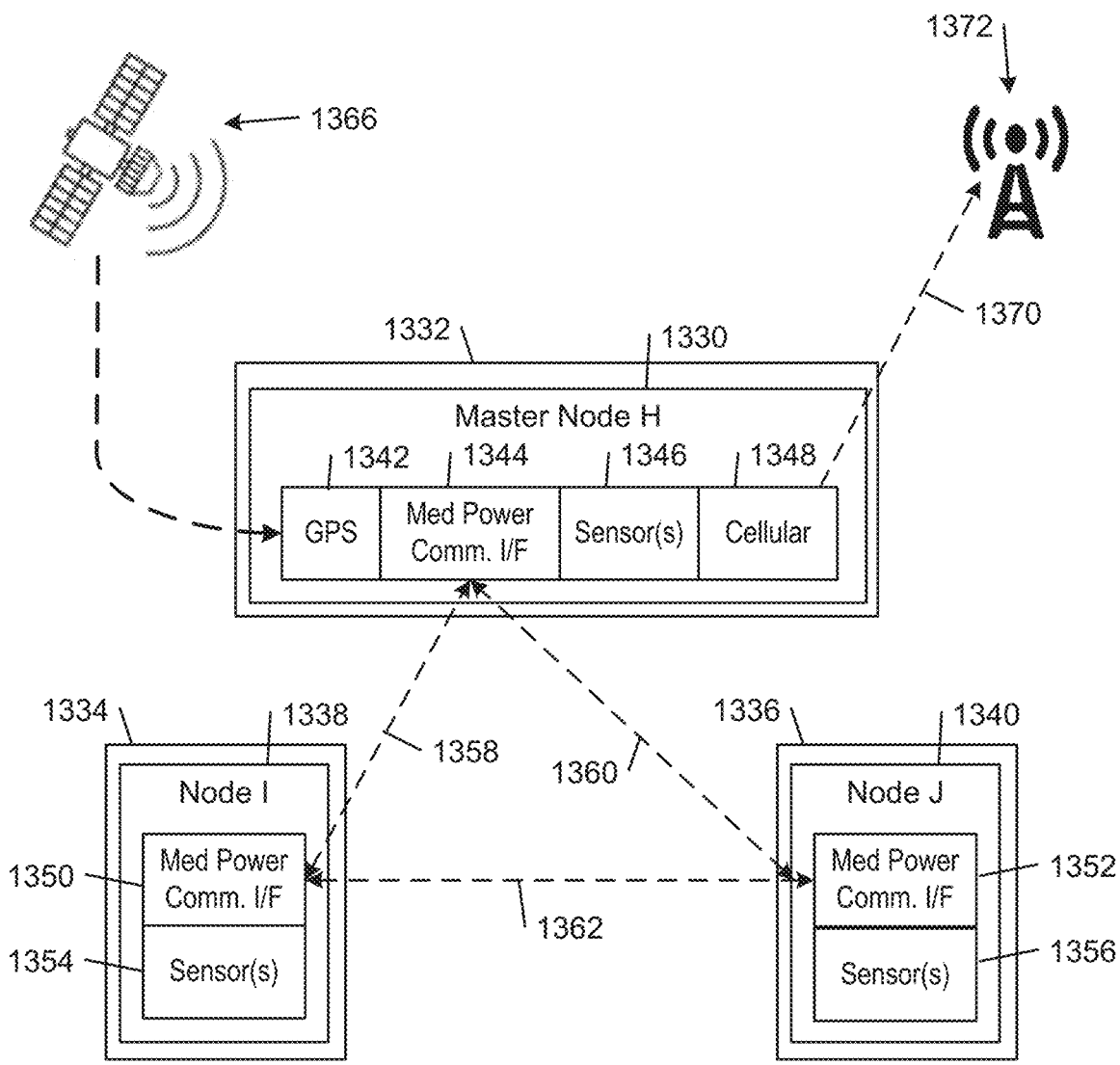
FIG. 13 shows a master node associated with a logistic item that is grouped together with other logistic items associated with peripheral nodes, in embodiments.

Referring to FIG. 13, a master node 1330 is associated with a logistic item 1332 (e.g., a package) and grouped together with other logistic items 1334, 1336 (e.g., packages) that are associated with respective peripheral nodes 1338, 1340. The master node 1330 includes a GPS receiver 1342, a medium power communications interface 1344, one or more sensors 1346, and a cellular communications interface 1348. Each of the peripheral nodes 1338, 1340 includes a respective medium power communications interface 1350, 1352 and one or more respective sensors 1354, 1356. In the illustrated embodiment, the peripheral and master nodes are connected to one another other over respective pairwise communications paths (shown by dashed lines). In some embodiments, the nodes 1330, 1338, 1340 communicate through respective LoRa communications interfaces over LoRa formatted communications paths 1358, 1360, 1362.

In the illustrated embodiment, the master and peripheral nodes 1330, 1338, 1340 include environmental sensors for obtaining information regarding environmental conditions in the vicinity of the associated logistic items 1332, 1334, 1336. Examples of such environmental sensors include temperature sensors, humidity sensors, acceleration sensors, vibration sensors, shock sensors, pressure sensors, altitude sensors, light sensors, and orientation sensors.

In accordance with the programmatic code stored in its memory, the master node 1330 periodically broadcasts advertising packets in the surrounding area. When the peripheral nodes 1338, 1340 are within range of master node 1330, and are operating in a listening mode, the peripheral nodes 1338, 1340 will extract the address of master node 1330 and potentially other information (e.g., security information) from the advertising packets. If, according to their respective programmatic code, the peripheral nodes 1338, 1340 determine that they are authorized to connect to the master node 1330, the peripheral nodes 1338, 1340 will attempt to pair with the master node 1330. In this process, the peripheral nodes 1338, 1340 and the master node 1330 determine each other's identities, capabilities, and services. For example, after successfully establishing a respective communication path 1358, 1360 with each of the peripheral nodes 1338, 1340 (e.g., a LoRa formatted communication path), the master node 1330 determines certain information about the peripheral nodes 1338, 1340, such as their identity information (e.g., peripheral nodes), their capabilities (e.g., measuring temperature data), and their services include transmitting temperature data to other nodes.

After establishing LoRa formatted communications paths 1358, 1360 with the peripheral nodes 1338, 1340, the master node 1330 transmits requests for the peripheral nodes 1338, 1340 to transmit their measured and/or locally processed temperature data to the master node 1330.

In the illustrated embodiment, the master node 1330 can determine its own location based on geolocation data transmitted by a satellite-based radio navigation system 1366 (e.g., GPS, GLONASS, and NAVSTAR) and received by the GPS receiver 1342 component of the master node 1330. In an alternative embodiment, the location of the master node 1330 can be determined using cellular based navigation techniques that use mobile communication technologies (e.g., GSM, GPRS, CDMA, etc.) to implement one or more cell-based localization techniques. After the master node 1330 has ascertained its location, the distance of each of the logistic items 1334, 1336 from the master node 1330 can be estimated based on the average signal strength of the advertising packets that the master node 1330 receives from the respective peripheral node. The master node 1330 can then transmit its own location and the locations of the package nodes H, J, and I to a server over a cellular interface connection with a cellular network 1372. Other methods of determining the distance of each of the logistic items 1334, 1336 from the master node 1330, such as Received Signal-Strength Index (RSSI) based indoor localization techniques, also may be used.

In some embodiments, after determining its own location and the locations of the peripheral nodes, the master node 1330 reports the location data, the collected and optionally processed (e.g., either by the peripheral nodes peripheral nodes 1338, 1340 or the master node 1330) sensor data to a server over a cellular communication path 1370 on a cellular network 1372.

Solar-Powered Tape Node

FIGS. 14A and 14B show an embodiment of a tape node 1401 with a solar panel 1420 integrated into the tape node. Tape node 1401 may represent a segment of an adhesive tape platform, such as segment 113 of FIG. 1. Tape node 1401 may include wireless transducing circuit 410 of FIG. 4. In some embodiments, tape node 1401 includes a long-range communication ability as shown in long range tape node 980 of FIG. 9, and thus may include one or more of cellular communications, satellite communications, LoRa, and other long-range wireless communication.

FIG. 14A shows a non-adhesive side of tape node 1401. The tape node 1401 may include a barcode 1410, an instruction 1414, and a cutline 1412 printed or otherwise displayed on a cover layer 1490 (e.g., similar to cover layer 690 of FIG. 6A) forming the non-adhesive side of the tape node 1401. The tape node 1401 includes the solar panel 1420 positioned behind an aperture 1430 formed by the cover layer 1490 and with a light-receiving surface facing outward through the aperture 1430 in a direction corresponding to the non-adhesive side of the tape node 1401.

FIG. 14B is a schematic diagram illustrating an adhesive side of the tape node 1401 that is opposite the adhesive side shown in FIG. 14A. A substrate 644 (see FIG. 6A) of the tape node 1401 includes adhesive layer 646 for adhering the tape node 1401 to an asset (e.g., an object or person of interest). For example, the tape node 1401 may be adhered to an asset for tracking and/or monitoring purposes. When the tape node 1401 is adhered to an exterior surface of the asset such that the solar panel 1420 is exposed to light, a battery of the tape node 1401 may be charged. In this way, the battery of the tape node 1401 may be charged while being operative to track the asset.

Figure 15:
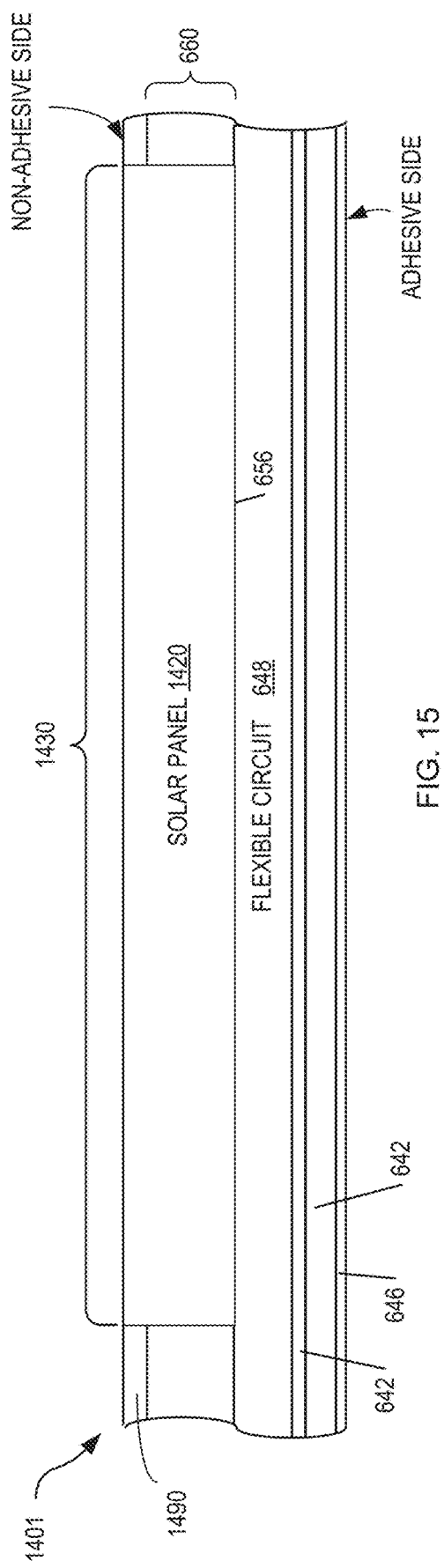
FIG. 15 is a schematic diagram illustrating a cross-section A-A through the tape node FIGS. 14A and 14B, in embodiments.

FIG. 15 is a schematic diagram illustrating a cross-section A-A through the tape node 1101 of FIGS. 14A and 14B, according to some embodiments. Similar to the tape node 640 of FIG. 6A, the tape node 1401 includes the adhesive layer 642, the flexible substrate 644, the adhesive layer 646, the flexible circuit 648, the device layer 660, and the flexible cover 1490 (e.g., similar to flexible cover 690), where the solar panel 1420 represents the transducer 656 of FIG. 6A. The tape node 1401 may also include other components not shown in FIG. 15 without departing from the scope hereof. For example, the device layer 660 of tape node 1401 may include the components of the device layer 660 shown in FIGS. 6A-6C, in certain embodiments. The aperture 1430 in the cover layer 1490 exposes a surface of the solar panel 1420 for receiving light. Light incident on the surface of the solar panel 1420 generates charge in the solar panel 1420 which is used to recharge one or more batteries of the tape node 1401. The solar panel 1420 may be connected to one or more components of the tape node 1401 via the flexible circuit 648.

In some embodiments, the adhesive layer 646 is a window film (e.g., a polyester film construction generally made of Polyethylene Teraphthalate (PET)) that affixes to a glass surface without the use of an adhesive. In further embodiments, the adhesive layer 646 is a static cling window film that affixes to a glass surface due to cohesive forces between the static cling window film and the glass surface. For example, the static cling window film may include a vinyl material (e.g., polyvinyl chloride (PVC)). In some embodiments, at least a portion of the substrate 642 includes the window film. In some embodiments, the window film and/or static cling window film is partially or completely transparent.

In certain embodiments, the solar panel 1420 is implemented by a conventional solar panel that is less flexible than other portions of the tape node 1401. For example, the solar panel 1420 may be less flexible than the substrate 642. This may result in the tape node 1401 having a hybrid structure, in which the area overlapping the solar panel 1420 has reduced flexibility as compared to other areas of the tape node 1401.

In other embodiments, the solar panel 1420 is implemented by a flexible solar panel that is as, or more, flexible than other portions of the tape node 1401. For example, the solar panel may have the same flexibility, or be more flexible, than the substrate 642. In other examples, the solar panel 1420 may have the same flexibility, or be more flexible, than the flexible circuit 648. In this embodiment, the tape node 1401 may have a uniform flexibility throughout its entire area. In certain embodiments, the solar panel 1420 is more flexible in a first bending direction as compared to its flexibility in a second bending direction. For example, with reference to FIG. 14A, the solar panel 1420 has first flexibility when bending around a first axis 1450 (e.g., when left and right ends are moved around first axis 1450) that is greater than the flexibility of the solar panel 1420 when bending around a second axis 1452 perpendicular to the first axis 1450 (e.g., when top and bottom sides are moved around second axis 1452).

In some embodiments, the tape node 1401 includes the solar panel 1420 as the only power source and does not include a battery or any other energy harvesting component.

In other embodiments, the tape node 1401 includes at least one additional power source (e.g., one or more of a battery, and another energy harvesting component). In some embodiments, energy generated by the solar panel 1420 is stored for future use by charging a battery of the tape node 1401.

The tape node 1401 may have a more rigid and/or structurally durable substrate and/or cover layer such that the tape node 1401 is substantially weatherproof and/or water resistant (e.g., having an IPX7 water resistance rating), according to some embodiments. In certain embodiments, the thickness of the tape node 1401 is below a threshold thickness (e.g., less than 0.5 inches thick). Accordingly, the tape node 1401 is suitable for deployment on a roof of a building or vehicle.

FIG. 16 shows the tape node 1401 of FIGS. 14A and 14B adhered to an exterior surface of a vehicle 1610, in one example deployment. The tape node 1401 may be used to track the locations and/or environmental data of one or more assets carried by the vehicle 1610. In one example of operation, the tape node 1401 is associated with the vehicle 1610 and tracks the location of the vehicle 1610. In another example of operation, the tape node 1401 communicates with other tape nodes located on an interior of the vehicle 1610 (e.g., within the cargo space) that are associated with one or more assets being transported by the vehicle 1610. In the example of FIG. 16, the tape node 1401 is adhered to the roof of the vehicle 1610 but may be adhered to other parts of the vehicle 1610. For example, the tape node 1401 may be adhered to a side wall of the vehicle 1610, a hood of the vehicle 1610, to an exterior surface of a windshield or window of the vehicle 1610, to a rim or hubcap of the vehicle 1610, or to some other part of the vehicle 1610

Regulations prevent operators and users from attaching large rigid electronic devices and/or boxes to an outside surface of a vehicles (e.g., cars, trucks, aircraft, etc.) for safety reasons. Further, aerodynamic requirements may also prevent obtrusive devices from being attached to the outside surface of the vehicle. Advantageously, the size and form factor of the tape node 1401 minimizes risk of damage from accidental detachment from the vehicle, and its low profile makes it unobtrusive and reduces aesthetically noticeability. A further benefit is that tape node 1401 does not require expensive installation or modification of the vehicle, since it adheres to most clean surfaces.

In the example of FIG. 16, where the tape node 1401 is adhered to the roof of the vehicle 1610, the tape node 1401 is exposed to sunlight while the vehicle is transporting assets during the daytime. Accordingly, the tape node 1401 operates to track the vehicle 1610 (and/or the assets carried by the vehicle) while also harvesting energy using the solar panel 1420 and may thereby also charge its battery. Since the solar panel 1420 is exposed on the non-adhesive side of the tape node 1101, the solar panel 1120 may receive light while the vehicle 1610 is transporting assets. Advantageously, the adhesive tape form factor of the tape node 1401 allows it to be easily installed on, and removed from (e.g., for replacement), any surface of the vehicle 1610, and may be positioned in an optimal location for harvesting solar energy. For example, the tape node 1401 may easily be placed on a side wall of the vehicle 1610, instead of on the roof, where such location provides more solar energy during a planned trip that the vehicle 1610 intends to make. The tape node 1401 may be repositioned from a first location (e.g., on the roof of the vehicle 1610) to a second location (e.g., a rear door of the vehicle 1610) to benefit from an expected orientation of the vehicle 1520 relative to the sun and/or other light sources.

FIGS. 17A and 17B show another example tape node 1701 with an integrated a solar panel 1720, in embodiments. Tape node 1701 may represent a segment of an adhesive tape platform, such as segment 113 of FIG. 1. Tape node 1701 may include wireless transducing circuit 410 of FIG. 4. In some embodiments, tape node 1701 includes a long-range communication ability as shown in long range tape node 980 of FIG. 9, and thus may include one or more of cellular communications, satellite communications, LoRa, and other long-range wireless communication.

FIG. 17A shows a non-adhesive side of the tape node 1701. The tape node 1701 may include a barcode 1710, an instruction 1714, and a cutline 1712 printed or otherwise displayed on a cover layer 690 (see FIG. 6A) forming the non-adhesive side of the tape node 1701. The tape node 1701 differs from the tape node 1401 of FIGS. 14A, 14B, 15, and 16, in that an included solar panel 1720 is exposed on the adhesive side of the tape node 1701 rather than the non-adhesive side. The tape node 1701 may include a barcode 1710, an instruction 1714, and a cutline 1712 printed or otherwise displayed on the cover layer 690 (similar to FIG. 6A) forming the non-adhesive side of the tape node 1701.

FIG. 17B shows an adhesive side of the tape node 1701 that is opposite the non-adhesive side shown in FIG. 17A. The tape node 1701 includes a substrate 1744 (e.g., similar to substrate 644 of FIG. 6A) with an adhesive layer 1846 (See FIGS. 18A and 18B) for adhering the tape node 1701 to an asset (e.g., an object or person of interest). Advantageously, the tape node 1701 may be adhered to an asset for tracking and/or monitoring purposes. The tape node 1701, includes the solar panel 1720 positioned at an aperture 1730 formed by the substrate 1744 such that the solar panel 1720 has a light-receiving surface that faces outward from the adhesive side of the tape node 1701.

Advantageously, the substrate 1744 forms a frame for the solar panel 1720 and facilitates adhering the tape node 1701 with the solar panel 1720 to an interior surface of a transparent component (e.g., a window) of an asset (e.g., a vehicle). Light passing through the transparent component from outside the asset is incident on the solar panel 1320 (e.g., the adhesive side of the tape node 1701), allowing the solar panel 1720 to generate energy to charge one or more batteries of the tape node 1701. In this way, the battery of the tape node 1701 may be charged while the tape node 1701 is used to track the asset.

FIG. 18A shows a first example cross-section B-B of the tape node 1701 of FIGS. 17A and 17B showing further example detail. The tape node 1701 includes an adhesive layer 1842, the flexible substrate 1744, an adhesive layer 1846, the flexible circuit 648, and the device layer 690, which are similar to those shown in FIGS. 6A-6C and 15. The tape node 1701 may include other components not shown in FIGS. 17A, 17B, and 18. For example, the device layer 690 of tape node 1701 may include one or more of the components of the device layer 690 shown in FIGS. 6A-6C, in certain embodiments. The aperture 1730 in the substrate 1744 exposes a light-receiving surface 1802 of the solar panel 1720 to light. The solar panel 1701 may connect electrically to one or more components of the tape node 1701 via the flexible circuit 648. As shown in FIG. 18A, the adhesive layers 1842 and 1846 also for apertures that are similarly sized and substantially aligned with the aperture 1730 in the flexible substrate 1744, and around the solar panel 1720.

Since the light-receiving surface of the solar panel 1720 is exposed on the adhesive side of the tape node 1701, the solar panel 1720 may receive light when the tape node 1701 is adhered to a first side of a transparent surface (e.g., a transparent object) having a light source at the other side. For example, when the tape node 1301 is adhered to a window of a vehicle or building, the solar panel 1720 receives light passing through the window, as discussed in further detail below with respect to FIG. 19.

FIG. 18B shows the cross-section B-B of the tape node 1701 of FIGS. 17A and 17B showing further example detail in a second embodiment. In the embodiment of FIG. 18A, adhesive layer 1842 forms an aperture substantially aligned with the aperture 1730 in the flexible substrate 1744 and around the solar panel 1720; however, adhesive layer 1846 does not form an aperture, but instead covers the outward facing surface of the solar panel 1720. In this embodiment, the adhesive layer 1846 is optically transparent and does not prevent light from reaching the light-receiving surface 1802 of the solar panel 1720.

In certain embodiments, the substrate 1744 and/or adhesive layer 1842 is molded and/or deposited as a frame that forms the aperture 1730 within a threshold tolerance of a size of the solar panel 1720.

In certain embodiments, the aperture 1730 has a transparent cover (not shown) to protect the solar panel 1720 from dust and/or physical damage while simultaneously allowing light to strike the solar panel 1720. For example, the cover may be one or more of a transparent plastic material, a transparent polymer material, a transparent vinyl material, or some other material. In another example, the cover is a mesh material that at least partially transparent. In another example, the cover is a material that is perforated to allow light to strike the solar panel 1720.

In certain embodiments, the solar panel 1720 is implemented by a conventional solar panel that is less flexible than other portions of the tape node 1701. For example, the solar panel 1720 may be less flexible than the substrate 1744. This may result in the tape node 1701 having a hybrid structure, in which the area overlapping the solar panel 120 has reduced flexibility as compared to other areas of the tape node 1701.

In other embodiments, the solar panel 1720 is implemented by a flexible solar panel that is as, or more, flexible than other portions of the tape node 1701. For example, the solar panel may have the same flexibility, or be more flexible, than the substrate 1744. In other examples, the solar panel 1720 may have the same flexibility, or be more flexible, than the flexible circuit 648. In this embodiment, the tape node 1701 may have a uniform flexibility throughout its entire area. In certain embodiments, the solar panel 1720 is more flexible in a first bending direction as compared to its flexibility in a second bending direction. For example, with reference to FIG. 17A, the solar panel 1720 has first flexibility when bending around a first axis 1750 (e.g., when left and right ends are moved around first axis 1750) that is greater than the flexibility of the solar panel 1720 when bending around a second axis 1752 perpendicular to the first axis 1750 (e.g., when top and bottom sides are moved around second axis 1752).

In some embodiments, the tape node 1701 is manufactured using a full molding process. In some embodiments, the tape node 1701 is manufactured using a lamination process.

FIG. 19 shows an example of the tape node 1701 of FIGS. 17A, 17B, 18A, and 18B, adhered to an interior surface of a window 1912 of a cabin of a vehicle 1910. Accordingly, the solar panel 1720 may generate solar power when receiving light (e.g., sunlight) through the window 1912, since the solar panel 1720 faces the window 1912 and towards the exterior of the vehicle 1910

In this embodiment, since the tape node 1701 is configured to mount to an interior surface of the vehicle 1910, as compared to tape node 1401, which attaches to an exterior surface of vehicle 1610, one or more other components of the tape node 1701 may have, relative to the vehicle 1910, a different orientation, as compared to orientation of the components of the tape node 1401 of FIGS. 14A, 14B and 15, relative to the vehicle 1610. That is, certain components of tape node 1701 are oriented in an inward direction towards the interior of the vehicle 1910 when the tape node 1701 is adhered to the interior of the window 1912. Accordingly, one or more antennas or wireless communication interfaces (e.g., wireless communication interfaces 652, 672', and 682" of FIGS. 6A-6C) of the tape node 1701 are directed inwards towards the interior of the vehicle 1910. Advantageously, this improves the ability of the tape node 1701 to wirelessly communicate with other tape nodes, devices, gateway nodes, or other members of the network communication environment (e.g., network communication environment 800 of FIG. 8) that are located inside the vehicle 1910. Such orientation allows the tape node 1701 to receive stronger wireless signals from these other tape nodes and may allow the tape node 1701 to reduce the strength of signals to these other tape nodes, thereby saving power.

In certain embodiments, where the tape node 1401 or 1701 includes both the low-power communications-interface 652 and one or both of the medium-power communications-interface 672' and the high-power communications-interface 682", the relative orientation of these components may be selected to reflect the intended location of the tape node 1401 or 170. For example, since the tape node 1401 may attach to an external surface of a vehicle, the low-power communications-interface 652 may have an inverse orientation compared to the orientation of the medium-power communications-interface 672' and/or the high-power communications-interface 682". Similarly, since the tape node 1701 may attach to an interior surface of a vehicle, the medium-power communications-interface 672' and/or the high-power communications-interface 682" may have an inverse orientation compared to the orientation of the low-power communications-interface 652. For example, for both tape node 1401 mounted to the exterior of vehicle 1610 and tape node 1701 mounted to the interior of vehicle 1910, the medium-power communications-interface 672' (e.g., for cellular communication) and the high-power communications-interface 682" (e.g., for satellite communication) may face externally, and the low-power communications-interface 652 (e.g., for Bluetooth communication) may face the interior of the vehicle.

In certain embodiments, the solar-powered tape node (e.g., tape node 1401, 1701, and 2101) includes multiple solar panels (e.g., 1420, 1720, 2120) for use where the external surface or the window is sufficiently large. For example, the tape node may have an array (e.g., 4×4 or 16×16) of solar panels in a single tape form factor. The size of the tape node may increase, as compared to the solar-powered tape node with a single solar panel, to accommodate the array of solar panels.

In certain embodiments, for use where flexibility is not required (e.g., where the surface of the vehicle or the window is flat), the solar-powered tape node may be substantially rigid. For example, the rigid tape node may have the same form factor as the flexible tape nodes (e.g., thin rectangular shape), but may have substantially rigid components, and therefore be substantially rigid overall.

In certain embodiments, the solar-powered tape node may attach to the supporting structure (e.g., external surface of a vehicle and or window of a vehicle) using one or more of adhesive, hardware, and suction cups.

In some embodiments, the tape nodes 1401, 1701, may be recharged after use tracking an asset by exposing their solar panels to light during a recycling or renovating phase. For example, a plurality of tape nodes, each with a solar panel, may be aggregated at a renovation facility, such as when the tape nodes are collected after use. Where the tape nodes 1401 and/or 1701 are deployed in environments without sufficient light exposure to recharge their batteries during use, the tape node may be collected when its battery is near depletion and taken to a renovation facility where it is exposed to light to recharge the battery, instead of recharging the battery in the field. In one example, a tape node is shipped to the renovation facility when the network communication environment 800 (see FIG. 8) detects that a charge level of the tape node's battery is below a threshold value (e.g., 30% of full capacity). In certain embodiments, the threshold value is calculated dynamically based on the task assigned to the tape node. For example, a tape node assigned to monitor vibration may uses 5% of its battery during a 24-hour period and would be shipped to the renovation facility when its battery level is below 10%, thereby preventing any downtime caused by battery depletion.

Figure 20:
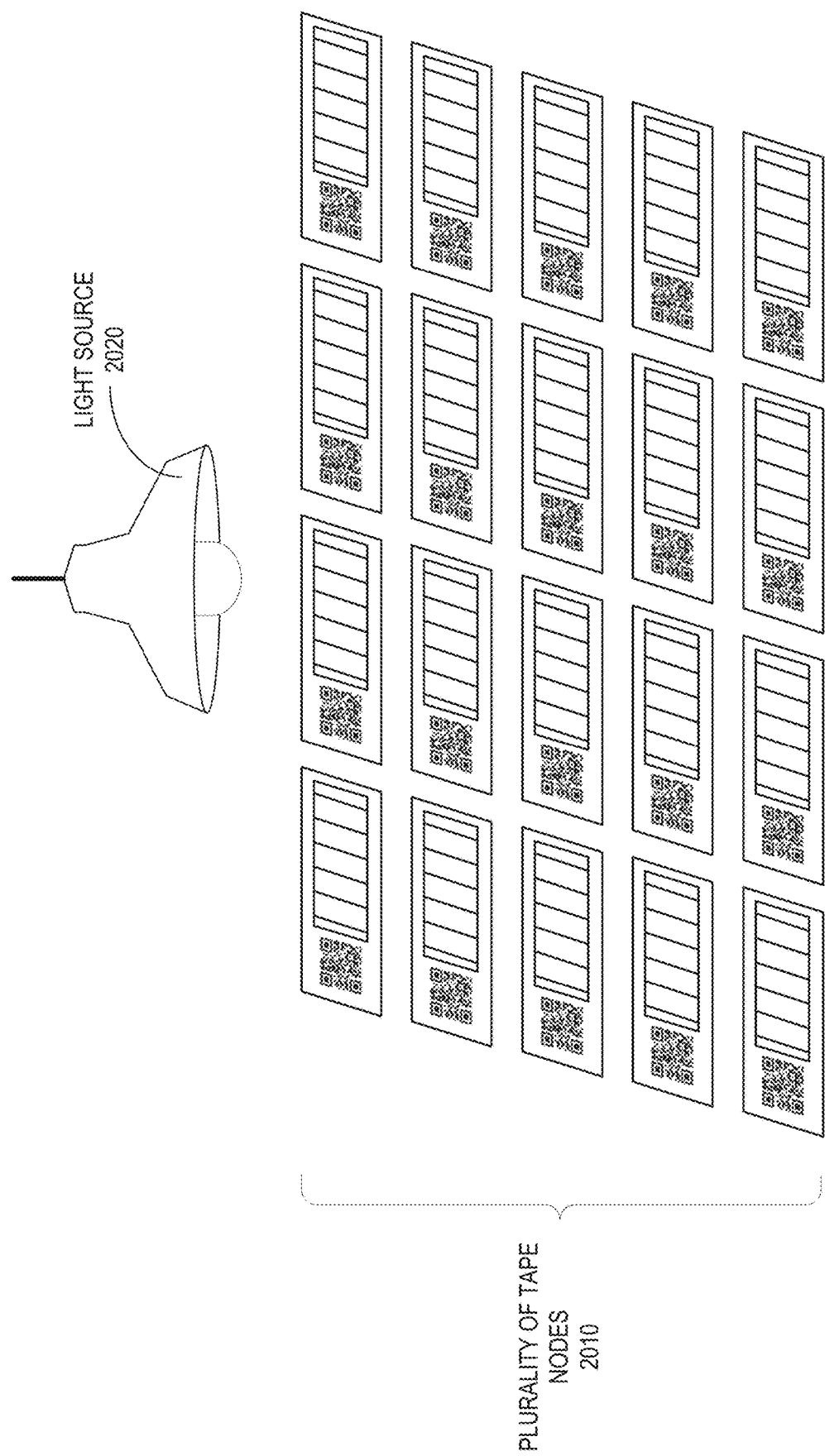
FIG. 20 is a schematic showing one scenario where a plurality of tape nodes are arranged with their solar panels facing a light source to affect recharging of their batteries from the light source, in embodiments.

FIG. 20 is a schematic showing one scenario where a plurality of tape nodes 1510 (e.g., tape nodes 1401 and/or tape nodes 1701) are arranged with their solar panels facing a light source 2020 to affect recharging of their batteries from the light source 1520. The light source 2020 may be an artificial light source (e.g., one or more of at least one light bulb, at least one LED, a solar simulator, a laser light source, and/or some other artificial light source). The light source 2020 may have an emission spectrum of light that corresponds to the absorption spectrum of the solar panels in the plurality of tape nodes 2010. For example, the light source 2020 may have a peak emission wavelength that corresponds to a peak absorption wavelength of the solar panels. In other embodiments, the light source 2020 is the sun.

Figure 21:
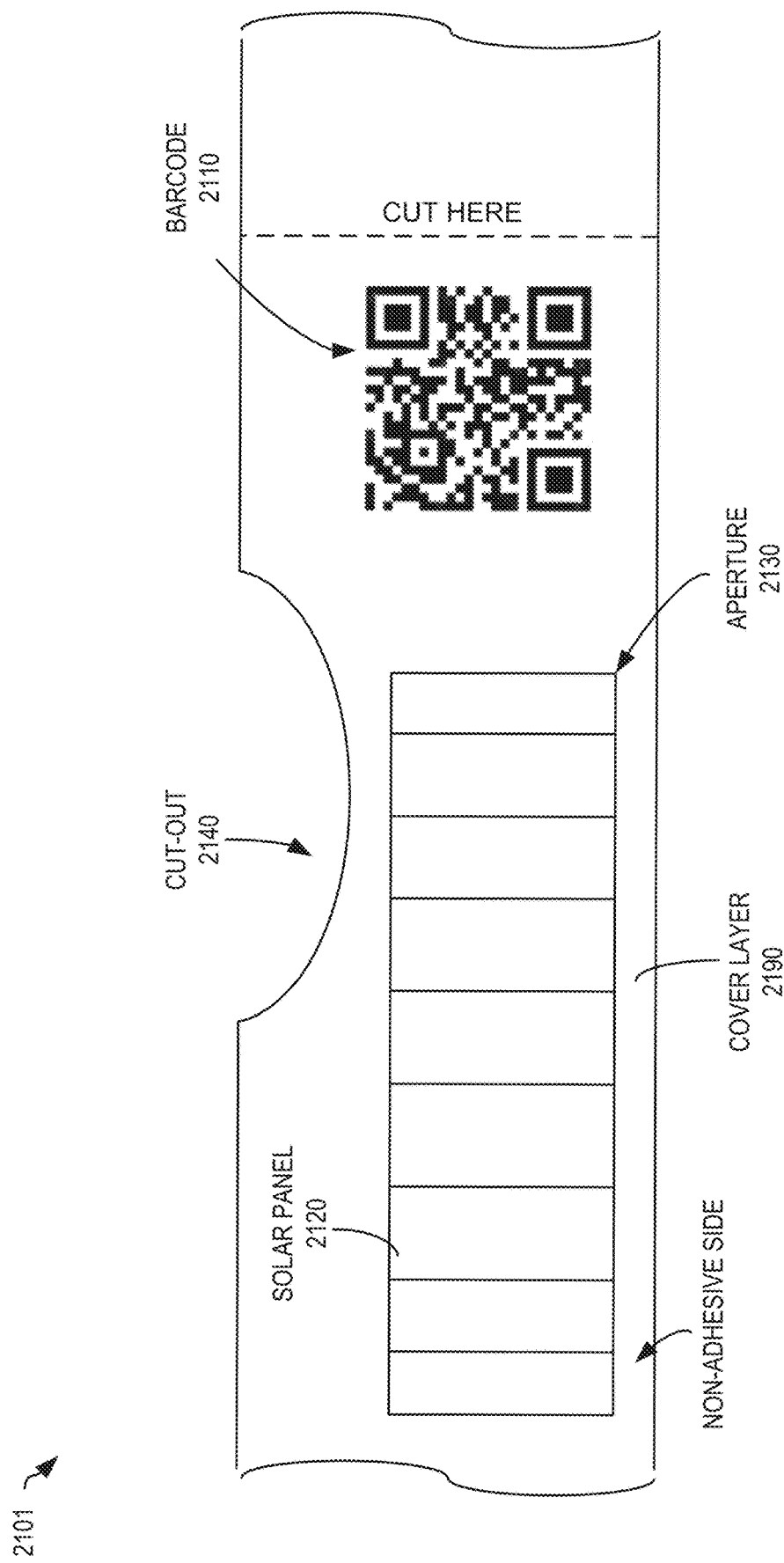
FIG. 21 shows one example tape node including a solar panel, exposed on a non-adhesive side of the tape node, and with a cut-out, in embodiments.
Figure 22:
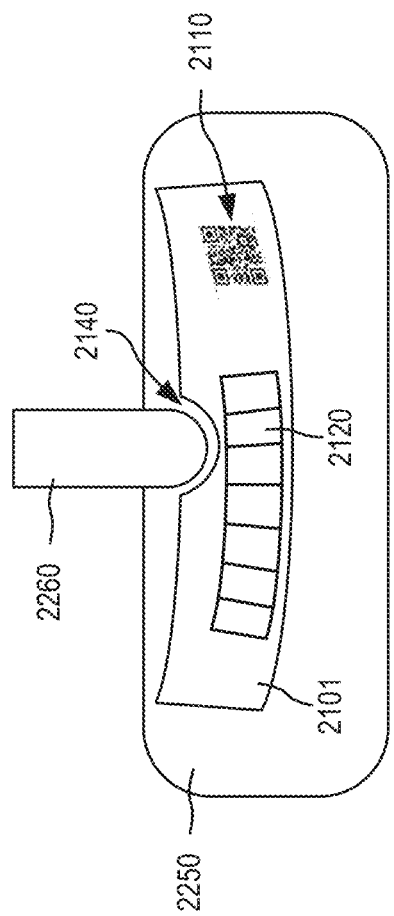
FIG. 22 shows one example of the tape node of FIG. 21 adhered to a rear-view mirror of a vehicle, in embodiments.

FIG. 21 shows one example tape node 2101 including a solar panel 2120, exposed on a non-adhesive side of the tape node 2101, and with a cut-out 2140, according to some embodiments. The tape node 2101 is similar to the tape node 1401 of FIGS. 14A, 14B, and 15, except that the tape node 2101 further includes the cut-out 2140 that allows the tape node 2101 to easily adhere to a forward-facing surface of a rear-view mirror of a vehicle. FIG. 22 shows an example of the tape node 2101 of FIG. 21 adhered to a rear-view mirror 2250 of a vehicle, according to some embodiments. The cut-out 2140 provides space to accommodate a support post 2260 of the rear-view mirror 2250 when the tape node 2101 is adhered to the rear-view mirror 2250. Advantageously, when adhered to the mirror 2250, the solar panel 2120 may receive light through a windshield or window of the vehicle and generate power for operating the tape node 2101 and/or charging a battery of the tape node 2101.

Distributed Intelligent Software for Solar-Powered Tape Nodes

In conventional systems, computations and analysis of data collected by IOT devices in the field is typically performed at a server or at edge computers that are remotely located from the IOT devices. Such an approach requires these field located IOT devices to communicate large amounts of data to server and/or the edge nodes to allow the server and/or the edge nodes to generate insights and/or make decisions based on the collected data.

The present embodiments provide an alternative approach whereby the IOT devices in the field are each their own master, and each include distributed intelligent software (also referred to as liquid operating system (OS)) and follow an assigned mission. Advantageously, the distributed intelligent software allows the IOT devices to operate as masters and follow their assigned missions in the field, which may include analyzing collected data, making intelligent decisions, supporting other tape nodes, solving problems and handling events without any need to contact edge nodes or servers of the tracking system.

The network communication environment 800 of FIG. 8 may include one or more solar-powered tape nodes (e.g., one or more of tape nodes 1401, 1701, 2101). The network communication environment 800 includes a distributed software that controls operation of the one or more solar-powered tape nodes. Parts of the distributed software may be executed by one or more solar-powered tape nodes, one or more other tape nodes, one or more gateway nodes, one or more client devices, one or more servers, the cloud, other members of the network communication environment 800, or some combination thereof. The parts of the distributed software may include specific functions or applications that control aspects of the solar-powered tape nodes including the operation of the solar-powered tape node.

Figure 23:
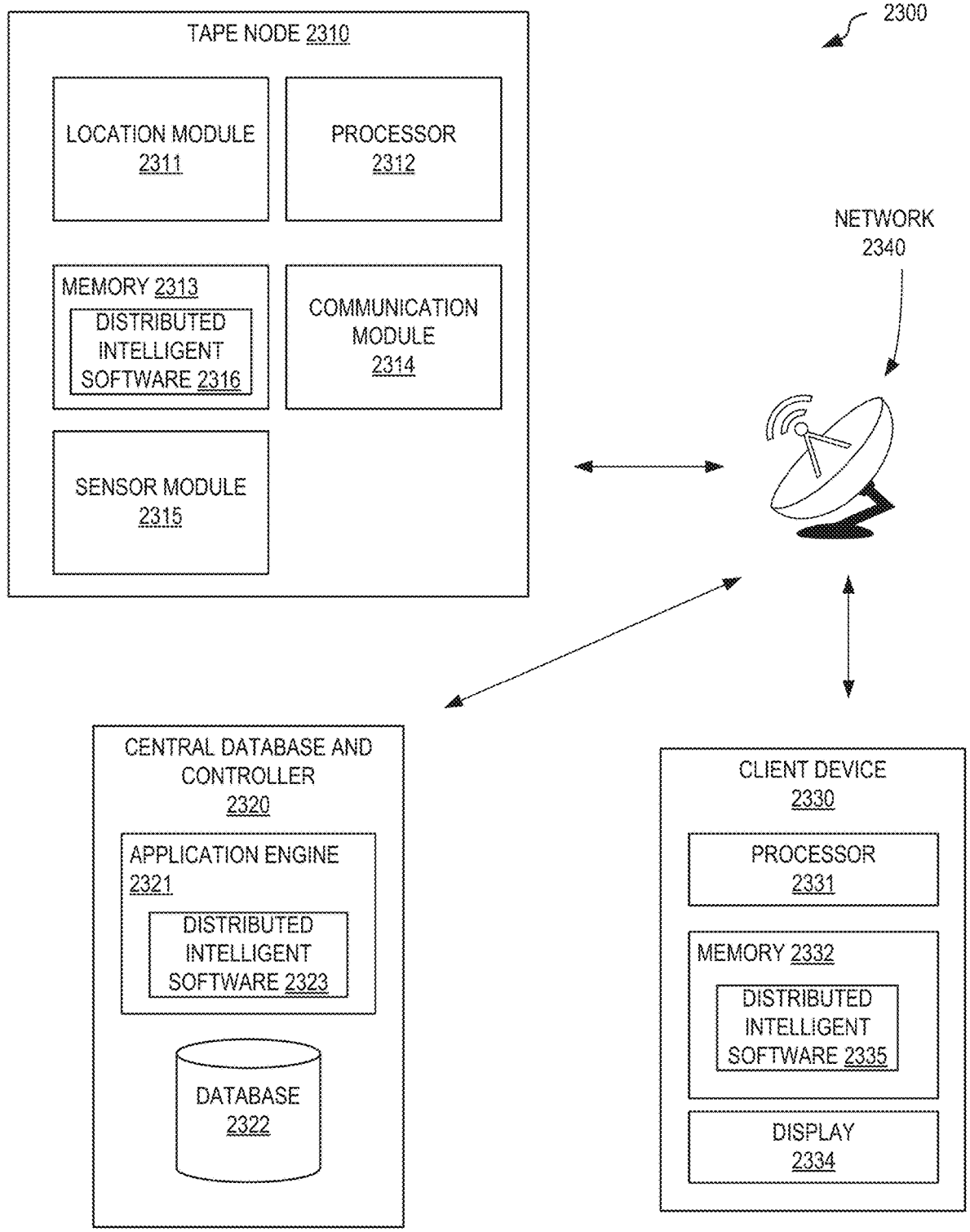
FIG. 23 is a diagram showing one example tracking system implemented by an adhesive tape platform, in embodiments.

FIG. 23 is a diagram showing one example tracking system 2300 (also referred to herein as an IOT system) implemented by an adhesive tape platform described above (e.g., adhesive tape-agent platform 112 of FIG. 1, adhesive tape platform 330 of FIG. 3, and so on) and as described with reference to the network communications environment 800 of FIG. 8. The tracking system 2300 includes one or more tape nodes 2310, a central database and controller 2320, one or more client devices 2330, and a network 2340.

Embodiments of the tape node 2310 are also described above with respect to FIGS. 1-9. Each tape node 2310 may include a location module 2311, a processor 2312, memory 2313, a communication module 2314, and a sensor module 2315, according to some embodiments. The location module 2311 collects data relevant to the location of the corresponding section of the tape node 2310. The location data collected by the location module may be stored in the memory 2313. The memory 2313 may also store distributed intelligent software 2316 (also known as liquid operating system (OS)), described in detail below. The location data may also have computations performed on it by the processor 2312 and may be transmitted by the communication module 2314 to the central database and controller 2320 and/or one or more of the client devices 2330 via the network 2340. The client devices 2330 are used by an authorized user of the tracking system 2300 and may represent one or more of a delivery employee, a customer, a final recipient, an administrator of the tracking system 2300, and so on. The location data may include geographic locations ascertained from systems including GPS, cellular network systems (e.g., GSM), wireless local area networks (e.g., a system of Wi-Fi access points), a dead-reckoning system, some other location system, or some combination thereof.

The tracking system 2300 may also include tracking devices and components deployed in the field other than devices with the flexible adhesive tape form factor. For example, an embodiment of the tape node 2310 may include a non-flexible tracking device that may be used to track assets, interact with other tape nodes 2310, communicate with the central database and controller 2320 and client devices 2330, perform other functions, or some combination thereof. Examples of the tape node 2310 may also include gateway devices (e.g., mobile gateway devices, such as mobile gateway 910, 912, and/or stationary gateway devices, such as stationary gateway device 914) or other communication devices that perform functions in conjunction with the adhesive tape platform and the tracking system 2300. In some embodiments, multiple tape nodes 2310 may have multiple different functionalities, such as performing different types of communication (e.g., long-range, such as high-power wireless communication interface 682″, medium-range, such as medium-power wireless-communication interface 672′, 672″, short range, such as low-power wireless communication interface 652, 652′, 652″ of FIGS. 6A-6C) and may be deployed and operate together in the tracking system 2300.

The location module 2311 may include the one or more antennas and one or more wireless communication interface circuits (e.g., communication interface 652, 672′, and 682″ of FIGS. 6A-6C), according to some embodiments. The location module 2311 may further include, for example, a GPS system that includes a GPS receiver circuit (e.g., a receiver integrated circuit) and a GPS antenna. In some embodiments, the location module 2311 also includes one or more wireless communication systems each of which includes a respective transceiver circuit (e.g., a transceiver integrated circuit) and a respective antenna. Example wireless communication systems include a cellular communication system (e.g., GSM/GPRS), a Wi-Fi communication system, an RF communication system (e.g., LoRa), a Bluetooth communication system (e.g., a Bluetooth Low Energy system), a Z-wave communication system, and a ZigBee communication system.

The processor 2312 may be a microcontroller or microprocessor, according to some embodiments. The processor 2312 may be an embodiment of the processor 420 of FIG. 4 and processors 650, 650′, and 650″ of FIGS. 6A, 6B, and 6C, respectively. In some embodiments, each section of the adhesive tape platform includes more than one processor 2312. The memory 2313 stores tracking data and other data necessary for the functioning of the tape node 2310. The memory 2313 may be incorporated into one or more of the processors 2312 or may be a separate component. The memory 2313 may be an embodiment of the memory 426 of FIG. 4, and/or of the memory 658, 658′, and 658″ of FIGS. 6A, 6B, and 6C, respectively.

The communication module 2314 enables communication between the tape node 2310 and the central database and controller 2320 via the network 2340. The communication module 2314 may include embodiments of the wireless communication modules 412, 414 of FIG. 4 and/or one or more of the low-power wireless-communication interface 652 of FIG. 6A, the medium-power wireless-communication interface 672′ of FIG. 6B, and the high-power wireless-communication interface 682″ of FIG. 6C. The communication module 2314 also enables communication between the tape node 2310 and one or more of the client devices 2330. In some embodiments, the communication module 2314 enables a segment of the tape node 2310 to communicate with another segment of the tape node 2310. The communication module includes one or more wireless communication systems each of which includes a respective transceiver circuit (e.g., a transceiver integrated circuit) and a respective antenna. Example wireless communication systems include a cellular communication system (e.g., GSM/GPRS), a Wi-Fi communication system, an RF communication system (e.g., LoRa), a Bluetooth communication system (e.g., a Bluetooth Low Energy system), a Z-wave communication system, and a ZigBee communication system. The one or more wireless communication systems in the communication module 2314 may be shared with the location module 2311.

The sensor module 2315 includes one or more sensors and/or sensor devices. The one or more sensors may include the examples of sensing transducers 656, 656′, and/or 656″ described above with respect to FIG. 6. The sensor module 2315 collects sensor data which may be stored in the memory 2313, have computations performed on it by the processor 2312, and be transmitted to one or more of the central database and controller 2320 and the one or more client devices 2330, or some combination thereof. The sensor data may include acceleration data, velocity data, vibration data, capacitive sensing data, humidity data, audio recording data, optical sensor data, infrared sensor data, temperature data, other sensor data, or some combination thereof. The sensor data may include examples of data collected by sensors not described herein.

The distributed intelligent software 2316 may define how one or more devices of the tracking system 2300 process and operate in response to tracking data collected by the tape node 2310. The tracking data is a generic term for the data transmitted from the tape node to other nodes of the tracking system 2300 and includes the location data collected by the location module 2311, the sensor data collected by the sensor module 2315, data received by the communication module 2314 from the central database and controller 2320 and/or the one or more client devices 2330, or some combination thereof. Based on the tracking data, the distributed intelligent software controls how the tape node 2310 alters state. Altering the state of the tape node 2310 alters the actions, functions, and behavior of the location module 2311, processor 2312, communication module 2314, and the sensor module 2315 of the tape node 2310. In some embodiments, altering the state of the tape node 2310 alters other aspects of the adhesive tape platform not described herein. The processor 2312 of the tape node 2310 executes computations and functions based on instructions (e.g., software instructions) of the distributed intelligent software 2316 to alter the state of the tape node 2310. Instructions to alter the state of the tape node 2310 may be in the form of executable programmatic code, according to some embodiments.

In some embodiments, logic and instructions relevant to the distributed intelligent software 2316 are stored in the memory 2313 of the tape node 2310. In this case, the tape node 2310 may execute functions and/or programs relevant to the distributed intelligent software 2316 without directly communicating with the central database and controller 2320. As described with reference to FIG. 24, the tape node 2310 has a defined mission and is its own master. The tape node 2310 may also execute the functions and/or programs without communicating with other tape nodes 2310 or client devices 2330. The processor 2312 may execute the instructions to alter the state of the tape node 2310 based on the tracking data. In other embodiments, the communication module 2314 receives the instructions from one or both of the central database and controller 2320 and the client devices 2330. In other embodiments, the logic is distributed between the tape node 2310, other tape nodes in wireless communication to the tape node 2310, the central database and controller 2320, and the client devices 2330.

The central database and controller 2320 is a system for storing data (including tracking data), running applications, transmitting data to the tape node 2310 and the one or more client devices 2330, and communicating with the tape node 2310 and the one or more client devices 2330. According to some embodiments, the central database and controller 2320 is hosted on one or more servers. The central database and controller 2320 includes an application engine 2321 and a database 2322, according to some embodiments. The application engine 2321 may also store distributed intelligent software 2323, described in detail below. The central database and controller 2320 may include additional or different components than are shown in FIG. 23.

The application engine 2321 executes applications associated with the tracking system 2300. For example, the application engine 2321 may receive communications and data from the tape node 2310 and update the database 2322 based on the data received from the tape node 2310. In another example, the application engine 2321 may provide data from the database 2322 to one or more of the client devices 2330 and communicate instructions to display the data on a display 2334 of the client device.

In some embodiments, the application engine 2321 performs tasks according to the distributed intelligent software 2323. For example, the application engine 2321 detects that an event has occurred based on tracking data received from the tape node 2310, and in response to the detected event, the application engine 2321 generates instructions for the distributed intelligent software 2323 to alter the state of the tape node 2310 and transmits the instructions to the tape node 2310. In some embodiments, the application engine 2321 also generates instructions for the central database and controller 2320 and executes the instructions, in response to the detected event. The application engine 2321 may also generate instructions for the client device 2330, in response to the detected event, according to some embodiments.

The database 2322 stores data and logs of events relevant to the tape node 2310. The database 2322 stores tracking data that it receives from the tape node 2310 via the network 2340. The tracking data may include location data (e.g., GPS coordinates, geographic coordinates, etc.), sensor data, or other data relevant to tracking an item with the tape node 2310. The database 2322 may also store data received from one or more client devices 2330. For example, a client device 2330 may scan a barcode on the tape node 2310 or on an asset being tracked by the tape node 2310. The client device 2330 then transmits a notification regarding the scanning of the barcode to the central database and controller 2320 which the application engine 2321 logs on the database 2322, creating a comprehensive log of data relevant to the tracking of the asset.

The application engine 2321 may perform calculations and processing on the tracking data stored on the database 2322. In some embodiments, the application engine 2321 uses a trained machine learning model to perform computations relevant to the tape node 2310. A trained machine learning model may be used to detect events in the stored tracking data and determine rules that are part of the distributed intelligent software 2323, according to some embodiments. For example, the application engine 2321 may input tracking data from the tape node 2310 to a trained machine learning model which outputs instructions for altering the state of the tape node 2310 in response. The use of a machine learning model to generate instructions according to the distributed intelligent software is described in further detail below, with respect to the tape node 1401 of FIGS. 14A, 14B, and 15 and to the tape node 1701 of FIGS. 17A, 17B, 18A, and 18B.

The one or more client devices 2330 includes computing devices used by users, human operators, and/or administrators of the tracking system 2300. Examples of the client devices 2330 include personal computers, smartphones, barcode scanning devices, and other computational devices. A client device 2330 may be a dedicated computing device for interacting with the tape node 2310 and the central database and controller 2320. Each client device 2330 includes a processor 2331, memory 2332, and optionally the display 2334, according to some embodiments. A client device 2330 may also include a camera, a sensor, a barcode scanning apparatus, other components, or some combination thereof. Each client device may execute one or more applications for interacting with the tape node 2310 and the central database and controller 2320. For example, a client device may run an application that receives tracking data collected by the adhesive tape platform and provided from the central database and controller 2320, store the tracking data in the memory 2332, and display the tracking data on the display 2334. The memory 2332 may also store distributed intelligent software 2335, described in detail below.

In some examples, a human operator uses a client device 2330 to interact directly with the adhesive tape platform. The human operator may be equipped with a mobile phone or other device that allows the operator to authenticate and initialize the tape node 2310. In addition, the operator can take a picture of an asset including the tape node 2310 and any barcodes associated with the asset and, thereby, create a persistent record (e.g., stored in memory 2332 or database 2322) that links the tape node 2310 to the asset. In addition, the human operator typically sends the picture to a network service and/or transmit the picture to the tape node 2310 for storage in the memory 2313 and/or to the central database and controller 2320 for storage in the database 2322. The display 2334 may display tracking data, notifications, instructions, a user interface, or some combination thereof.

In some embodiments, the client device 2330 performs tasks based on the distributed intelligent software 2335. An application running on the processor 2331 detects that an event has occurred based on tracking data received from the tape node 2310 or from the central database and controller 2320. Alternatively, the processor 2331 may receive an indication from the tape node 2310 or the central database and controller 2320 indicating that such event has occurred, without requiring the processor 2331 to process the tracking data and expressly detect an event therein. In response to the detected event, the processor 2331 generates instructions to alter the state of the tape node 2310 using the distributed intelligent software (part of which may be stored on the memory 2332) and transmits the instructions to the tape node 2310. In some embodiments, the processor 2331 also generates instructions for the central database and controller 2320 and the client device 2330 transmits the instructions to the central database and controller 2320, in response to the detected event. The processor 2331 may also generate instructions for the client device 2330 and execute them, in response to the detected event, according to some embodiments.

The tape node 2310, the central database and controller 2320, and the client devices 2330 are configured to communicate via the network 2340, which may comprise any combination of local area networks, wide area networks, public network (e.g., the internet), private networks (e.g., intranets and extranets), using wired and/or wireless communication system. In one embodiment, the network 2340 uses standard communications technologies and/or protocols. For example, the network 2340 includes communication links using technologies such as Ethernet, 802.11, worldwide interoperability for microwave access (WiMAX), 3G, 4G, code division multiple access (CDMA), digital subscriber line (DSL), geolocation satellite systems (e.g., GPS, GLONASS, and NAVSTAR), cellular communication systems (e.g., GSM/GPRS), Wi-Fi communication systems, RF communication systems (e.g., LoRa), Bluetooth communication systems (e.g., a Bluetooth Low Energy system), Z-wave communication systems, ZigBee communication systems, etc. Examples of networking protocols used for communicating via the network 2340 include multiprotocol label switching (MPLS), transmission control protocol/Internet protocol (TCP/IP), hypertext transport protocol (HTTP), simple mail transfer protocol (SMTP), and file transfer protocol (FTP). Data exchanged over the network 2340 may be represented using any suitable format, such as hypertext markup language (HTML) or extensible markup language (XML). In some embodiments, all or some of the communication links of the network 2340 may be encrypted using any suitable technique or techniques.

The distributed intelligent software includes logic for managing each of the tape nodes 2310, the central database and controller 2320, and the client devices 2330. In some embodiments, computation related to the distributed intelligent software is distributed among the tape nodes 2310, the central database and controller 2320, and the client devices 2330. For example, logic relevant to the behavior of the tape nodes 2310 may be stored locally on the memory 2313 of each of the tape nodes 2310. The processor 2312 of the tape node 2310 may then access the stored logic and execute the logic based on tracking data that the location module 2311, the transducers/energy harvesting module 2315, and the communication module 2314 has collected, altering the state of the tape node 2310 without receiving any instructions from the central database and controller 2320 and/or a client device 2330.

In other embodiments, the logic relevant to the behavior of the tape nodes 2310 may be stored and executed on the central database and controller 2320. For example, the application engine 2321 may execute the logic in response to receiving tracking data from one of the tape nodes 2310 and transmit instructions to the tape node 2310 to alter its state. In further embodiments, the processor 2312 of the tape nodes 2310 does not execute any of the distributed intelligent software logic and only alters the state of the tape node 2310 in response to instructions received from the central database and controller 2320 or the client devices 2330.

In some embodiments, the logic relevant to the behavior of the tape nodes 2310 may be stored on the memory 2332 of the client device 2330 and executed by the processor 2331. For example, the processor 2331 may execute the logic in response to receiving tracking data from one of the tape nodes 2310, resulting in the client device 2330 transmitting at least one instruction to the tape node 2310 to alter its state. The distributed intelligent software 2316, 2323, and 2335 provides collective collaborative intelligence that is distributed throughout the tracking system 2300 and each component of distributed intelligent software 2316, 2323, and 2335 may also operate independently. Thus, in the following description where the term distributed intelligent software 2316, 2323, and 2335 is used, the described functionality may also be independently implemented by any one of distributed intelligent software 2316, 2323, and 2335.

Figure 24:
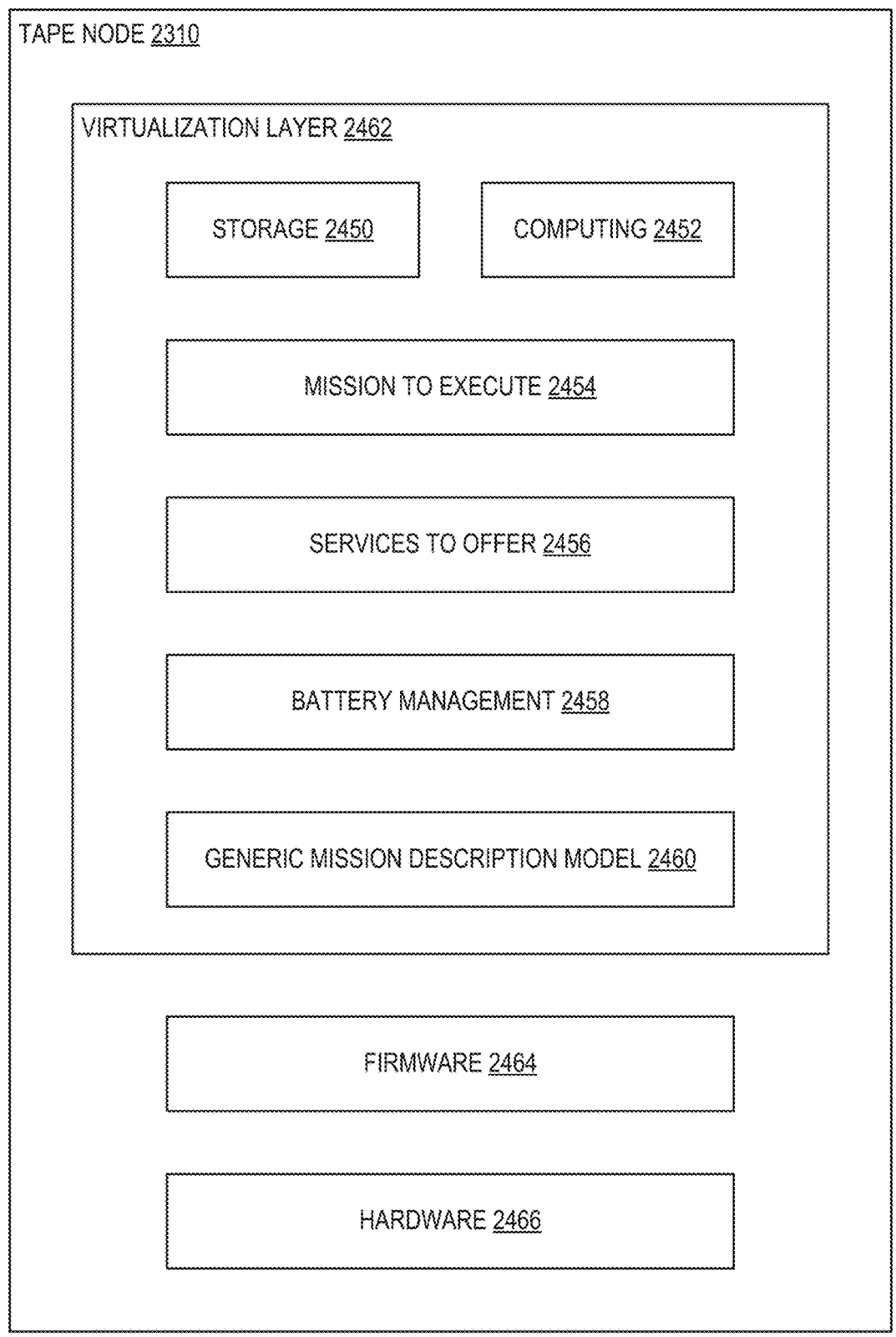
FIG. 24 is a schematic showing an alternative view of the functionality of the tape node of FIG. 23, in embodiments.

FIG. 24 is a schematic showing an alternative view of the functionality of the tape node 2310 of FIG. 23. The tape node 2310 includes storage functionality 2450 (e.g., non-volatile memory) and computing functionality 2452. The tape node 2310 includes a mission to execute 2454, which defines the roles and goals of that tape node 2310. Other tape nodes may have different missions to execute 2454, and have different resources (e.g., hardware, capabilities, and battery resources, for example). The tape node 2310 also has services to offer 2456, which defines services and functions that the tape node 2310 may offer to other nodes of the tracking system 2300. The tape node 2310 may also include battery management 2458 that manages use of battery power by the tape node 2310. For example, the battery management 2458 allows the tape node 2310 to maximize its life by adjusting functionality and use of resources to conserve battery power when necessary such that the tape node 2310 completes its mission to execute 2454. The tape node 2310 also includes a generic description model 2460 that defines operation of the tape node 2310 to meet its mission to execute 2454. These functions are implemented by a virtualization layer 2462 that abstracts the functions from the specific hardware 2466 of the tape node. For example, the virtualization layer 2462 may implement a virtual machine that is common to all nodes of the tracking system 2300, thereby allowing the function to be implemented by any of the nodes. The tape node 2310 may also include firmware that is specific to the hardware 2466 and that implements the virtualization layer 2462.

In conventional computing architectures (see FIG. 19), intelligence only occurs within a server or within edge nodes, and the end nodes typically collect and send sensor data to the server or edge nodes for processing and decision making. However, in the tracking system 2300, each tape node 2310 includes distributed intelligent software (e.g., liquid OS) that causes the tape node 2310 to operate as a master, following its mission to execute 2454, and delegating tasks and actions as needed.

In one example of operation, tape node 2310 is attached to an asset (e.g., a package) being shipped to a customer location. The tape node 2310 includes a manifest defining its intended journey, and its mission to execute 2454 is to monitor handling of the asset and to ensure it reaches its destination on schedule. In this example, as the asset is being moved through a warehouse, it inadvertently falls from a conveyer belt when moving towards a transport vehicle. The tape node 2310, following its mission to execute 2454, detects the fall of the asset and that it has stopped moving. The tape node 2310 may then determine that, because it is not moving and that it is not on the transport vehicle, it has a problem. Accordingly, the tape node 2310 communicates with a nearby client device 2330 (e.g., of a supervisor) at the warehouse to indicate the problem. The supervisor may then use the client device 2330 to locate the errant asset and ensure that it gets loaded onto the transport vehicle. In this scenario, the central database and controller 2320 was not involved in detecting or resolving the problem but may receive status reports indicating the events. Specifically, the mission to execute 2454 causes the tape node 2310, acting as the master, to resolve its uses locally, thereby getting faster results and saving battery power (through using a low-power wireless-communication interface 652 of FIG. 6A).

In the following description, the term distributed intelligent software refers to the collective functionality of distributed intelligent software 2316, 2323, and 2335, whereby any one or more of distributed intelligent software 2316, 2323, and 2335 may provide instructions for the solar-powered tape nodes. In some embodiments, the distributed intelligent software instructs one or more members of the network communication environment 800, based on a power-state of at least one of the one or more solar-powered tape nodes. The power-state may include events and/or conditions related to the power generation by a solar panel of the solar-powered tape node, related to an energy level of a battery of the solar-powered tape node, related to a current power consumption of the solar-powered tape node, an estimated charge time of a battery of the solar-powered tape node, some other power-related state, or some combination thereof.

Figure 25:
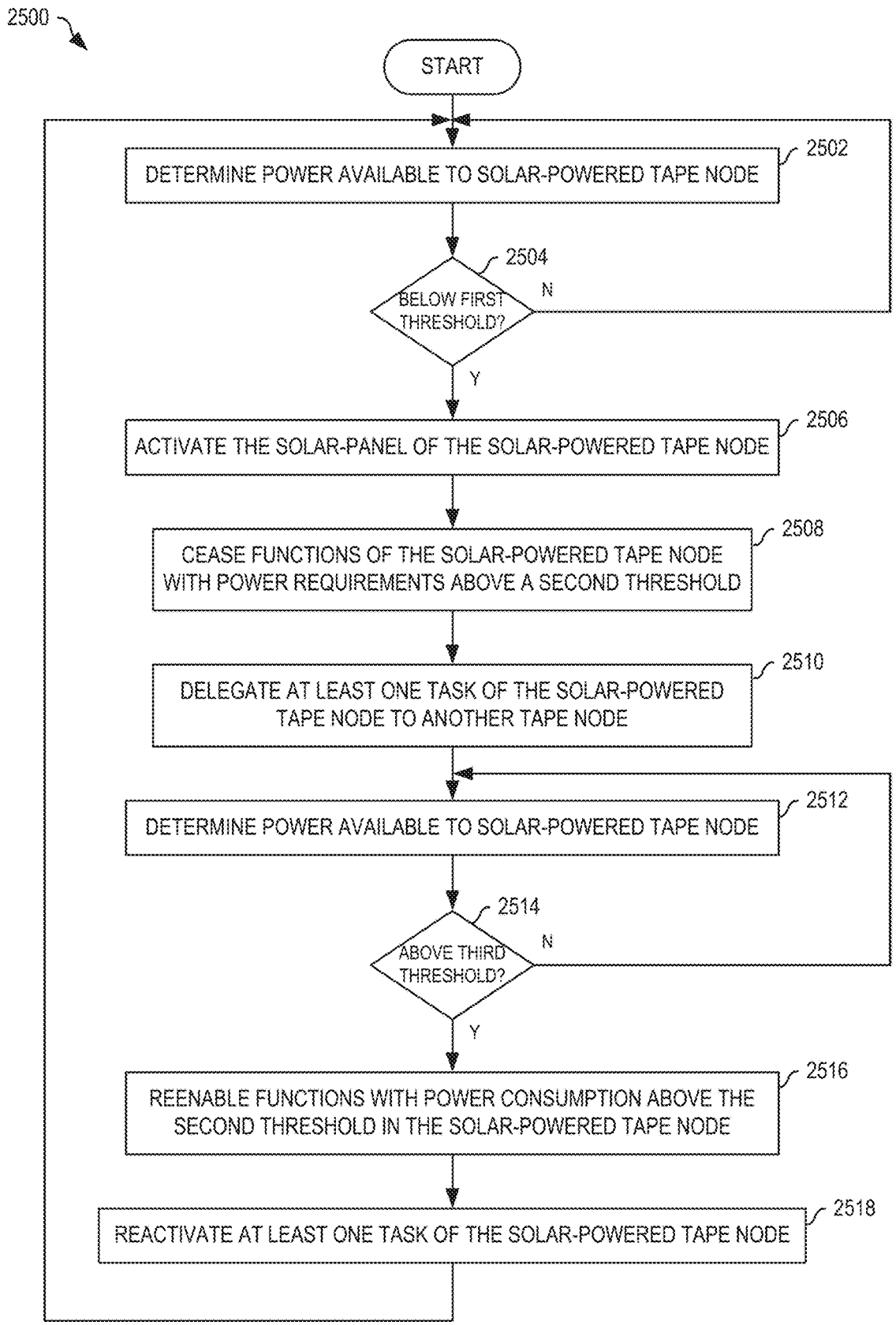
FIG. 25 is a flowchart illustrating one example distributed intelligent software method, in embodiments.

FIG. 25 is a flowchart illustrating one example distributed intelligent software method 2500. Method 2500 is implemented within distributed intelligent software 2316, 2323, and 2335 of the IOT system (e.g., the network communication environment 800 of FIG. 8 and/or the tracking system 2300). In block 2502, method 2500 determines power available to a solar-powered tape node. In one example of block 2502, the distributed intelligent software 2316, 2323, and 2335 determines a battery energy level of the solar-powered tape node 1401. In another example of block 2502, the distributed intelligent software 2316, 2323, and 2335 determines a value of solar power generated by the solar panel 1420 of the solar-powered tape node 1401. Block 2504 is a decision. If, in block 2504, method 2500 determines that the power available to the solar-powered tape node is below a first threshold value (e.g., 30% of full capacity, or a value determined dynamically based on the task assigned to the tape node), method 2500 continues with block 2506; otherwise, method 2500 continues with block 2502. In one example of block 2504, the distributed intelligent software 2316, 2323, and 2335 determines that the battery level of the tape node 1401 is below the first threshold. In another example of block 2504, the distributed intelligent software 2316, 2323, and 2335 determines that the value of solar power generated by the solar panel of the solar-powered tape node 1401 is below the first threshold. In another example of block 2504, the distributed intelligent software 2316, 2323, and 2335 determines that the combined power indicated by the battery level and the solar power generated by the solar panel is below the first threshold.

Block 2506 is implemented in embodiments where the solar panel of the solar-powered tape node, or a control circuit thereof, is not always activated to capture solar energy. In block 2506, method 2500 activates the solar panel of the solar-powered tape node. In one example of block 2506, the distributed intelligent software, instructs tape node 1401 to activate solar panel 1420 to capture solar energy. In block 2508, method 2500 ceases functions of the solar-powered tape node with power requirements greater than a second threshold. In one example of block 2508, where a maximum output of the solar panel 1420 is 180 mW, the distributed intelligent software 2316, 2323, and 2335 instructs the tape node 1401 to cease one or more long range wireless communication functions that have a cumulative power consumption greater than 100 mW, thereby reducing the power used within the tape node such that the solar panel recharges the battery of the tape node. In certain embodiments, the distributed intelligent software 2316, 2323, and 2335 may prioritize certain vital functions. For example, a low-powered heartbeat signal reporting that the tape node is functioning correctly, may be a prioritized function that is not disabled. Similarly, where the task assigned to the tape node is vibration monitoring, collecting and storing of vibration data may be prioritized and wireless communication may be deprioritized. Accordingly, the tape node stores sensed data locally (e.g., in its internal memory) until its battery is recharged to a level sufficient to resume wireless transmissions. This example assumes that updating the server with the vibration data is not a priority and there is a tolerance for having limited reporting during select time periods. Detected events, such as departure from normal behavior that raise alarms, may change the priority of certain functions and tasks. For example, where the tape node detects vibration data indicative of an imminent (or actual) breakdown of equipment, the distributed intelligent software 2316, 2323, and 2335 may reprioritize wireless communication to allow the event to be reported. Accordingly, battery recharging may be deprioritized, allowing the tape node to at least temporarily use remaining battery power to meet operational needs instead of recharging.

In block 2510, method 2500 delegates at least one task of the solar-powered tape node to another tape node. In one example of block 2510, the distributed intelligent software reassigns a long-range wireless communication task, initially assigned to the solar-powered tape node 1401, to another tape node (e.g., a secondary/tertiary tape node 824, stationary gateway 814, or mobile gateway 812) of the network communication environment 800. For example, the long-range wireless communication task may require a certain amount of power (e.g., based on transmission range and the amount of data) and thus when the battery energy level of the tape node 1401 is below the first threshold, the tape node 1401 may not have sufficient power to complete the task and therefore the long-range wireless communication task is delegated to another tape node, such as one having more power available. In another example of block 2510, where the tape node 1401 needs to perform an amount of cellular communications with the network communication environment 800 during an assigned task, the first threshold value may be associated with the power consumption required for the cellular communications.

In block 2512, method 2500 determines power available to a solar-powered tape node. In one example of block 2512, the distributed intelligent software 2316, 2323, and 2335 determines that a battery energy level of the solar-powered tape node 1401. In another example of block 2512, the distributed intelligent software 2316, 2323, and 2335 determines a value of solar power generated by the solar panel of the solar-powered tape node 1401. Block 2514 is a decision. If, in block 2514, method 2500 determines that the power available to the solar-powered tape node is above a third threshold value, method 2500 continues with block 2516; otherwise, method 2500 continues with block 2512. In one example of block 2514, the distributed intelligent software 2316, 2323, and 2335 determines that the battery level of the tape node 1401 is above 75% of full capacity. In another example of block 2514, the distributed intelligent software 2316, 2323, and 2335 determines that the value of solar power generated by the solar panel of the solar-powered tape node 1401 is above 100 mW. In another example of block 2514, the distributed intelligent software 2316, 2323, and 2335 determines that the combined power indicated by the battery level and the value of solar power generated by the solar panel is above 75% of full battery capacity and 100 mW of solar power.

In block 2516, method 2500 enables functions with power consumption above the second threshold in the solar-powered tape node. In one example of block 2516, the distributed intelligent software 2316, 2323, and 2335 instructs the tape node 1401 to reenable at least one of the functions ceased in block 2508. In block 2518, method 2500 reactivates at least one task of the solar-powered tape node. In one example of block 2518, the distributed intelligent software 2316, 2323, and 2335 instructs the tape node 1401 to performs one or more tasks delegated to other nodes in block 2510. In another example of block 2518, the distributed intelligent software 2316, 2323, and 2335 instructs the tape node 1401 to perform one or more additional tasks. Method 2500 then continues with block 2502.

Advantageously, through method 2500, the distributed intelligent software 2316, 2323, and 2335 automatically adjust the workload of the solar-powered tape node (e.g., one or more of the tape nodes 1401, 1701, 2101) based on power available to the tape node. By ceasing and or postponing certain tasks on the tape node, the battery of the tape node may be recharged by power generated by the solar panel.

In some embodiments, Accordingly, the distributed intelligent software 2316, 2323, and 2335 may use the machine learning model to predict power availability for at least one solar-powered tape node for a subsequent period and generate instructions to control operation of the solar-powered tape node during the subsequent period.

Figure 26:
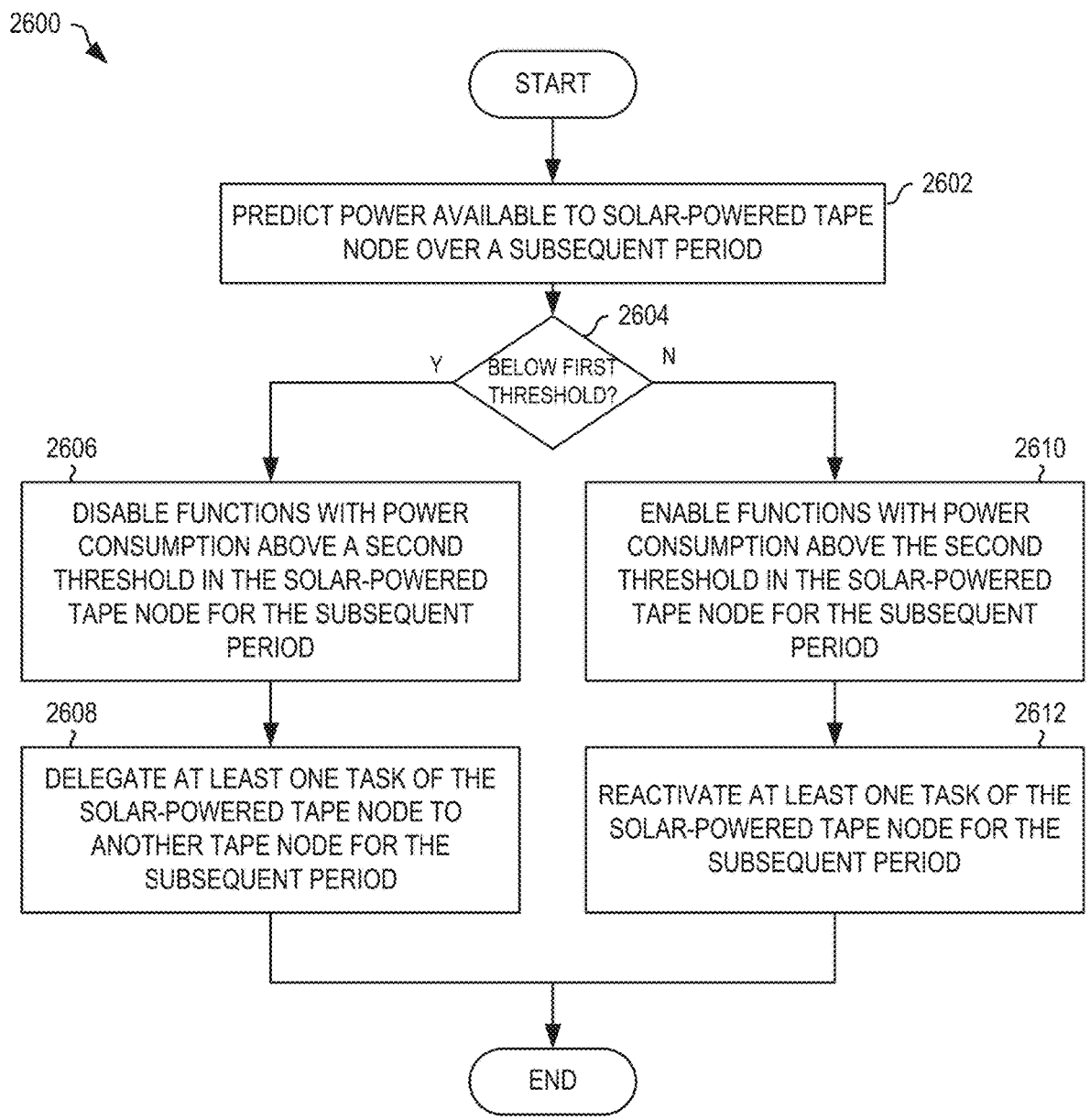
FIG. 26 is a flowchart illustrating one example distributed intelligent software method for instructing a solar-powered tape node, in embodiments.

FIG. 26 is a flowchart illustrating one example distributed intelligent software method 2600 for instructing a solar-powered tape node. Method 2600 is implemented by the distributed intelligent software 2316, 2323, and 2335 of the IOT system (e.g., the network communication environment 800 of FIG. 8 and/or the tracking system 2300). In block 2602, method 2600 predicts power available to a solar-powered tape node over a subsequent period. In one example of block 2602, the distributed intelligent software 2316, 2323, and 2335 uses historic power data collected by one or more solar-powered tape nodes over time a trained machine learning model, and then uses the trained machine learning model to predict power availability to solar-powered tape node 1401 during a subsequent period, such as one of a morning, an afternoon, an evening, a two-hour window, and so on. In another example, the machine learning model is trained based on a route followed by the solar-powered tape nodes. For example, where the solar-powered tape node 1401, 1701, and/or 2101 are positioned on or in a vehicle that follows a particular route each day, the machine learning model is trained to know when the solar-powered tape node 1401, 1701, and/or 2101 is expected to face the sun and thereby receive solar energy. For example, for a given route at a certain time of day, the machine learning model may predict an amount of solar energy that tape node expects to receive as the vehicle follows that route. Additional artificial intelligence may also use other inputs (e.g., a weather forecast for the route) to predict an amount of solar energy the tape node receives.

Block 2604 is a decision. If, in block 2604, method 2600 determines that the predicted power available to the solar-powered tape node is below a first threshold value, method 2600 continues with block 2606; otherwise, method 2600 continues with block 2610.

In block 2606, method 2600 disables functions with power consumption above a second threshold in the solar-powered tape node for the subsequent period. In one example of block 2606, the distributed intelligent software 2316, 2323, and 2335 instructs the tape node 1401 to disable long-range communication functions, where these functions have expected power consumption above the second threshold. In block 2608, method 2600 delegates at least one task of the solar-powered tape node to another tape node for the subsequent period. In one example of block 2608, the distributed intelligent software 2316, 2323, and 2335 instructs the tape node 1401 to delegate the long-range communication functions to one of the mobile gateways 810, 812 and the stationary gateway 814 of the network communications environment 800 of FIG. 8. Method 2600 then terminates until invoked again at the end of the subsequent period.

In block 2610, method 2600 enables functions with power consumption above the second threshold in the solar-powered tape node for the subsequent period. In one example of block 2610, the distributed intelligent software 2316, 2323, and 2335 instructs the tape node 1401 to enable long-range communication functions that were disables in block 2606 since the predicted power available to the solar-powered tape node 1401 is sufficient to power those functions. In block 2612, method 2600 reactivates the at least one task of the solar-powered tape node for the subsequent period. In one example of block 2612, the distributed intelligent software 2316, 2323, and 2335 instructs the tape node 1401 to activate the long-range communication functions delegated to one of the mobile gateways 810, 812 and the stationary gateway 814 in block 2608. Method 2600 then terminates until invoked again at the end of the subsequent period.

In certain embodiments, the methods 2500 and 2600 may operate together. In certain embodiments, the solar-powered tape node 1401, 1701, 2101 implements different power level modes, each mode having corresponding actions and/or tasks that may be performed based upon the power available to the tape node. For example, the tape node 1401, 1701, 2101 may have a hibernation mode which is invoked when solar power generation and the battery power level is below a first threshold value (e.g., 5% of a maximum solar power and battery energy capacity). When the power available to the tape node 1401, 1701, 2101 is above the first threshold value but below a second threshold value, communication and transmissions occur only in response to events, such as detection of a relevant package and other communication tasks are delegated to other tape nodes. When the power available to the tape node 1401, 1701, 2101 is above the second threshold, the tape node may have full operability and perform long-distance communication and other tasks with higher power requirements, including tasks delegated by other tape nodes.

In certain embodiments, each of the solar-powered tape nodes 1401, 1701, 2101 tracks solar power generated by its corresponding solar panel 1420, 1220, 2120, such as by using components for measuring electric current and/or voltage generated by the solar panel. The tape node 1401, 1701, 2101 may thereby detect and record energy harvested throughout the lifetime of the tape node. Based on this historical data, the tape node 1401, 1701, 2101 learns optimal times for performing energy intensive functions. For example, the tape node 1401, 1701, 2101 may performs energy intensive functions (e.g., cellular or satellite communications) only during a portion of a journey where large amount of solar energy are expected to be harvested. As described above, a trained machine learning model may be used to generate predictions for solar power harvesting.

Physical Design Considerations

In some embodiments, the tape node 1401, 1701, 2101 is manufactured using a full molding process. In some embodiments, the tape node 1401 is manufactured using a lamination process. In the lamination or layering manufacturing process (e.g., for a white tape that may not include medium or long-range communication capability), layers are stacked and thru tape vias provide electrical connections between layers. With this manufacturing approach, there is no limit to the number of layers and the resulting tape node may be thinner that tape nodes made using other the full molding process. Accordingly, the layered tape node may be thinner and less flexible than a molded tape node.

The solar-powered tape node may include printable electronic components, according to certain embodiments. For example, at least part of one or more of tape nodes 1401, 1701, and 2101 may be fabricated using an electronic component printing process. Advantageously, the use of printed electronic components makes the tape node more flexible.

Figure 27:
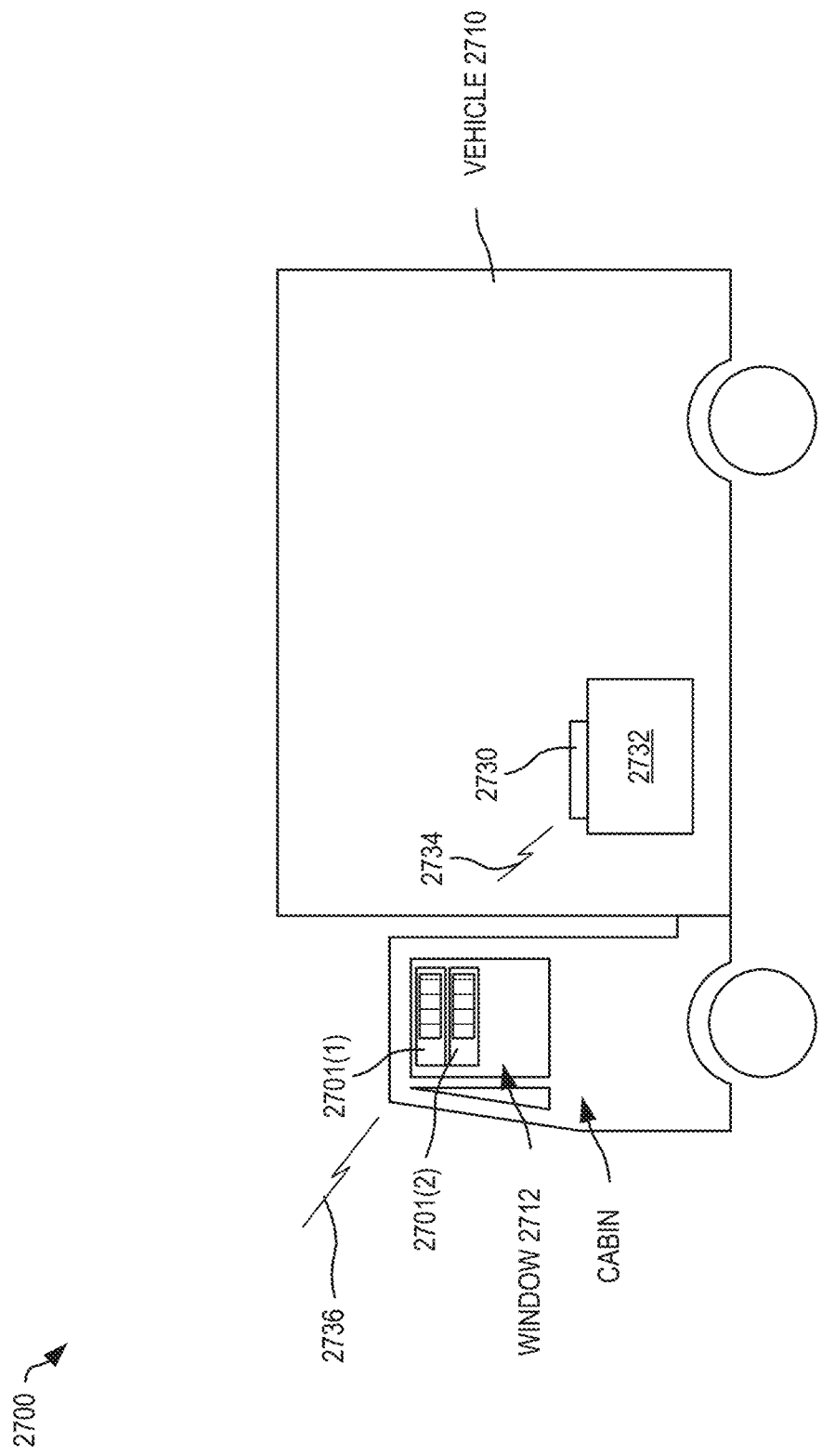
FIG. 27 is a schematic illustrating one example scenario where two solar-powered tape nodes are mounted near to one another to share a task, in embodiments.

FIG. 27 is a schematic illustrating one example scenario 2700 where two solar-powered tape nodes 2701(1) and 2701(2) are mounted near to one another and share a task. In the example of FIG. 27, two solar-powered tape nodes are adhered to a window 2712 of a vehicle 2710. For example, solar-powered tape nodes 2701 may represent tape nodes 1701 of FIGS. 17A, 17B, 18A and 18B. However, the following scenario may also apply to solar-powered tape nodes 1401 of FIGS. 14A, 14B, and 15 attached to a roof of a vehicle or building, without departing from the scope hereof.

In scenario 2700, the tape nodes 2701(1) and 2701(2) have similar functionality, including short-range communication capability and one or both of long-range and medium-range communication capability. For example, each may function as a gateway device within the network communication environment 800 of FIG. 8. However, in scenario 2700, tape nodes 2701(1) and 2701(2) function as a cooperative pair to provide continuous gateway functionality. For example, in a first period solar-powered tape node 2701(1) provides long and/or medium range communication functionality for a third tape node 2730 attached to an asset 2732 being transported by vehicle 2710. During this period, tape node 2701(2) is in a standby mode and may be recharging it battery using power captured by its solar panel.

As, during operation, the battery power level of tape node 1701(1) reduces below a threshold level (e.g., 10% of total battery capacity), distributed intelligent software 2316, 2323, and 2335 instructs tape node 2701(1) to delegate long and medium range communication tasks to tape node 2701 (2). Accordingly, tape node 2701(2) transitions to an active mode and assumes long range communication tasks (e.g., long range wireless communications 2736) for tape node 2730 and network communication environment 800, and tape node 2701(1) transitions to a standby mode, in which tape node 2701(1) may recharge its battery using power from its solar panel, when available. Advantageously, communication between tape node 1730 and network communication environment 800 is not interrupted due to low battery levels of tape node 2701(1). For example, tape node 2730 may use only short-range wireless communication 2734 (e.g., Bluetooth) with tape nodes 2701(1) and 2701(2).

Similarly, when the battery power level of tape node 2701(2) drops below a threshold level (e.g., 10% of total battery capacity), distributed intelligent software 2316, 2323, and 2335 instructs tape node 2701(2) to delegate long and medium range communication tasks to tape node 2701 (1). Accordingly, tape node 2701(1) transitions back to the active mode and assumes long range communication tasks for tape node 2730 and network communication environment 800, and tape node 2701(2) transitions back to the standby mode and recharges its battery using power from its solar panel, when available.

Although shown positioned within the same window 2712, tape nodes 2701(1) and 2701(2) may be positioned in different windows without departing from the scope hereof. In another example, tape node 2701(2) is similar to tape node 1401 of FIGS. 14A and 14B, and tape node 2701(1) is similar to tape node 1701 of FIGS. 17A and 17B, whereby tape node 2701(2) is positioned on the roof of vehicle 2710. That is, tape nodes 2701 need not be positioned immediately adjacent one another and may have different orientations provided that they remain within wireless communication range of each other and with tape node 2730.

Advantageously, by providing two, or more, tape nodes with similar functionality in the same place to share the same responsibility, redundancy and reliability is improved since the probability of failure due to a low or depleted battery is reduced.

Figure 28A:
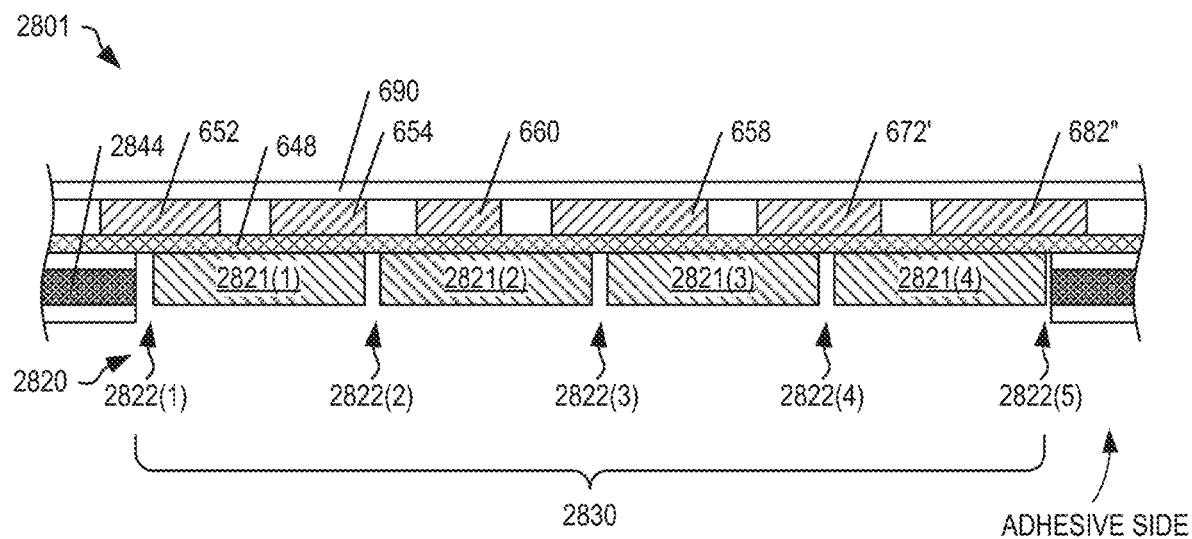
FIGS. 28A and 28B show cross-section through part of one example solar-powered tape node with a solar panel formed of four substantially rigid segments, in un-flexed and flexed states, in embodiments.

FIG. 28A is a cross-section through part of one example solar-powered tape node 2801 with a solar panel 2820 that is formed of four substantially rigid segments 2821(1)-(4), in embodiments. That is, the solar panel 2820 is formed with a substantially rigid substrate, as known in the art. The solar-powered tape node 2801 is similar to the solar-powered tape node 1701 of FIG. 17 and has the solar panel 2820 positioned within an aperture 2830 of a substrate 2844 and facing outward from the adhesive side. The solar-powered tape node 2801 includes the flexible circuit 648 coupled with the low-power communication interface 652, the medium-power communication interface 672', the high-power communication interface 682", the timer circuit 654, the processor 650, and the memory 658 that are covered by the flexible cover 690. The solar-powered tape node 2801 may include more or fewer components with different positioning and/or ordering without departing from the scope hereof. For example, one or both of the medium-power communication interface 672' and the high-power communication interface 682" may be omitted and/or repositioned. In this embodiment, each of the solar panel segments 2821(1)-(4) is coupled with the flex circuit 648 and positioned to form gaps 2822(2)-(4) between adjacent segments 2821(1)-(4) and may include gaps 2822(1) and 2822(5) between end segments 2822(1) and 2822(5) and substrate 2844.

Figure 28B:
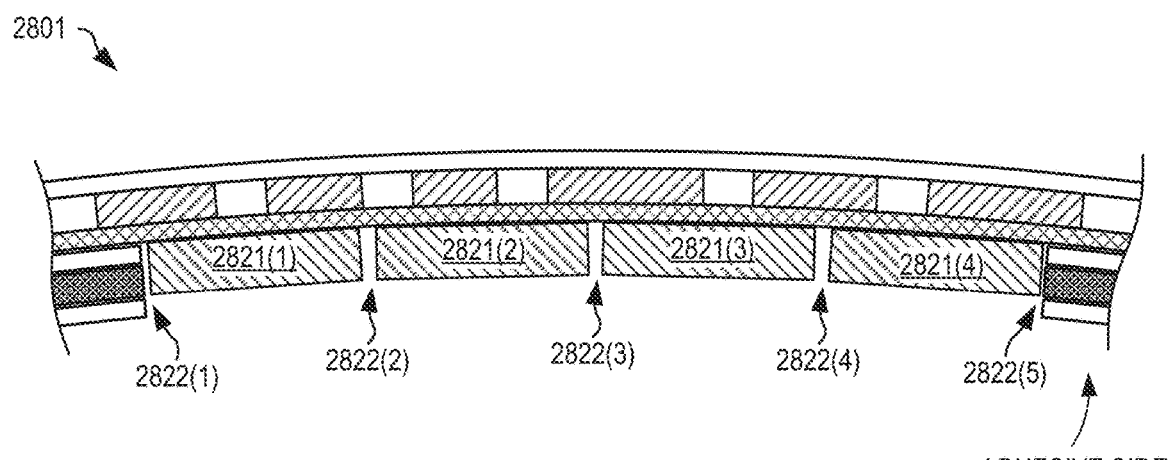

FIG. 28A shows the solar-powered tape node 2801 in an unflexed state. FIG. 28B shows the solar-powered tape node 2801 of FIG. 28A in a flexed state. FIGS. 28A and 28B are best viewed together with the following description. As shown in FIG. 28B, although segments 2821 are substantially rigid, gaps 2822 permit the solar-powered tape node 2801 to flex without inter-segment contact and associated stress. Advantageously, where the segments 2821 and gaps 2822 are laterally (e.g., in a width direction) oriented, flexibility is increased longitudinally (e.g., in a lengthwise direction). Although shown flexed in a only a first direction, solar-powered tape node 2801 may also flex in the opposite direction and may thereby affix to both convex and concave surfaces.

U.S. Patent Application Ser. No. 63/130,331 teaches a method for stacking components of a tape node for flexibility. The teachings of U.S. Patent Application Ser. No. 63/130,331 may be applied to the solar-powered tape nodes 1401, 1701, 2101, and 2801 described herein.

Figure 29:
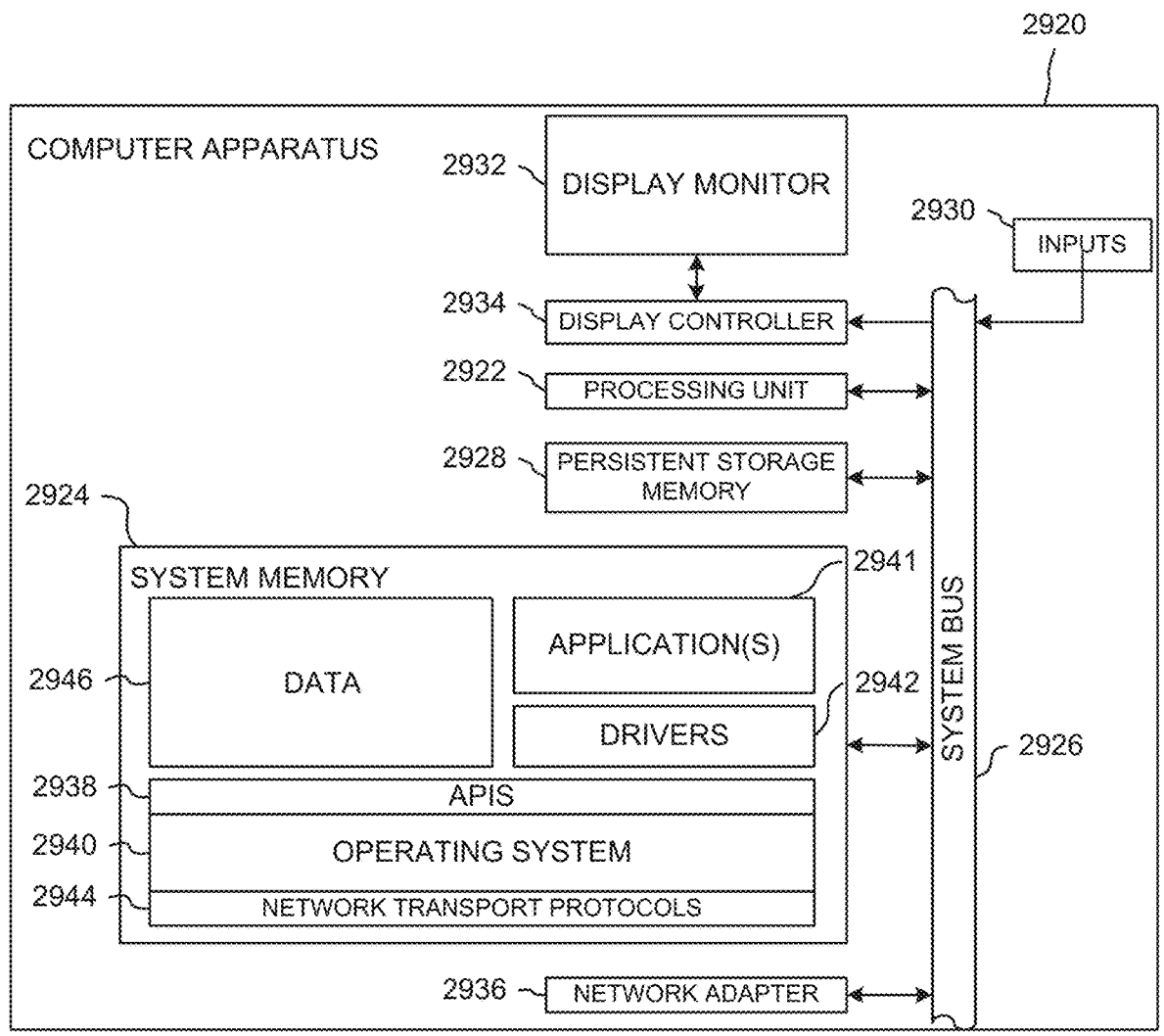
FIG. 29 shows an example embodiment of computer apparatus that, either alone or in combination with one or more other computing apparatus, is operable to implement one or more of the computer systems described in this specification.

FIG. 29 shows an example embodiment of computer apparatus 2920 that, either alone or in combination with one or more other computing apparatus, is operable to implement one or more of the computer systems described in this specification. The computer apparatus 2920 includes a processing unit 2922, a system memory 2924, and a system bus 2926 that couples the processing unit 2922 to the various components of the computer apparatus 2920. The processing unit 2922 may include one or more data processors, each of which may be in the form of any one of various commercially available computer processors. The system memory 2924 includes one or more computer-readable media that typically are associated with a software application addressing space that defines the addresses that are available to software applications. The system memory 2924 may include a read only memory (ROM) that stores a basic input/output system (BIOS) that contains start-up routines for the computer apparatus 2920, and a random-access memory (RAM). The system bus 2926 may be a memory bus, a peripheral bus, or a local bus, and may be compatible with any of a variety of bus protocols, including PCI, VESA, Microchannel, ISA, and EISA. The computer apparatus 2920 also includes a persistent storage memory 2928 (e.g., a hard drive, a floppy drive, a CD ROM drive, magnetic tape drives, flash memory devices, and digital video disks) that is connected to the system bus 2926 and contains one or more computer-readable media disks that provide non-volatile or persistent storage for data, data structures and computer-executable instructions.

A user may interact (e.g., input commands or data) with the computer apparatus 2920 using one or more input devices 2930 (e.g. one or more keyboards, computer mice, microphones, cameras, joysticks, physical motion sensors, and touch pads). Information may be presented through a graphical user interface (GUI) that is presented to the user on a display monitor 2932, which is controlled by a display controller 2934. The computer apparatus 2920 also may include other input/output hardware (e.g., peripheral output devices, such as speakers and a printer). The computer apparatus 2920 connects to other network nodes through a network adapter 2936 (also referred to as a "network interface card" or NIC).

A number of program modules may be stored in the system memory 2924, including application programming interfaces 2938 (APIs), an operating system (OS) 2940 (e.g., the Windows® operating system available from Microsoft Corporation of Redmond, Washington U.S.A.), software applications 2941 including one or more software applications programming the computer apparatus 2920 to perform one or more of the steps, tasks, operations, or processes of the positioning and/or tracking systems described herein, drivers 2942 (e.g., a GUI driver), network transport protocols 2944, and data 2946 (e.g., input data, output data, program data, a registry, and configuration settings).

Additional Configuration Information

The foregoing description of the embodiments of the disclosure have been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

Combination of Features

The following embodiments are specifically contemplated, as well as any combinations of such embodiments that are compatible with one another:

(A) A solar-powered tape node includes a flexible circuit, a device layer positioned adjacent to the flexible circuit and having a plurality of electronic components, each component coupled to a first side of the flexible circuit, a flexible cover positioned over the device layer and forming a non-adhesive side of the wireless tape node, a flexible substrate coupled with a second side of the flexible circuit, opposite the first side, by a first adhesive layer and forming a first aperture, and a solar panel positioned within the first aperture and coupling with the second side of the flexible circuit, the solar panel having a light-receiving surface facing away from the flexible circuit and being operable to generate electrical power when light is incident on the light-receiving surface.

(B) In the solar-powered tape node denoted as (A), the flexible substrate having a thickness equal to or greater than a thickness of the solar panel.

(C) Either of the solar-powered tape nodes denoted as (A) or (B), further including a second adhesive layer formed on the flexible substrate and operable to adhere the solar-powered tape node to a transparent object, whereby the light-receiving surface of the solar panel is positioned to receive light through the transparent object.

(D) In any of the solar-powered tape nodes denoted as (A)-(C), the second adhesive layer forming a second aperture aligned with the first aperture.

(E) In any of the solar-powered tape nodes denoted as (A)-(D), the second adhesive layer covering the light-receiving surface of the solar panel, wherein the second adhesive layer is optically transparent.

(F) In any of the solar-powered tape nodes denoted as (A)-(E), the second adhesive layer including a window film formed of a Polyethylene Teraphthalate (PET)) material that affixes to a glass surface without the use of an adhesive.

(G) In any of the solar-powered tape nodes denoted as (A)-(F), the second adhesive layer including a static cling window film formed of a polyvinyl chloride (PVC) material that affixes to a glass surface without the use of an adhesive.

(H) In any of the solar-powered tape nodes denoted as (A)-(G), the solar panel being positioned to receive sunlight when the transparent object is a window or windshield of a vehicle and the solar-powered tape node is adhered to an interior surface of the window or windshield.

(I) A solar-powered tape node, including a flexible circuit, a device layer positioned adjacent to the flexible circuit and having a plurality of electronic components, each component coupled to a first side of the flexible circuit, a flexible cover positioned over the device layer and forming an aperture, a flexible substrate attached to a second side of the flexible circuit, opposite the first side, by a first adhesive layer, and a solar panel positioned within the aperture and coupled with the first side of the flexible circuit, the solar panel having a light-receiving surface facing away from the flexible circuit and being operable to generate electrical power when light is incident on the light-receiving surface.

(J) The solar-powered tape node denoted as (I), further including a second adhesive layer formed on an opposite side of the flexible substrate to the flexible circuit to form an adhesive side of the solar-powered tape node to allow to solar-powered tape node to adhere to an abject.

(K) In either of the solar-powered tape nodes denoted as (I) or (J), the solar-powered tape node being adhered to an exterior surface of a vehicle.

(L) In any of the solar-powered tape nodes denoted as (I)-(K), the flexible circuit, the device layer, the flexible cover, and the flexible substrate forming a cutout in the solar-powered tape node that allows the solar-powered tape node to attach to the front side of a rear view mirror, the cutout being shaped and sized to receive a mounting stem of the rear view mirror.

(M) A method for controlling operation of a solar-powered tape node within a network communications environment, includes determining power available to the solar-powered tape node is below a first threshold, and delegating at least one task of the solar-powered tape node to another node of the network communications environment.

(N) In the method denoted as (M), the step of determining further including determining a power level of a battery of the solar-powered tape node, determining an output power level of a solar panel of the solar-powered tape node, and adding the power level of the battery and the output power of the solar panel to form the power available to the solar-powered tape node.

(O) Either of the methods denoted as (M) or (N), further include ceasing at least one function of the solar-powered tape node that has a power requirement above a second threshold.

(P) Any of the methods denoted as (M)-(O), further including determining power available to the solar-powered tape node is above a third threshold, greater than the first threshold, and reenabling the at least one function of the solar-powered tape node.

(Q) Any of the methods denoted as (M)-(P), further including determining power available to the solar-powered tape node is above a third threshold, greater than the first threshold, and reactivating the at least one task of the solar-powered tape node.

(R) Any of the methods denoted as (M)-(Q), further including predicting, by a distributed intelligent software of the network communications environment, power available to the solar-powered tape node over a subsequent period, and delegating at least one task of the solar-powered tape node to a second node of the network communications environment for the subsequent period when the predicted power is below a second threshold.

(S) Any of the methods denoted as (M)-(R), further including ceasing at least one function of the solar-powered tape node that has a power requirement above a third threshold when the predicted power is below the second threshold.

(T) Any of the methods denoted as (M)-(S), further including activating the at least one task of the solar-powered tape node when the predicted power is above a third threshold.

(U) In any of the methods denoted as (M)-(T), the second node being installed proximate the solar-powered tape node.

(V) A solar-powered wireless communication device, including a flexible circuit, a device layer positioned adjacent to the flexible circuit and having a plurality of electronic components coupled to the flexible circuit, a flexible cover positioned over the device layer, a flexible substrate coupled with a second side of the flexible circuit, opposite the first side, by a first adhesive layer, and a solar panel positioned at a surface of the solar-powered wireless communication device and coupling with the flexible circuit, the solar panel having a light-receiving surface facing away from the flexible circuit and being operable to generate electrical power when light is incident on the light-receiving surface.

(W) The solar-powered wireless communication device denoted as (V), further including a second adhesive layer operable to adhere the solar-powered wireless communication device to an object to position the light-receiving surface of the solar panel to receive light.

(X) In either of the solar-powered wireless communication devices denoted as (V) or (W), the second adhesive layer include a window film formed of a Polyethylene Teraphthalate (PET)) material that adheres to a glass surface without the use of an adhesive.

(Y) In any of the solar-powered wireless communication devices denoted as (V)-(X), the second adhesive layer including a static cling window film formed of a polyvinyl chloride (PVC) material that affixes to a glass surface without the use of an adhesive.

(Z) In any of the solar-powered wireless communication devices denoted as (V)-(Y), the solar panel being positioned to receive sunlight when the transparent object is a window or windshield of a vehicle, and the solar-powered wireless communication device being adhered to an interior surface of the window or windshield.

(AA) In any of the solar-powered wireless communication devices denoted as (V)-(Z), the solar-powered wireless communication device having a thin flexible form factor.

(AB) In any of the solar-powered wireless communication devices denoted as (V)-(AA), the solar-powered wireless communication device having a thin substantially rigid form factor.

(AC) In any of the solar-powered wireless communication devices denoted as (V)-(AB), the light-receiving surface of the solar panel being on the opposite side to the second adhesive layer.

(AD) In any of the solar-powered wireless communication devices denoted as (V)-(AC), the light-receiving surface of the solar panel being on the same side as the second adhesive layer.

What is claimed is:

1. A solar-powered tape node, comprising:
a flexible circuit;
a device layer positioned adjacent to the flexible circuit and between a flexible substrate and a flexible cover, the device layer having a plurality of electronic components, each component coupled the flexible circuit, the plurality of electronic components comprising:
a processor,
a memory, and
at least one wireless communication system;
the flexible cover positioned over the device layer and forming a non-adhesive side of the solar-powered tape node;
the flexible substrate having a first aperture in the flexible substrate;
a first adhesive layer on the flexible substrate on an exterior of the solar-powered tape node, the adhesive layer configured to adhere the solar-powered tape node to a surface of an object; and
a solar panel positioned within the first aperture and coupling with the flexible circuit, the solar panel having a light-receiving surface facing away from the flexible circuit and being operable to generate electrical power when light is incident on the light-receiving surface, wherein
the solar-powered tape node is configured to perform wireless communications with a plurality of wireless nodes of a wireless Internet-of-Things (TOT) system using the at least one wireless communication system.

2. The solar-powered tape node of claim 1, the flexible substrate having a thickness equal to or greater than a thickness of the solar panel.

3. The solar-powered tape node of claim 1, wherein the first adhesive layer is configured to adhere the solar-powered tape node to a transparent object, whereby the light-receiving surface of the solar panel is positioned to receive light through the transparent object.

4. The solar-powered tape node of claim 3, the first adhesive layer forming a second aperture aligned with the first aperture.

5. The solar-powered tape node of claim 3, the first adhesive layer covering the light-receiving surface of the solar panel, wherein the first adhesive layer is optically transparent.

6. The solar-powered tape node of claim 1, further comprising a static cling film on the flexible substrate formed of a polyvinyl chloride (PVC) material that affixes to a glass surface without the use of an adhesive.

7. The solar-powered tape node of claim 3, the solar panel being positioned to receive sunlight when the transparent object is a window or windshield of a vehicle and the solar-powered tape node is adhered to an interior surface of the window or windshield.

8. A solar-powered tape node, comprising:
a flexible circuit;
a device layer positioned adjacent to the flexible circuit and between a flexible substrate and a flexible cover layer, the device layer having a plurality of electronic components, each component coupled to the flexible circuit, the plurality of electronic components comprising
a processor,
a memory, and
at least one wireless communication system;
the flexible cover positioned over the device layer and forming a non-adhesive side of the solar-powered tape node, with an aperture in the flexible cover layer;
a first adhesive layer on the flexible substrate on an exterior of the solar-powered tape node, the adhesive layer configured to adhere the solar-powered tape node to a surface of an object; and
a solar panel positioned within the aperture and coupled with the flexible circuit, the solar panel having a light-receiving surface facing away from the flexible circuit and being operable to generate electrical power when light is incident on the light-receiving surface, wherein
the solar-powered tape node is configured to perform wireless communications with a plurality of wireless nodes of a wireless Internet-of-Things (TOT) system using the at least one wireless communication system.

9. The solar-powered tape node of claim 8, wherein the solar-powered tape node is adhered to an exterior surface of a vehicle.

10. The solar-powered tape node of claim 8, the flexible circuit, the device layer, the flexible cover, and the flexible substrate forming a cutout in the solar-powered tape node that allows the solar-powered tape node to attach to the front side of a rear view mirror, the cutout being shaped and sized to receive a mounting stem of the rear view mirror.

11. The solar-powered tape node of claim 1, further comprising a battery between the flexible cover and the flexible substrate electrically coupled to one or more of the components of the device layer.

12. The solar-powered tape node of claim 11, the battery electrically coupled to the solar panel, wherein the battery is a rechargeable battery configured to be recharged by the solar panel.

13. The solar-powered tape node of claim 11, wherein the solar-powered tape node is configured to switch between an active and a standby mode, the standby mode configuring the solar-powered tape node to reduce power consumption of the solar-powered tape node.

14. The solar-powered tape node of claim 13, wherein switching between the active mode and the standby mode is based at least in part on a remaining battery level of the battery.

15. The solar-powered tape node of claim 11, wherein the solar-powered tape node is configured to delegate a task to the solar-powered tape node to another wireless node of the TOT system by communicating the task to the other wireless node using the wireless communication system, in response to the battery having a stored energy level below a threshold level.

16. The solar-powered tape node of claim 11, wherein a combination of electrical power from the solar panel and from the battery is used to electrically power one or more of the components of the device layer.

17. The solar-powered tape node of claim 11, wherein the solar-powered tape node is configured to perform a task based on a combination of a solar power generation rate of the solar panel and a remaining stored energy level in the battery.

18. The solar-powered tape node of claim 8, further comprising a battery between the flexible cover and the flexible substrate electrically coupled to one or more of the components of the device layer.

19. The solar-powered tape node of claim 18, the battery electrically coupled to the solar panel, wherein the battery is a rechargeable battery configured to be recharged by the solar panel.

20. The solar-powered tape node of claim 18, wherein the solar-powered tape node is configured to perform a task based on a combination of a solar power generation rate of the solar panel and a remaining stored energy level in the battery.

* * * * *